United States Patent
Livesay et al.

(10) Patent No.: US 8,704,262 B2
(45) Date of Patent: Apr. 22, 2014

(54) SOLID STATE LIGHT SOURCES WITH COMMON LUMINESCENT AND HEAT DISSIPATING SURFACES

(71) Applicant: Goldeneye, Inc., San Diego, CA (US)

(72) Inventors: William R. Livesay, San Diego, CA (US); Scott M. Zimmerman, Basking Ridge, NJ (US); Richard L. Ross, Del Mar, CA (US); Eduardo DeAnda, San Diego, CA (US)

(73) Assignee: Goldeneye, Inc., San Diego, CA (US)

( * ) Notice: Subject to any disclaimer, the term of this patent is extended or adjusted under 35 U.S.C. 154(b) by 0 days.

(21) Appl. No.: 14/042,569

(22) Filed: Sep. 30, 2013

(65) Prior Publication Data

US 2014/0042467 A1  Feb. 13, 2014

Related U.S. Application Data

(63) Continuation-in-part of application No. 13/572,608, filed on Aug. 10, 2012, now Pat. No. 8,575,641.

(60) Provisional application No. 61/574,925, filed on Aug. 11, 2011, provisional application No. 61/957,768, filed on Jul. 10, 2013.

(51) Int. Cl.
  *H01L 33/64* (2010.01)

(52) U.S. Cl.
  USPC .................................. 257/98; 257/E33.075

(58) Field of Classification Search
  USPC .................. 257/89, 90, 98, E33.061, E33.075
  See application file for complete search history.

(56) References Cited

U.S. PATENT DOCUMENTS

| | | | |
|---|---|---|---|
| 7,361,938 B2 | 4/2008 | Mueller et al. | |
| 7,422,801 B2 | 9/2008 | Yamashita | |
| 7,855,449 B2 | 12/2010 | De Graff et al. | |
| 8,188,665 B2 * | 5/2012 | Rittner et al. ......... | 257/E33.075 |
| 8,481,977 B2 | 7/2013 | Beeson et al. | |
| 2009/0217970 A1 | 9/2009 | Zimmerman et al. | |

* cited by examiner

*Primary Examiner* — Chandra Chaudhari
(74) *Attorney, Agent, or Firm* — William Propp, Esq.

(57) ABSTRACT

A solid state light source with LEDs in thermal contact to thermally conductive translucent elements where light emitted from the LEDs is directed to emerge from the heat dissipating surfaces of the elements. The thermally conductive translucent elements are arranged or combined with a reflector to form a light recycling cavity. The outside surfaces of the thermally conductive translucent elements forming the cavity become luminescent as the light emitted by the LEDs on the inside of the cavity is continually reflected and recycled until a very high percentage of the light emitted by the LEDs is eventually transmitted through and emitted uniformly and omnidirectionally. Simultaneously, the heat from the LEDs conducts through and to the luminescent outside surfaces of the elements of the cavity, which radiatively and convectively cool the light source thereby eliminating the need for bulky appended heat sinks.

20 Claims, 29 Drawing Sheets

SOLID STATE LIGHT SOURCES WITH COMMON LUMINESCENT AND HEAT DISSIPATING SURFACES

CROSS-REFERENCE TO RELATED APPLICATIONS

This application is a continuation in part of U.S. application Ser. No. 13/572,608 filed on Aug. 10, 2012, which claims benefit of U.S. Provisional Application Ser. No. 61/574,925, filed on Aug. 11, 2011, which is herein incorporated by reference. This application also claims the benefit of U.S. Provisional Patent Application No. 61/957,768, filed Jul. 10, 2013, which is also herein incorporated by reference.

BACKGROUND OF THE INVENTION

Solid State light sources based on light emitting diode (LED) technology offer the promise of energy savings over incandescent and fluorescent lighting without the toxic materials utilized in fluorescent or organic light emitting diode (OLED) light sources.

However to achieve widespread adoption and acceptance of solid state lighting (based on inorganic LEDs) requires that it be competitively priced to compete with incandescent and mercury filled fluorescent light sources. Even with its greener attributes and favorable impact on the environment the average consumer will still make purchase decisions based on the initial cost of the light source. It matters not that a solid state light source will last longer than an incandescent or fluorescent light source and that it offers the promise of being more economical when factoring in the energy saved over its useful life. Most consumers are not willing to pay more (initially) for eventual savings later. However, reducing the cost of solid state light sources has been a big challenge for lighting companies. According to The U.S. Department of Energy, 70% of the cost of solid state light sources is due to the LED package (40%) and the appended heat sink (30%). In U.S. Published Patent Application No. 20130099264 (Livesay), which is commonly assigned and incorporated by reference into this invention, and previous filings by the authors of this invention, it was shown how both of these can be eliminated by combining the heat sink and package into the light emitting and heat dissipating element. Also shown were several ways in which this can be accomplished including making the thermally conductive luminescent material the wavelength conversion material or alternatively placing the wavelength material between the thermally conductive translucent material and LED. Livesay lists several materials that can be used for the thermally conductive translucent material or element, which become light emitting (i.e. luminescent) by directing the light from the LED into and through the translucent elements. Prior to this invention it was believed that to achieve high efficiencies (light output versus energy input) required translucent materials with high optical transparency. However, to achieve high transparency in ceramic materials usually requires more expensive processing. For example to achieve higher transparency in Cerium doped Yttrium Aluminum Garnet requires high sintering temperatures and subsequent hot isostatic pressing. Similarly, $Al_2O_3$ (alumina) becomes more transparent with more costly sintering and hot isostatic pressing. These processes increase the cost of the material used for the light sources as practiced in Livesay and this invention. To effectively cool via natural convection and radiation requires large surface areas of the light transmissive thermally conductive materials (as taught by Livesay) to dissipate the heat generated by the LEDs attached to them. However if the cost of processing the light transmissive thermally conductive materials is high, this becomes a significant factor in the cost of the light source. It would be beneficial if there was a way in which less expensive light transmissive thermally conductive or translucent materials could be used. This would lower the cost of the light sources and speed up adoption of these environmentally friendly sources.

Heat generated within the LEDs and phosphor material in typical solid state light sources is transferred via conduction means to large appended heat sinks usually made out of aluminum or copper. The temperature difference between the LED junction and heat sink can be 40° C. to 50° C. The temperature difference between ambient and the surfaces of an appended heat sink's surfaces is typically very small given that there is typically a significant temperature drop (thermal resistance) between the LED junction and the heat sink surfaces. With small temperature differences between the heat sink and ambient very little radiative cooling takes place. This small temperature difference not only eliminates most of the radiative cooling but also requires that the heat sink be fairly large (and heavy) to provide enough surface area to effectively cool the LEDs. The larger the heat sink, the larger the temperature drop between the LED junction and the surface of the heat sink fins. For this reason, heat pipes and active cooling is used to reduce either the temperature drop or increase the convective cooling such that a smaller heat sink volume can be used. In general, the added weight of the heat sink and/or active cooling increases costs for shipping, installation, and in some cases poses a safety risk for overhead applications. It would be advantageous if the heat sink temperature was close to the LED junction temperature to enable more radiative cooling of the light source.

BRIEF SUMMARY OF THE INVENTION

This invention relates to solid state light sources based on LEDs mounted to and in thermal contact to light transmitting thermally conductive elements, which have sufficient surface area to provide convective and radiative cooling to dissipate the majority of the heat generated by the LEDs. Briefly, and in general terms, the present invention resides in a self cooling light source comprising at least one light-emitting diode (LED) and at least one light transmitting thermally conductive element to which the LED is mounted, the element having a heat emitting surface through which most of the heat from the LED is dissipated. Ideally, the light source is structured to redirect light emitted by the LED to pass through and exit from the light transmitting thermally conductive element through its heat emitting surface. In most cases the light transmitting thermally conductive material is also partially reflective and is sometimes referred herein as a reflective/transmissive (or reflective and transmissive light transmitting) thermally conducting element. Also the term "translucent" is used herein to describe elements that are both partially reflective and partially transmitting of light incident on them but also capable of waveguiding and scattering the light incident within the element. More economical, self-cooling solid state light sources can be realized by utilizing lower light transmitting (i.e. mostly reflective) thermally conductive translucent elements. Mostly reflective is used herein to describe light transmitting elements, which have higher light reflectivity than light transmissivity. Remarkably, it has been found when mostly reflective and, therefore, low (less than 16% to 20%) light transmitting thermally conductive elements are arranged to form a closed cavity or enclosure (which causes the light that is emitted by the LEDs, mounted to the inside surfaces of the elements, to reflect and recycle inside the thus formed light recycling cavity) that a high percentage (e.g. >80%) of the light emitted by the LEDs eventually is transmitted and extracted through one or more of the mostly reflective partially light transmitting thermally conductive elements and thereby is emitted from the outside surfaces of the cavity. All of the outside surfaces of the cavity are thereby luminescent (light emitting) and they also simultaneously dissipate the heat generated by the LEDs via convection and radiation. This creates a visually pleasing, very uniform and omnidirectional light source without requiring an appended heat sink. Because there is no need for an appended heat sink, there is no blocking of the light from any of the emitting sides of the source, creating a truly omnidirectional light source. Optionally, a reflector may be used with at least one LED and at least one thermally conductive translucent element to form the light recycling cavity to create a directional light source emitting from one or more of the sides (e.g. emitting into a hemisphere vs. a solid angle).

The electrical interconnect to the LEDs as well as other semiconductor devices can be integrated onto the thermally conductive translucent elements. The electrical interconnects can be highly reflective or optionally transparent electrical conductive traces on the thermally conductive translucent elements. In one embodiment of the invention, multiple, partially optically reflective and partially optically transmissive, thermally conductive elements are used to form a light recycling cavity, reflecting and light recycling emitted by the LEDs mounted to the interconnects on the thermally conductive translucent elements that form the cavity. Due to the multiple light reflections therein, a portion of the light emitted from each LED will be transmitted through one or more of the thermally conductive reflective and transmissive elements making up the cavity. The term 'mostly reflective' as used herein refers to thermally conductive elements that reflect over 50% of the light initially incident on them. Optionally, more costly higher in line light transmission (greater than 70%) materials may be utilized (e.g. transparent alumina oxide, TPA). These are typically less than 30% reflective. Wavelength conversion can be accomplished by: phosphor coatings or caps on the LEDs, wavelength conversion elements that are ceramic or organic and coated or bonded onto the thermally conductive translucent elements or optionally incorporated into the thermally conductive translucent elements. Light sources constructed, as described, with light transmitting (optionally translucent) thermally conductive elements or more reflective thermally conductive elements can completely or partially eliminate the need for any additional heat sinks by efficiently transferring and spreading out the heat generated in the LED over an area sufficiently large enough such that convective and radiative means can be used to cool the device.

Moreover, the use of lower light transmitting materials permits the use of higher thermal conductivity materials, which reduce the thermal resistance between the LED p-n junction (where the heat is generated) and the light emitting surfaces of the light source where the heat is dissipated. This in effect places the emitting surface to be cooled at a higher temperature (closer to the LED junction temperature), which enables more efficient radiative and convective cooling to ambient.

DETAILED DESCRIPTION OF THE INVENTION

Figure 1A:
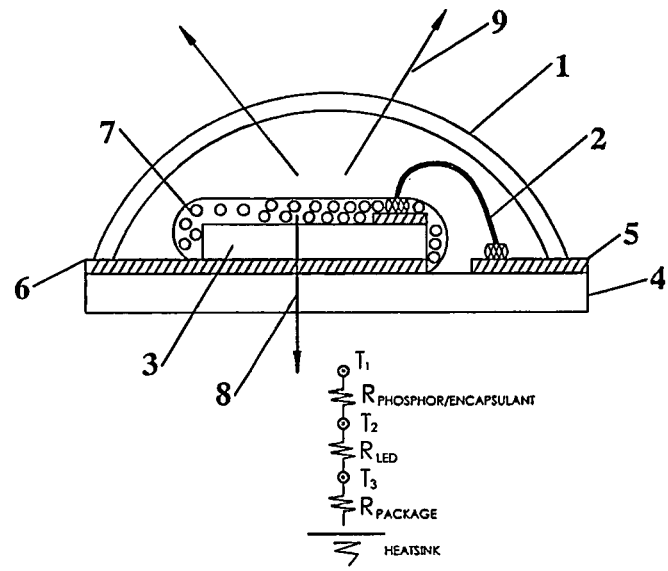
FIGS. 1A and 1B depict side views of prior art vertical and flip chip mounted LED packages and thermal schematics where the optical emission is substantially in the opposite direction of the heat removal.

According to the present invention as practiced herein, a conductive interconnect (transparent or reflective) is deposited on translucent thermally conductive elements (e.g. alumina ($Al_2O_3$), transparent alumina (TPA), Spinel, Sapphire, etc.) This can be done lithographically, or more preferred, via screen printing. LEDs or LEDs on surface mountable ceramic substrates (also referred herein as LED packages) are mounted (e.g. via soldering or conductive adhesives) to the interconnect on the translucent thermally conductive elements. It is preferred that the mounting method establish a low thermal resistant contact from the LED to the light transmitting thermally conductive element. Light emitted by the LEDs is directed to the thermally conductive translucent elements where it passes through and is emitted by the thermally conductive light transmitting (and thereby light emitting luminescent) element. The light transmitting thermally conductive elements have surface areas sufficiently larger than the LEDs (or LEDs mounted to ceramic surface mount substrates) to dissipate the heat generated by the LEDs. As practiced in this invention, the heat generated by the LEDs is dissipated via convection and radiation from the luminescent (light emitting) surface (or surfaces) of the thermally conductive light transmitting and optionally translucent elements thereby eliminating any need for an appended bulky and heavy heat sink.

Large surface areas of the light transmissive or translucent thermally conductive materials or elements are required to practice the invention; therefore, it is desirable to minimize the cost of those materials. Disclosed herein is a means to fabricate self cooling solid state light sources using lower cost materials for the thermally conductive translucent elements which both emit the light and dissipate the heat from the LEDs. It is shown that by forming light recycling cavities with more reflective than transmitting thermally conductive light transmissive or translucent elements lower cost materials may be utilized. For example conventionally processed alumina ($AL_2O_3$) is relatively inexpensive (<10 cents per square inch). However, it is highly reflective (white in color) with a transmittance of less than 20% of incident light even in relatively thin thicknesses (from 500 microns to 1 millimeter) and, therefore, would appear to be a poor candidate for use as a luminescent element in the light sources where the LED(s) is enclosed in or by these materials. Highly transparent alumina (TPA) is by comparison more expensive (>50 cents per square inch) but can have a transmittance of greater than 80% of incident light with the majority of that being Fresnel reflections at the surfaces. However, one of the embodiments of this invention is to arrange the thermally conductive translucent elements into a closed envelope where they become light recycling cavities similar to those disclosed in U.S. Pat. No. 7,040,774 and U.S. Pat. No. 6,960,872, both of which are commonly assigned and incorporated by reference into this invention. Whereas, the higher cost materials that are more transparent translucent thermally conductive elements can be utilized to form these light recycling cavities, it has been found that the lower cost more reflective (less transparent) thermally conductive translucent material (e.g. conventionally processed alumina ($AL_2O_3$)) can perform almost as well as the more expensive transparent materials. For example a light recycling cavity can be formed using six thin sheets of 96% alumina with a reflectivity greater than 83%. As practiced herein LEDs or LED surface mountable packages (LEDs mounted on small ceramic substrates) are mounted on the inside surfaces of larger mostly reflective translucent thermally conductive elements that form a fully enclosed cavity.

A preferred material for these mostly reflective thermally conductive translucent materials is 96% alumina ($Al_2O_3$) as it is relatively inexpensive. If making a white light source, wavelength conversion materials (phosphors) are covered over the emitting surfaces of the LEDs. This can be a phosphor cap, a ceramic phosphor chip or a phosphor coated on the LED with a clear adhesive coating like silicone or epoxy. Light emitted from the LEDs (mounted on the inside of the cavity) and optionally wavelength converted, impinges on the opposite sides of the enclosed light recycling cavity and because the translucent thermally conductive elements in this case are mostly reflective only a small amount of light is transmitted (for example as little as 16% with an 84% reflective alumina element) and emitted from the outside surface. However, the light not transmitted is reflected back to the opposite and other sides of the such formed cavity and 16% of the 84% reflected light (~13.4%) is transmitted through and emitted by the other surfaces of the cavity. This process continues until a very high percentage of the light emitted by the LED(s) passes through the (white in body color and appearance) mostly reflective thermally conductive translucent (e.g. alumina) and is emitted by the light source. Remarkably over 80% of the light emitted by the LEDs will eventually be emitted through the sides of what in appearance looks like a white opaque envelope (or enclosure) even though the high reflectivity (e.g. alumina) elements have less than 17% optical transmittance. The critical parameter to make this approach efficient is that the mostly reflective thermally conductive translucent elements (e.g. alumina) have low absorption but scatter light efficiently. As such careful selection of sintering aids and other materials typically used in alumina ceramic production is necessary. This typically manifests itself as body color to the human eye. While scatter is wavelength dependent it does not necessarily translate into increased absorption in recycling cavity applications.

In the previously cited patents on light recycling cavities, it was disclosed that absorption losses must be minimized to create efficient recycling optical systems. In this disclosure, the recycling cavities are formed using partially reflective (<50%) and in one embodiment more reflective (>50%) thermally conductive elements. The elements may be translucent with scattering and may have reflectivities of >80% and still achieve high light extraction efficiencies from the LEDs in the closed light recycling cavities. As an example, a cube made up of thin alumina ($Al_2O_3$) sides onto which LEDs or LED packages are mounted forms a recycling cavity on the inside of the cube. A reflective (e.g. silver) or transparent (e.g. indium tin oxide) interconnect on the inside surfaces of the sides (e.g. alumina elements) of the cube enable electrical connections and power to be applied to the LEDs and/or LED packages mounted to the inside surfaces of the cube. Optionally, pins, wires, conductive vias, flex circuits, etc. can be used to bring power into the cavity via an external electrical power source. The inherent light weight of this approach allows for 50 lumens per gram output levels or higher which exceeds the lumens per gram of incandescent and fluorescent lights. Like incandescent and fluorescent lighting, these light recycling cavity sources do not require additional heat sinks as the light emitting surfaces of the cavity also are the heat emitting surfaces thereby substantially eliminating the need for any additional heat sinking elements. However, unlike the light recycling cavity as described in U.S. Pat. No. 6,960,872, which discloses physical exit apertures, the light generated by the LEDs and/or LED packages can only escape from the light recycling cavity (as disclosed herein) by passing through the thermally conductive translucent elements, which make up the sides of the cavity. This results in a very uniform light output from all exterior surfaces of the closed cavity, which creates a totally omnidirectional light source. Because the more reflective thermally conductive translucent elements (e.g. alumina ($Al_2O_3$)) only transmits between 10% and 20% of the incident light that impinges on them, the majority of the light emitted by the LEDs and/or LED packages are reflected multiple times thus forming a recycling cavity where the sides of the cavity are partially transmitting. As such a recycling cavity comprising partially transmitting thermally conductive elements is disclosed.

Also disclosed is the same recycling cavity further containing solid state LEDs and/or LED packages. Even further disclosed is a light recycling source comprising partially transmitting thermally conductive elements with LEDs and/or LED packages powered via a reflective interconnect and power input means. The reflected light rays bounce around within the recycling closed cavity and eventually are transmitted out of the light recycling cavity if the absorption losses of the alumina, interconnect, and LEDs and/or LED packages are low enough. This can be modeled as an infinite power series mathematically. If the absorption losses are low, tens if not hundreds of reflections can occur within the recycling closed cavity. This not only allows for high efficiency it also creates a very uniform output distribution on the emitting surfaces of the light emitting closed cavity or envelope. As such the formation of a recycling cavity to create a uniform intensity light source based on partially transmitting thermally conductive elements is an embodiment of this invention. The efficiency of such recycling cavities is measured by measuring the raw lumen output of the LED(s) by themselves outside a cavity driven at fixed voltage and current and then measuring the output from the light recycling cavity with the LED(s) driven at the same voltage and current.

The efficiency of the light recycling cavity is a function of the reflectivity of the interior surfaces of the cavity and the other elements within the cavity. Theoretically, if all interior surfaces are 100% reflective, then the only loss is that light that escapes or is absorbed by the LEDs or interconnect. The LEDs and or wavelength conversion material preferably have as high a reflectivity as possible however some absorption does occur. This will impact the efficiency, as light incident back on the LEDs or wavelength conversion elements will tend to get absorbed or further converted in the case of the wavelength conversions elements. This is readily seen when LED packages are placed within a thus formed recycling cavity as the color temperature of the LED packages drop by several 100° Kelvin. As such the use of recycling cavities to create lower color temperature light sources from higher color temperature LED packages is an embodiment of this invention. This occurs with recycling cavities as formed above with blue emitting LEDs and phosphor caps that convert the blue to longer wavelengths. Because of the recycling of blue light back to the wavelength conversion elements within the cavity more blue light is converted to longer wavelengths because of the light recycling. Light incident on the mostly reflective partially transmitting thermally conductive elements (e.g. alumina ($Al_2O_3$)) will either be reflected or emitted. It should be noted that even the more reflective partially transmitting thermally conductive elements (e.g. alumina ($Al_2O_3$)) can provide some wavelength conversion. It was discovered that inadvertent chromium dopants in standard alumina ($Al_2O_3$) will emit narrow band red light due to the blue wavelength photons exciting the chromium ions in the alumina matrix in a manner very similar to chromium doped sapphire (ruby laser). As such the addition of dopants or luminescent elements to the partially transmitting thermally conductive elements is also and embodiment of this invention.

Because the partially transmitting thermally conductive elements provide the heat dissipation means for the light source, relatively large areas of the partially transmitting thermally conductive elements (e.g. alumina ($Al_2O_3$)) are required compared to the areas of the LEDs or phosphor caps comprising the inside surfaces of the cavity. This is needed to provide a large enough exterior surface for radiative and convective cooling to dissipate the heat generated by the LEDs. This means that the reflectivity of the cavity is largely determined by the partially transmitting thermally conductive translucent elements. While alumina ($Al_2O_3$) is a preferred material for the partially transmitting thermally conductive elements used to form the recycling cavity light source disclosed herein, composites, other ceramics, polycrystalline, and single crystal materials which exhibit low absorption losses, reasonable thermal conductivity, and thermal stability are embodiment of this invention. As an example, Boron Nitride (BN) flakes within a low absorption optical polymer like polysilazane can be used to create partially transmitting thermally conductive elements. It is also noted that as the LED and/or LED packages become more efficient there will be a larger range of materials that can satisfy the requirements of the partially transmitting thermally conductive elements. In the future, in the advent of more efficient LEDs, the use of glass (1 W/mK) may be possible while still providing reasonable output levels. With current state of the art LEDs and using alumina ($Al_2O_3$) for the mostly reflective partially transmitting thermally conductive elements a uniform self cooling light source with surface brightnesses exceeding 20,000 ftL has been attained. It is also possible to utilize high thermal conductivity metals for the mostly reflective partially transmitting thermally conductive elements. By using thin strips or sheets of silver coated or plated copper and/or aluminum with many small holes or perforations any desired ratio of reflectivity to transmissivity for the light recycling cavity may be attained by adjusting the density of the tiny apertures (holes or perforations) through the elements. The perforations may be made by punching, drilling, laser ablation, etc.

The thermally conductive luminescent element can be used to completely or partially eliminate the need for any additional heat sinking means by efficiently transferring and spreading out the heat generated in the LED and luminescent element itself over an area sufficiently large enough such that convective and radiative means can be used to cool the device. In other words, the surface emitting the light also convectively and radiatively cools the device. Optionally, the thermally conductive luminescent element can also provide for the efficient wavelength conversion of a portion (zero to 100%) of the radiation emitted by the LEDs. Electrical interconnect of the LEDs and other semiconductor devices can be accomplished by opaque and/or transparent conductors that are fabricated onto the thermally conductive and optically partially transmitting elements. The low cost self-cooling solid state light sources can have printed on, thick film printed silver conductors with a reflectivity greater than 30% or optionally transparent conductors (e.g. indium tin oxide or zinc oxide).

The present invention may also be defined as a self cooling solid state light source comprising at least one light-emitting diode (LED) die and at least one thermally conductive luminescent element bonded to the at least one LED die; wherein heat is transmitted from the light source in basically the same direction as emitted light. More specifically, light is emitted from the LED die principally in a direction through the at least one luminescent element, and heat generated in the light source is transmitted principally in the same direction as the direction of light emission. Heat is dissipated from the light source by a combination of radiation, conduction and convection from the at least one luminescent element, without the need for a device heat sink.

Optionally, the luminescent thermally conductive element can provide light spreading of at least a portion of the radiation from the LEDs and/or radiation converted by the thermally conductive luminescent elements via waveguiding. A thermally conductive luminescent element acts as a waveguide with alpha less than 10 $cm^{-1}$ for wavelengths longer than 550 nm. In this case, the LEDs with emission wavelengths longer than 550 nm can be mounted and cooled by the thermally conductive luminescent elements and also have at least a portion of their emission efficiently spread out via waveguiding within the thermally conductive luminescent element as well.

Thermally conductive luminescent elements with InGaN and AlInGaP LEDs can convert at least a portion of the InGaN spectrum into wavelengths between 480 and 700 nm. Single crystal, polycrystalline, ceramic, and/or flame sprayed Ce:YAG, Strontium Thiogallate, or other luminescent materials emitting light between 480 and 700 nm and exhibiting an alpha below 10 $cm^{-1}$ for wavelengths between 500 nm and 700 nm can be a thermally conductive solid luminescent light spreading element.

The mounting of InGaN and AlInGaP LEDs can form solid state extended area light sources with correlated color temperatures less than 4500☐K and efficiencies greater than 50 L/W and optionally color rendering indices greater than 80 based on these thermally conductive light spreading luminescent elements.

One embodiment of this invention is a luminescent thermally conductive translucent element having a thermal conductivity greater than 1 W/mK consisting of one or more of the following materials, alumina, ALN, Spinel, zirconium oxide, BN, YAG, TAG, and YAGG. Optionally, electrical interconnects maybe formed on at least one surface of the luminescent thermally conductive translucent element to provide electrical connection to the LED.

The luminescent thermally conductive element can have a thermal conductivity greater than 1 W/mK and have an emissivity greater than 0.2. A self cooling solid state light source can have at least one luminescent thermally conductive element with a thermal conductivity greater than 1 W/mK and an emissivity greater than 0.2. A self cooling solid state light source can have an average surface temperature greater than 50° C. and a luminous efficiency greater than 50 L/W. Optionally, a self-cooling solid state light source can have an average surface temperature greater than 50° C. and a luminous efficiency greater than 50 L/W containing at least one luminescent thermally conductive element with a thermal conductivity greater than 1 W/mK and an emissivity greater than 0.2. A self-cooling solid state light source can dissipate greater than 0.3 $W/cm^2$ via natural convection cooling and radiation cooling.

Translucent thermally conductive elements can be formed via the following methods: crystal growth, sintering, coating, fusible coating, injection molding, flame spraying, sputtering, CVD, plasma spraying, melt bonding, and pressing. Pressing and sintering of oxides with substantially one phase will improve translucency based on a luminescent powder. Alternately, a translucent element with a thermal conductivity greater than 1 W/mK and an alpha less than 10 $cm^{-1}$ can be coated with a wavelength conversion layer formed during the sintering process or after the sintering process. Single crystal or polycrystalline materials, both wavelength converting and non-wavelength converting, can be used as the thermally conductive luminescent element. Specifically, TPA (transparent polycrystalline alumina), Spinel, cubic zirconia, quartz, and other low absorption thermally conductive materials with a wavelength conversion layer can be formed during or after fabrication of these materials. Techniques such as pressing, extruding, and spatial flame spraying can form near net shape or finished parts. Additional wavelength conversion layers can be added to any of these materials via dip coating, flame spraying, fusing, evaporation, sputtering, CVD, laser ablation, or melt bonding. Controlled particle size and phase can improve translucency.

Coatings can improve the environmental and/or emissivity characteristics of the self-cooling light source, particularly if the coating is a high emissivity coating with and without luminescent properties. Single crystal, polycrystalline, ceramic, coating layers, or flame sprayed can be used both as a coating and as the bulk material Ce:YAG, with a high emissivity or environmental protective coating. In particular, polysiloxanes, polysilazanes and other transparent environmental overcoats can be applied via dip coating, evaporative, spray, or other coating methods, applied either before or after the attachment of the LEDs. Additional wavelength conversion materials can be added to these overcoats such as but not limited to quantum dots, wavelength shifter dyes (such as made by Eljen), and other wavelength conversion materials.

Wireless power transfer elements, power conditioning elements, drive electronics, power factor conditioning electronics, infrared/wireless emitters, and sensors can be integrated into the self cooling solid state light source.

A self cooling solid state light source can have a luminous efficiency greater than 50 L/W at a color temperature less than 4500☐K and a color rendering index greater than 70. The self cooling solid state light source can have a surface temperature greater than 40° C., convectively and radiatively cooling more than 0.3 $W/cm^2$ of light source surface area, and have a luminous efficiency greater than 50 L/W.

A self cooling solid state light source can have a luminous efficiency greater than 50 L/W at a color temperature less than 4500☐K and a color rendering index greater than 85 containing both blue and red LEDs. At least one luminescent thermally conductive element with an alpha less than 10 cm$^{-1}$ for wavelengths longer than 500 nm is used in the self cooling solid state light source containing at least one blue and at least one LED with emission wavelengths longer than 500 nm. Additional wavelength conversion materials in the form of coatings and/or elements including, but not limited, to phosphor powders, fluorescent dies, wavelength shifters, quantum dots, and other wavelength converting materials, can further improve efficiency and color rendering index.

Aspect ratios and shapes for the solid state light source can be, including but not limited to, plates, rods, cylindrical rods, spherical, hemispherical, oval, and other non-flat shapes. Die placement can mitigate edge effects and form more uniform emitters.

Additional scattering, redirecting, recycling, and imaging elements can be attached to and/or in proximity to the solid state light source designed to modify the far field distribution. Additional elements can be attached to the solid state light source with a thermally conductivity greater than 0.1 W/mK such that additional cooling is provided to the solid state light source via conduction of the heat generated within the solid state light source to the additional element and then to the surrounding ambient. An external frame can provide mechanical support, can be attached to the solid state light source, and/or can provide an external electrical interconnect. Multiple solid state sources arranged with and without additional optical elements can generate a specific far field distribution. In particular, multiple solid state sources can be arranged non-parallel to each other such that surface and edge variations are mitigated in the far field. A separation distance between solid state light sources surfaces of greater than 2 mm is preferred to facilitate convective cooling. Mounting and additional optical elements can enhance convective cooling via induced draft effects.

The thermally conductive luminescent element can also provide for the efficient wavelength conversion of a portion of the radiation emitted by the LEDs. Optionally, the luminescent thermally conductive element can provide light spreading of at least a portion of the radiation from the LEDs and/or radiation converted by the thermally conductive luminescent elements.

Disclosed is a self cooling solid state light source containing an optically transmitting thermally conductive element with a surface temperature greater than 50° C. and a surface area greater than the semiconductor devices mounted on the optically transmitting thermally conductive element. Even more preferably, a self cooling solid state light source containing at least one optically transmitting thermally conductive element with a surface temperature greater than 100° C. and a surface area greater than the surface area of the mounted semiconductor devices. Most preferred is a self cooling solid state light source containing at least one optically transmitting thermally conductive luminescent element with an average thermal conductivity greater than 1 W/mK. As an example, YAG doped with 2% Cerium at 4 wt % is dispersed into an alumina matrix using spray drying. The powders are pressed into a compact and then vacuum sintered at 1500° C. for 8 hours, followed by hot isostatic pressing at 1600° C. for 4 hours under argon. The material is diamond saw diced into 1 mm thick pieces which are ½ inch×1 inch in area. The parts are laser machined to form interconnect trenches into which silver paste is screen printed and fired. The fired silver traces are then lapped to form smooth a surface to which direct die attach LED die are soldered. Pockets are cut using the laser such that two pieces can be sandwiched together thereby embedding the direct die attach LED die inside two pieces of the ceramic Ce:YAG/alumina material. In this manner, a self cooling light source is formed. The direct die attached LED is electrically interconnected via the silver traces and thermally connected to the ceramic Ce:YAG/alumina material. The heat generated within the direct die attach LEDs and the ceramic Ce:YAG/alumina material is spread out over an area greater than the area of the LEDs. In this example, power densities greater than 1 W/cm$^2$ can be dissipated while maintaining a junction temperature less than 120° C. and surface temperature on the ceramic Ce:YAG/alumina material of 80°C to 90° C. based on natural convection and radiative cooling. As such a ¼ inch×½ inch solid state light source can emit over 100 lumens without any additional heat sinking or cooling means.

Materials with emissivities greater than 0.3 are preferred to enhance the amount of heat radiated from the light emitting surfaces of the solid state light source. Even more preferable are materials with an emissivity greater than 0.7 for surface temperatures less than 200° C. A naturally convectively cooled surface with a natural convection coefficient of 20 W/m2/k with a surface temperature of 50° C. in a 25° C. ambient will transfer about 25% of its energy to the surrounding ambient radiatively if the surface emissivity is greater than 0.8 and can dissipate approximately 0.08 W/cm$^2$ of light source surface area. A similar naturally convectively cooled surface with a surface temperature of 100° C. can transfer 30% of its energy to the surrounding ambient radiatively and dissipate greater than 0.25 watts/cm$^2$ of surface area. A similar naturally convectively cooled surface with a surface temperature of 150° C. can transfer 35% of the heat radiatively and dissipate greater than 0.4 watts/cm$^2$. Given that solid state light sources can approach 50% electrical to optical conversion efficiency and that the typical spectral conversion is 300 lumens/optical watt, using this approach a self cooling solid state light source can emit 75 lumens for every 1.0 cm$^2$ of light source surface area. As an example, a ¼ inch×½ inch×2 mm thick self cooling light stick can generate more than 150 lumens while maintaining a surface temperature less than 100° C. The typical LED junction temperature for high powered devices can be over 120° C. and still maintain excellent life and efficiency. For surfaces with temperatures less than 120° C. the majority of the radiated energy is in the infrared with a wavelength greater than 8 microns. As such high emissivity coatings, materials, and surfaces, which are substantially transparent in the visible spectrum but with high thermal emissivity in the infrared, are preferred embodiments of self cooling light sources.

The emissivity of the materials in the infrared varies greatly. Glass has an emissivity of approximately 0.95 while aluminum oxide can be between 0.5 and 0.8. Organics such as polyimides can have fairly high emissivity in thick layers. This however will negatively affect the transfer of heat due to the low thermal conductivity of organics. As such high thermal conductivity high emissivity materials and coating are preferred. High emissivity/low visible absorption coatings are described in J. R. Grammer, "*Emissivity* Coatings for Low-Temperature *Space Radiators*", NASA Contract NAS 3-7630 (30 Sep. 1966). Various silicates are disclosed with emissivity greater than 0.85 and absorptions less than 0.2.

In order to maximize heat transfer to the ambient atmosphere, the need exists for luminescent thermally conductive materials which can effectively spread the heat generated by localized semiconductor and passive devices (e.g. LEDs, drivers, controller, resistors, coils, inductors, caps etc.) to a larger surface area than the semiconductor die via thermal conduction and then efficiently transfer the heat generated to the ambient atmosphere via convection and radiation. At the same time, these luminescent thermally conductive materials may optionally also efficiently convert at least a portion of the LED light emission to another portion of the visible spectrum to create a self cooling solid state light source with high lumen per watt efficiency and good color rendering. Conventional wavelength converters in both solid and powder form are substantially the same size as the LED die or semiconductor devices. This minimizes the volume of the luminescent material but localizes the heat generated within the luminescent element due to Stokes' losses and other conversion losses. In present day solid state light sources approximately 50% of the heat generated is within the luminescent material. By using a thermally conductive luminescent element with low dopant concentration, which also acts as a waveguide to the excitation light emitted by the LEDs, the heat generated by the luminescent conversion losses can be spread out over a larger volume. In addition, a more distributed light source can be generated rather than localized point sources as seen in conventional LED packages. In this manner the need for additional diffusing and optical elements can be eliminated or minimized. As such the use of translucent or partially transmitting luminescent thermally conductive elements with surface area greater than the semiconductor devices mounted on the luminescent elements is a preferred embodiment.

These and other embodiments of this invention are detailed in the description of figures below.

FIG. 1A depicts a prior art vertical LED die 3 mounted on a substrate 4. The vertical LED die 3 is typically coated with an inorganic/organic matrix 7 consisting of phosphor powder such as, but not limited to, Ce:YAG in a silicone resin material. The wire bond 2 is used to electrically connect vertical LED die 3 to interconnect 5, which is then coated with the inorganic/organic matrix 7. The other side of vertical LED die 3 is contacting interconnect 6 usually via eutectic solder or conductive adhesives. A lens 1 is further attached to substrate 4 to environmentally seal the assembly, enhance light extraction from vertical LED die 3, and modify the far field optical pattern of the light emitted by the device. In this case, emitted rays 9 are substantially traveling in the opposite direction of the heat ray 8.

As shown in the thermal schematic in FIG. 1A, cooling of the inorganic/organic matrix 7 occurs almost exclusively via thermal conduction through the vertical LED die 3 and into the substrate 4 via interconnect 6. The heat generated within inorganic/organic matrix 7 due to Stokes' losses and scattering absorption is thermally conducted to the vertical LED die 3 at a rate determined by the thermal resistance determined by the bulk thermal conductivity of the inorganic/organic matrix 7. As shown in the simplified thermal schematic, the average temperature of the inorganic/organic matrix 7 is determined by the thermal resistance R (phosphor/encapsulant) and T2 the average temperature of the vertical LED die 3. In order for heat generated within the inorganic/organic matrix 7 to be dissipated to the ambient, it must move the thermal resistance of LED die 3 (RLED) and substrate 4 (R Package) before it can be dissipated to the ambient. This is a simplified thermal schematic, which lumps bulk and interface thermal resistances and spatial variations within the device. But in general, heat generated within the inorganic/organic matrix 7 must be dissipated mainly through the vertical LED die 3 due to low thermal conductivity of the other materials (e.g. Lens) which surround inorganic/organic matrix 7. Additional heat sinking means can further increase the surface area using metal, composite, or ceramic elements to enhance the dissipation of heat to ambient but the flow of heat is still basically the same. The lens 1 acts as an extraction element for the emitted light rays 9 but also acts as a barrier to thermal rays 8. Typically constructed of silicone or epoxy resins with thermal conductivity less than 0.1 W/mK, Lens 1 acts as a thermal insulator. Lens 1 also can limit thermal radiation from vertical LED 3 and inorganic/organic matrix 7 due to low emissivity. In general this design requires that approximate 50% of the isotropic emission from the active region within vertical LED 1 must be reflected off some surface within the device and that the far field output of the device be substantially directional or lambertian in nature. Even with the use of highly reflective layers, this represents a loss mechanism for this approach. These extra losses are associated with the added pathlength that the optical rays must go through and multiple reflections off the back electrodes. This added pathlength and reflections, which are required to extract the light generated in the active region of vertical LED 1, fundamentally reduces the efficiency of the LED based on the absorption losses of the LED itself. A significant portion of the light generated within the inorganic/organic matrix 7 must also pass through and be reflected by vertical LED 1. Since vertical LED 1 is not a lossless reflector, the added pathlength of these optical rays also reduce overall efficiency.

Figure 1B:
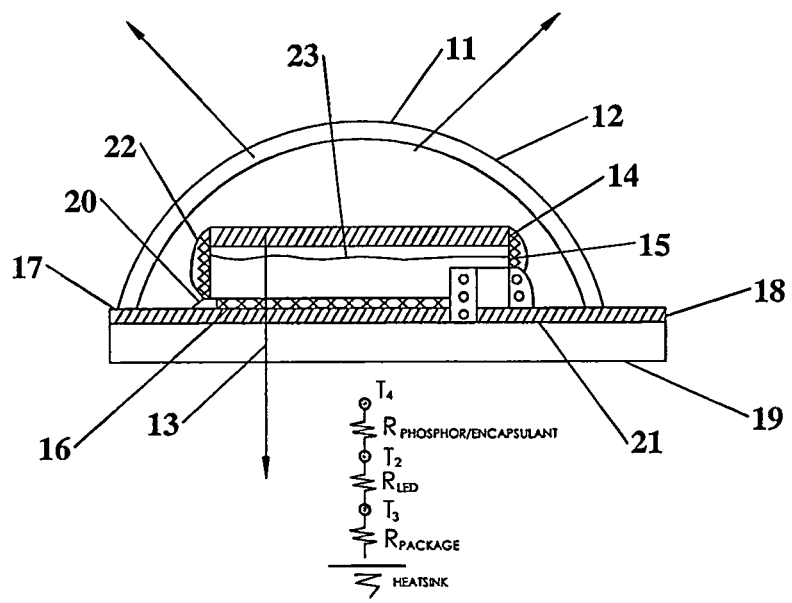

FIG. 1B depicts a prior art flip chip mounted LED 15. Solder or thermo compression bonding attaches flip chip mounted LED 15 via contacts 16 and 21 to interconnects 17 and 18 respectively on substrate 19. Luminescent converter 14 may be an inorganic/organic matrix as discussed in FIG. 1A or solid luminescent element, such as a Ce:YAG ceramic, single crystalline Ce:YAG, polycrystalline Ce:YAG or other solid luminescent materials as known in the art. In either case, the same cooling deficiency applies with this design. Virtually all the cooling of the luminescent converter 14 must be through the flip chip mounted LED 15. Again, emission rays 12 travel in a direction substantially opposite to thermal rays 13 and once again approximately 50% the isotropic emission of the active region of the flip chip mounted LED 15 must to redirected within the device requiring the use of expensive metals like Ag, specialized coating methods and even nano-lithography as in the case of photonic crystals.

The formation of contacts which are both highly reflective over a large portion of the LED die area and still forms a low resistivity contact has been a major challenge for the industry due to reflectivity degradation of Ag at the temperature typically required to form a good ohmic contact. This high light reflectivity and low electrical resistivity leads to added expense and efficiency losses. Because both the contacts must be done from one side typically an underfill 20 is used to fill in the voids created by the use of flip chip contacts. Lens 11 also forms a barrier to heat flow out of the device from both convectively and radiatively. The luminescent converter 14 is typically attached after the flip chip mounted die 15 is mounted and interconnected to substrate 19. A bonding layer 23 between the flip chip mounted die 15 and luminescent element 14 further thermally isolates the luminescent element 14. Typically, InGaN power LED UV/Blue chips exhibit efficiencies approaching 60% while White InGaN power LED packages are typically 40%. The loss within the luminescent converter 14 therefore represents a substantial portion of the total losses within the device. In the case of an inorganic/organic matrix luminescent converter of FIG. 1A, the conversion losses are further localized within the individual phosphor powders due to the low thermal conductivity of the silicone or epoxy matrix. The solid luminescent converter 14 has more lateral spreading due to the higher thermal conductivity of the solid material. Both cases are typically Cerium doped YAG with an intrinsic thermal conductivity of 14 W/mK. However since the silicone matrix has a thermal conductivity less than 0.1 W/mK and surrounds substantially all the phosphor powders, the inorganic/organic matrix has a macro thermal conductivity roughly equivalent to the silicone or epoxy by itself. Very high loading levels of phosphor powder can be used but lead to efficiency losses due to higher scatter.

There is simply nowhere for the heat generated in luminescent converter 14 to go except be thermally conducted into the flip chip mounted LED 15 via the bonding layer 23. In most cases, solid luminescent converters 14 must have an additional leakage coating 22 that deals with blue light that leaks out of the edge of the flip chip mounted LED 15. An inorganic/organic matrix suffers from the same issues in FIG. 1A. In both FIGS. 1A and 1B, the emission surface is substantially different from the cooling surfaces. The thermal schematic for FIG. 1B is similar to FIG. 1A in that heat generated within the luminescent converter 14 is substantially dissipated through the flip chip mounted LED 15. With the advent of high powered LEDs, a substantially portion of the heat generated within the device can be localized within luminescent converter 14. This localization has led to a variety of solutions including the use of remote phosphors. In general, luminescent converter 14 efficiency reduces as its average temperature T4 increases. In the prior art the luminescent converter 14 dissipates the majority of its heat through the flip chip mounted LED 15 with an average temperature of T5. This is an inherently higher temperature than the ambient. The need exists for techniques whereby the heat generated within luminescent converter 14 can be reduced for higher efficiency devices.

Figure 2A:
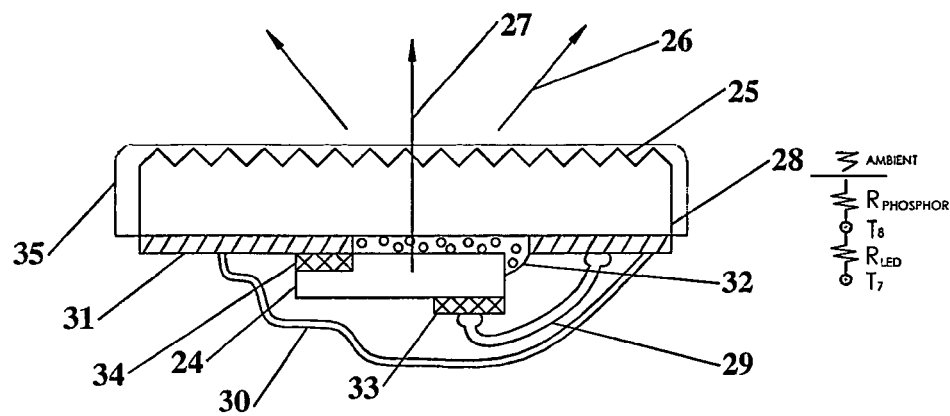
FIGS. 2A, 2B and 2C depict side views of self cooling solid state light sources using luminescent thermally conductive luminescent elements and interconnects with thermal schematics of the present invention.

FIG. 2A depicts a vertical LED 24 of the present invention in which the optical emission rays 26 travel substantially in the same direction as the thermal rays 27. A thermally conductive luminescent element 25 provides wavelength conversion for at least a portion of the light emitted by vertical LED 24 and acts as an optical and thermal spreading element, extraction means, and a substrate for the electrical interconnect. In FIG. 2A, overcoat 30 may be reflective, transparent, partially reflective and exhibit reflectivity, which is wavelength and/or polarization dependent.

Wire bond 29 connects interconnect 28 to contact pad 33 with contact 34 attached via conductive ink or eutectic solder to interconnect 31. A transparent/translucent bonding layer 32 maximizes optical and thermal coupling into thermally conductive luminescent element 25 and eventually out of the device. The transparent/translucent bonding layer 32 may consist of, but is not limited to, glass fit, polysiloxane, polysilazane, silicone, and other transparent/translucent adhesive materials. Transparent/translucent bonding layer 32 has a thermal conductivity greater than 0.1 W/mK and even more preferably greater than 1 W/mK. Thermally conductive luminescent element 25 may consist of, but is not limited to, single crystal luminescent materials, polycrystalline luminescent materials, amorphous luminescent materials, thermally conductive transparent/translucent materials such as Sapphire, TPA, Nitrides, Spinel, cubic zirconia, quartz, and glass coated with a thermally conductive luminescent coating, and composites of thermally conductive transparent/translucent material and thermally conductive luminescent materials.

In FIG. 2A a high emissivity layer 35 may be applied to the thermally conductive luminescent element 25 to enhance radiative cooling. In addition, high emissivity layer 35 may also provide enhanced extraction efficiency by acting as an index matching layer between the surrounding air and the thermally conductive luminescent element 25, especially in the case where extraction elements are used to increase extraction from the thermally conductive luminescent element 25. Unlike the previous prior art thermal schematic, the flow of heat generated in the thermally conductive luminescent element 25 is directly coupled to the ambient via convective and radiative cooling off the surface of the thermally conductive luminescent element 25 itself. This direct coupling approach can only be effectively accomplished if the bulk thermal conductivity of the thermally conductive luminescent element 25 is high enough to effectively spread the heat out over an area sufficiently large enough to effective transfer the heat to the surrounding ambient. As such, a thermally conductive luminescent element has a surface area greater than the attached LED with an average bulk thermal conductivity greater than 1 W/mK wherein the heat generated within the Vertical LED 24 and thermally conductive luminescent element 25 are substantially transferred to the surrounding ambient via convection and radiation off the surface of thermally conductive luminescent element 25. High emissivity layer 35 most preferably has an emissivity greater than 0.8 at 100° C. and an absorption less than 0.2 throughout the visible spectrum. Alternately, the emissivity of the thermally conductive luminescent element 25 may be greater than 0.8 at 100° C. and have an absorption less than 0.2 throughout the visible spectrum.

Figure 2B:
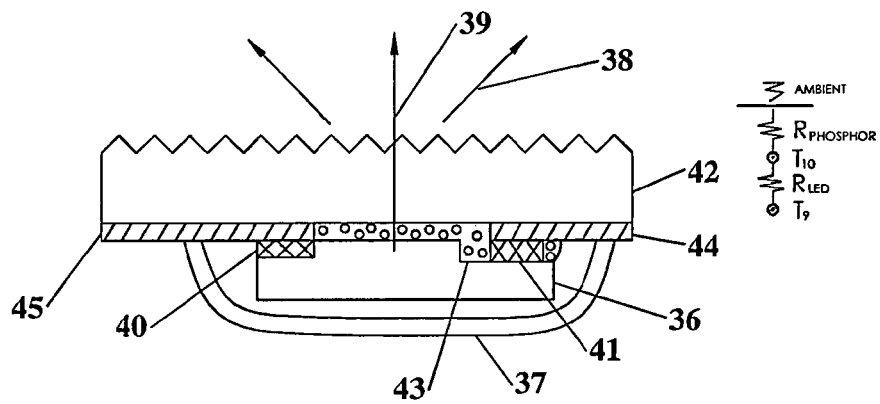

FIG. 2B depicts a flip chip mounted LED 36 mounted on thermally conductive luminescent element 42 via a transparent/translucent bonding layer 43 and electrically connected via contacts 41 and 40 to interconnects 44 and 45 on thermally conductive luminescent element 25. Interconnects 44 and 45 are thick film silver conductors formed via screen printing, inkjet printing, lithographic means, or combinations of these other methods. As an example, thermally conductive luminescent element 42 may contain a laser cut trench approximately 5 micron deep into which silver paste is screen printed and fired. The surface of conductive luminescent element 42 is then optionally lapped to create a smooth surface for interconnect 44 and 45. The resulting surface is now smooth enough for thermo compression bonded die, direct die attach die with integral eutectic solders, and other direct attach bonding methods. The interconnects 44 and 45 are typically fired at a temperature greater than 400° C. The interconnects 44 and 45 are thick film or inkjet silver traces with line widths less than or greater than the width of the flip chip mounted LED 36. Optical losses within the device can be minimized by minimizing the amount of silver used, minimizing the width of the interconnect traces and maximizing the reflectivity of the silver traces. Alternately, the thermal resistance between flip chip mounted LED 36 and the thermally conductive luminescent element 42 may be minimized by increasing the amount of silver thickness or area. Overcoat 37 may consist of, but is not limited to, glass frit, polysiloxane, polysilazanes, flame sprayed ceramics, and evaporative/CVD coatings. A highly reflective layer in overcoat 37 is optional. In this manner, a compact directional light source can be formed. Transparent/translucent bonding layer acts as an environmental and shorting barrier for the device. The reflector in overcoat 37 can be applied after all the high temperature processing thereby maximizing reflectivity of the layer. The thermal schematic shown in FIG. 2B again shows that there is a much different thermal conduction path than FIG. 1 devices. Thermally conductive luminescent element 42 provides the cooling surfaces for the device as well as conversion of light from LED 36. The emitting surface of the device is also the cooling surface of the device.

Figure 2C:
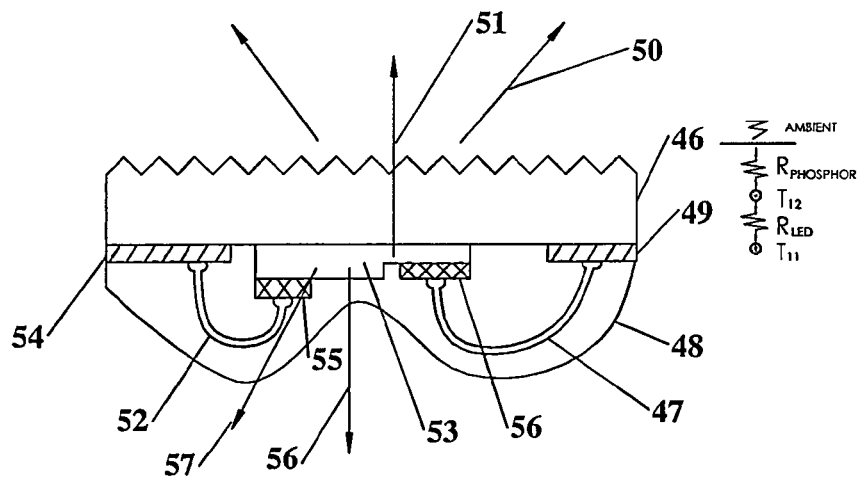

FIG. 2C depicts a lateral LED 53 mounted onto thermally conductive luminescent element 46. As in FIG. 2A and FIG. 2B, the optical emission 50 and thermal rays 51 travel in substantially the same direction. In this configuration, a transparent/translucent overcoat 48 couples thermal rays 56 and optical emission 57 out the backside of the device. Optical emission 50 and optical emission 57 may be the same or different from each other regarding emission spectrum, intensity, or polarization. Additives, coatings, and combinations of both can affect the emission spectrum, intensity and polarization within overcoat 48. Interconnect 49 and 54 may consist of, but are not limited to, electrically conductive materials in a dielectric matrix. A silver flake thick film paste screen can be printed and fired at greater than 400° C. with a reflectivity greater than 50% to form an electrically conductive material in a dielectric matrix. Wire bond 47 and 52 connect LED contacts 56 and 55 to interconnect 49 and 54 respectively. Gold wire is preferred but the wire bond can be silver, silver coated gold, and aluminum in wire, foil, and tape form. The thermal schematic illustrates the flow of heat through the device to ambient. Transparent/translucent overcoat 48 may also contain luminescent materials. As an example, transparent/translucent overcoat 48 may consist of inorganic/organic matrix material such as but not limited to HT 1500 Polysilazane (Clariant Inc.) containing at least one luminescent materials such as, but not limited to, Eljen EJ-284 fluorescent dye for conversion of green and yellow emission into red. Luminescent coatings can be applied via dip coating, spraying, inkjet, and other deposition techniques to form transparent/translucent overcoat 48 on a light emitting device containing at least one thermally conductive luminescent element 46.

Figure 3A:
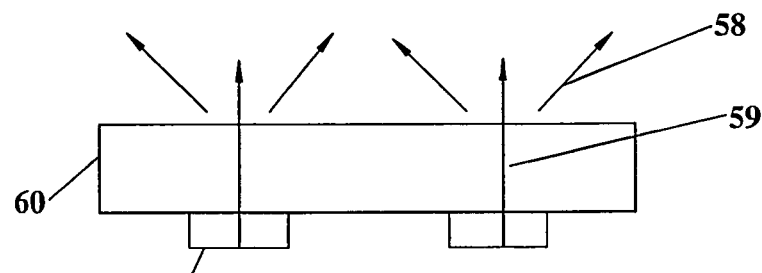
FIGS. 3A, 3B and 3C depict side views of a self-cooling solid state light source with multiple die of the present invention.

FIG. 3A depicts a self cooling light source consisting of a single thermally conductive luminescent element 60 attached both thermally and optically onto at least one LED 61. LED 61 may consist of InGaN, GaN, AlGaN, AlInGaP, ZnO, AlN, and diamond based light emitting diodes. Both blue and red light emitting diodes such as, but not limited to, InGaN and AlInGaP LEDs are attached optically and thermally to at least one thermally conductive luminescent element 60. Heat 59 and emission 58 generated by the LED 61 and the thermally conductive luminescent element 60 are spread out over a substantially larger area and volume than the LED 61. In this manner the heat generated can be effectively transferred to the surrounding ambient.

Ce:YAG in single crystal, polycrystalline, ceramic, and flame sprayed forms are preferred materials choices for thermally conductive luminescent element 60. Various alloys and dopants may also be used consisting of but not limited to gadolinium, gallium, and terbium. The thermally conductive luminescent element 60 can be single crystal cerium doped YAG grown via EFG with a cerium dopant concentration between 0.02% and 2%, preferably between 0.02% and 0.2% with a thickness greater than 500 microns. Alternatively, the thermally conductive luminescent element 60 can be flame sprayed Ce:YAG with an optional post annealing. The thermally conductive luminescent element 60 can be formed by flame spraying, HVOF, plasma spraying under a controlled atmosphere directly onto the LED 61. This approach maximizes both thermal and optical coupling between the thermally conductive luminescent element and LED 61 by directly bonding to LED 61 rather than using an intermediary material to bond the LED 61 to thermally conductive luminescent element 60. Alternately, the thermally conductive luminescent element 60 maybe formed using at least one of the following methods; hot pressing, vacuum sintering, atmospheric sintering, spark plasma sintering, flame spraying, plasma spraying, hot isostatic pressing, cold isostatic pressing, forge sintering, laser fusion, plasma fusion, and other melt based processes. Thermally conductive luminescent element 60 may be single crystal, polycrystalline, amorphous, ceramic, or a melted composite of inorganics. As an example, 100 grams of alumina and Ce doped Yag powder, which have been mixed together, are placed into a container. The powders are melted together using a 2 Kw fiber laser to form a molten ball within the volume of the powder. In this manner the powder acts as the crucible for the molten ball eliminating any contamination from the container walls. The use of the fiber laser allows for formation of the melt in approximately 4 seconds depending on the beam size. While still in a molten state the ball may optionally be forged between SiC platens into a plate. Most preferably the molten ball is greater than 10 mm in diameter to allow sufficient working time as a molten material for secondary processing The plate may be further processed using vacuum sintering, atmospheric sintering, or hot isostatic pressing to form a translucent thermally conductive luminescent element 60. The use of fiber laser based melt processing is a preferred method for the formation of luminescent oxides, nitrides, and oxynitrides as a method of reducing energy costs compared to hot pressing or vacuum sintering. The use of controlled atmospheres including vacuum, oxygen, hydrogen, argon, nitrogen, and ammonia during the laser based melting processes is disclosed. While fiber lasers are preferred the use of localized actinic radiation to form a molten mass within a powder mass to form thermally conductive luminescent element 60 is disclosed.

Figure 3B:
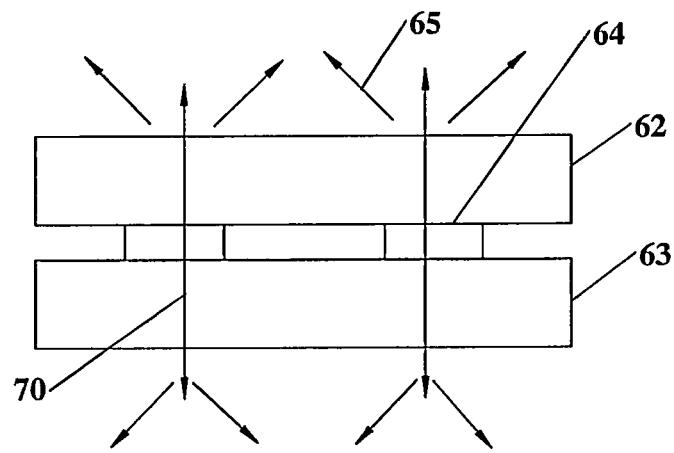

FIG. 3B depicts a self cooling light source consisting of at least two thermally conductive luminescent elements 62 and 63 attached to at least one LED 64. In this case, both thermal emission 64 and optical emission 65 can be spread out and extracted from both sides of LED 64. In all cases, multiple LEDs allow for parallel, series, anti-parallel, and combinations of all three with the appropriate electrical interconnect. In this case, optical emission 65 can be substantially similar or different on the two sides of the devices. As an example, thermally conductive luminescent element 62 can be 1 mm thick single crystal Ce doped YAG formed via EFG bottle, which is then sliced into 19 mm.times.6 mm wafers. The sliced surface enhances extraction of the Ce:YAG emission out of the high index of refraction Ce:YAG material. Alternately, thermally conductive luminescent element 63 may be a pressed and sintered translucent polycrystalline alumina with a thermally fused layer of Mn doped Strontium Thiogallate and a layer of Eu doped Strontium Calcium Sulfide within a glass frit matrix. In this manner, a wide range of optical emission spectrums can be created.

In this particular case, the two sides of the devices will emit slightly different spectrums. In general, unless an opaque reflector is placed between thermally conductive luminescent elements 62 and 63 there will be significant spectral mixing within this device. This configuration can be used for quarter lights, wall washers, chandeliers, and other light fixtures in which a substantial portion of the optical emission 65 is required to occur in two separate directions. Directional elements such as BEF, microoptics, subwavelength elements, and photonic structures impart more or less directionality to the optical emission 65 of either thermal conductive luminescent elements 62 and/or 63.

In another example, Cerium doped YAG is formed via flame, HVOF, or plasma spraying and then optionally annealed, spark plasma sintered, microwave sintering, or HIP to improve its luminescent properties for one or both thermally conductive luminescent element 62 and/or 63. At least one InGaN LED and at least one AlInGaP LEDs are used for at least one LED 64.

In yet another example, high purity aluminum oxide is flame sprayed directly onto at least one LED die 64 for thermally conductive luminescent element 62 forming a translucent reflector. The emissivity of flame sprayed aluminum oxide is typically 0.8 allowing for enhanced radiative cooling from that surface. Thermally conductive luminescent element

63 is single crystal Ce:YAG formed via skull melting and sliced into 0.7 mm thick wafers 0.5 inch.times.1 inch in area with a cerium doping concentration between 0.1% and 2%. In this case thermally conductive luminescent element 62 does not necessarily contain a luminescent material but acts as diffuse reflector and thermal spreading element for the heat generated by both LED 64 and thermally conductive luminescent element 62. By embedding LED 64 directly into thermally conductive luminescent element 62 it is possible to eliminate pick and place, die attachment processes and materials, and maximize both thermal transfer 64 and optical emission 65 by eliminating unnecessary interfaces. Additional luminescent materials and opaque reflectors can be positioned within or coating onto either thermally conductive luminescent elements 62 or 63. Pockets or embedded die can recess the die such that printing techniques including but not limited to inkjet, silkscreen printing, syringe dispensing, and lithographic means.

Figure 3C:
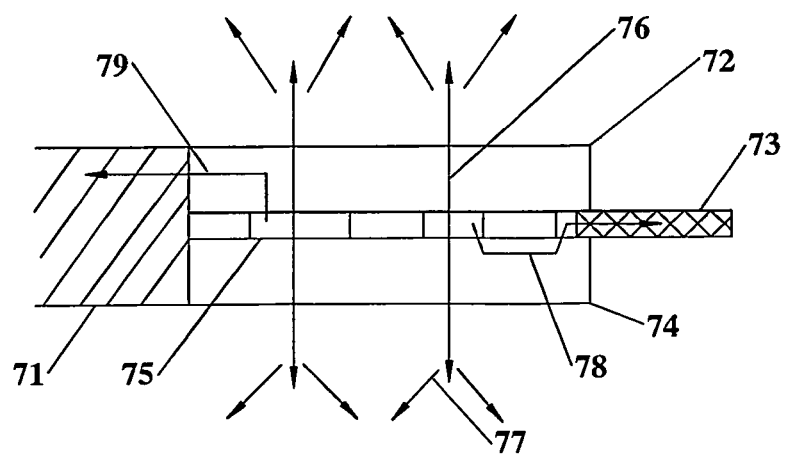

FIG. 3C depicts two thermally conductive luminescent elements 72 and 74 providing thermal conduction paths 74 and 79 to additional cooling means 71 and 73. In this case, thermally conductive luminescent elements 72 and 74 allow for thermal emission 76 and optical emission 77 and also provide for thermal conduction paths 74 and 79. Additional cooling means 71 and 73 may also provide for electrical connection to LED 75 via interconnect means previously disclosed in FIG. 2. One or more additional cooling means 71 and 73 further enhance the amount of heat that can be dissipated by the device. As an example, a typical natural convection coefficient is 20 W/m2/K and Ce:YAG has an emissivity of 0.8 near room temperature. A self cooling light source consisting of two ¼ inch.times.½ inch.times.1 mm thick pieces of Ce:YAG 72 and 74 with four direct attach LEDs 75 soldered on silver thick film interconnect traces has a surface area of approximately 2.3 cm2. Using natural convection and radiative cooling approximately 500 milliwatts of heat can be dissipated off the surface of the self cooling light source if the surface temperature is approximately 100° C. and the ambient is 25° C. and the emissivity is 0.8. Of the 500 milliwatts, 350 milliwatts of heat is dissipated via natural convection cooling and 150 milliwatts are dissipated via radiation. A typical 4000☐K spectrum output has an optical efficiency of 300 lumens per optical watt. If the solid state light source has an electrical to optical conversion efficiency of 50%, 500 milliwatts of optical output is generated for every 500 milliwatts of heat generated. Under these conditions a ¼ inch.times.½ inch solid state light source operating with a surface temperature of approximately 100° C. can output 150 lumens without the need for additional heat sinking means. The use of additional cooling means 71 and 73 can be used to significantly increase this output level by increase the surface area that heat can be convectively and radiatively transferred to the ambient. As is easily seen in the example, increasing the surface area is directly proportional to amount of heat that can be dissipated. It is also clear that the electrical to optical conversion efficiency dramatically affects the amount of heat generated, which is a key attribute of this invention. Unlike conventional LED packages light generated within this self cooling solid state light source is extracted out of both sides of the device. Isotropic extraction as shown has a 20% theoretical higher efficiency than lambertian extraction. Also using this approach, the temperature difference between the LED 75 junction and the surfaces of thermally conductive luminescent elements 72 and 74 can be very low if the thermal conductivity is greater than 10 W/mK and the LEDs 75 are attached such that there is low thermal resistance to the surrounding thermally conductive luminescent elements 72 and 74. In addition, cooling means 71 and 73 may be physically different to allow for the device to connect to different external power sources correctly. As an example, cooling mean 71 may be a pin and cooling means 73 maybe a socket such that a keyed electrical interconnect is formed. Alternately, cooling means 71 and 73 may contain magnets, which allow for attachment of external power sources. Even more preferably the magnets have different polarity such that a keyed interconnect can be formed. Additional cooling means 71 and 73 may include, but are not limited to, heat pipes, metals, glass, ceramics, boron nitride fibers, carbon fibers, pyrolytic graphite films, and thermally conductive composites. As an example, boron nitride nanotube fibers, as provided by BNNT Inc., are pressed with exfoliated boron nitride flakes to form and thermally interconnected skeleton matrix using pressing, cold isostatic pressing, warm isostatic pressing, and/or hot isostatic pressing to form a solid sheet. The boron nitride nanotube fibers interconnect the boron nitride flakes and bond to the surface of the boron nitride flakes such that a continuous thermal matrix is formed. The resultant skeleton matrix may then be infused with polymeric or polymeric ceramic precursors including but not limited to polysilazane, polysiloxane, glasses, silicones, and other polymeric materials to form a composite. Alternatively, the boron nitride nanotube fibers may be foamed into a yarn and woven into a cloth or felt and then infused with to form a thermally conductive composite. Alternately, high thermal conductivity carbon fibers and films may be used but boron nitride is preferred due to its low optical absorption compared to carbon based approaches. Alternately, carbon based additional cooling means 71 and 73 may include a reflective layer to reduced absorption losses and redirect light from the source as well as provide additional cooling. Additional cooling means 71 and 73 may also diffuse, reflect, or absorb optical emission 77 emitting between or from the adjacent edge of thermally conductive luminescent element 72 or 74. In this manner the far field emission of the device can be adjusted both from an intensity and spectral standpoint. Doubling the surface cooling area using additional cooling means 71 and 73 approximately doubles the lumen output as long as the thermal resistance of the additional cooling means 71 and 73 is low.

Figure 4A:
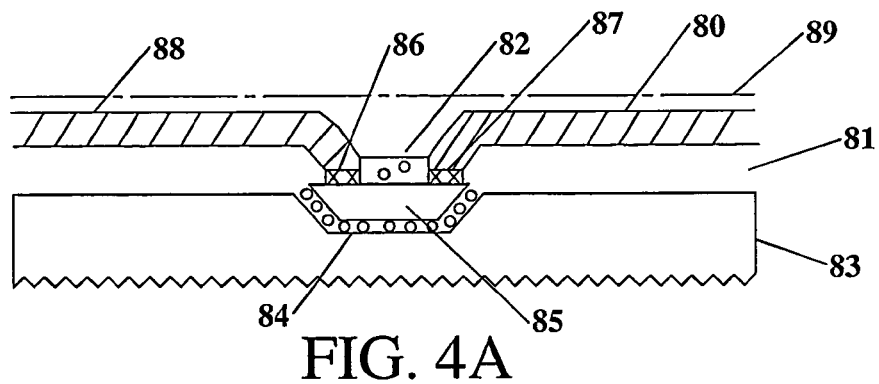
FIGS. 4A, 4B and 4C depict side views of printed electrical interconnects on luminescent thermally conductive elements for various LED die types of the present invention.

FIG. 4A depicts at least one LED 85 embedded within thermally conductive luminescent element 83. Thermally conductive luminescent element 83 may be formed via press sintering of aluminum oxide as known in the art to form a translucent polycrystalline alumina TPA with depressions sufficiently deep enough to allow for LED 85 to be recessed. Luminescent coating 84 may be substantially only in the pocket formed in thermally conductive luminescent element 83 or may cover substantially all the surfaces of thermally conductive luminescent element 83.

Alternately, single crystal, polycrystalline or amorphous phosphor, pieces, plates, rods and particles can be fused or bonded into or onto thermally conductive luminescent element 83. In this manner, the quantity of luminescent material can be minimized while maintaining high thermal conductivity for the thermally conductive luminescent element 81.

As an example, single crystal Ce:YAG pieces 1 mm×1 mm and 300 microns thick can be fusion bonded into 1.1 mm×1.1 mm×500 micron deep pockets formed into TPA press sintered plates and then fired at 1700° C. in a vacuum for 10 hours such that the single crystal YAG pieces are optical and thermally fused into the bottom of the TPA pockets. LED 85 can then be bonded into the remaining depth of pocket and be used to excite the single crystal Ce:YAG pieces locally. The combined optical emission from LED 85 and the single crystal Ce:YAG pieces would be spread out and extracted by the sinter pressed TPA while still maintaining high thermal conductivity.

Alternately, luminescent powders in glass frits, polysiloxane, polysilazane, and other transparent binders can food luminescent coating 84. In particular, high temperature binders in luminescent coating 84 such as polysilazane with luminescent powders, flakes, rods, fibers and in combination both pre-cured and as a bonding agent can be positioned between thermally conductive luminescent element 83 and at least one LED 85.

Materials with high visible spectrum transmission, lower refractive index, high thermal conductivity, and low processing costs for net and final shape are preferred materials for thermally conductive luminescent element 83. These materials include, but are not limited to, TPA, Spinel, Quartz, Glass, ZnS, ZnSe, ZnO, MgO, AlON, ALN, BN, Diamond, and Cubic Zirconia. In particular, Spinel and TPA formed via press sintering are low cost of manufacture of net shape parts. The use of techniques used to form TPA parts as seen in transparent dental braces as known in the art with luminescent elements either as coatings or bonded elements can create thermally conductive luminescent element 83.

With LED 85 recessed into thermally conductive luminescent element 83, printing and lithographic methods can be used to electrically interconnect at least one LED 83 to outside power sources and/or other LEDs or devices. Unlike wirebonding, this approach creates a low profile method of interconnecting LEDs, which eases assembly of multiple sticks and reduces costs.

In one example, LED 85 is bonded into a pocket formed via laser ablation in a 1 mm thick wafer of Spinel to form thermally conductive luminescent element 83. In this example the Spinel may or may not include luminescent elements or properties. The majority of the wavelength conversion instead occurs locally around LED 85 via luminescent coating 84 and/or additional luminescent coating 82. This minimizes the amount of luminescent material necessary yet still allows for a low thermal resistance to ambient for the luminescent materials. While only a single side is shown in FIG. 4, the light source may also be bonded to another light source, heat sink, another transparent/translucent thermally conductive element to further enhance cooling and optical distribution from LED 85 and any luminescent elements within the light source. LED 85 is bonded into the pocket using polysilazane containing 0.1% to 2% doped Ce:YAG powder with a particle size below 10 microns.

Transparent/translucent dielectric layer 81 is inkjet printed over at least one LED 85 except contact pads 87 and 86. In the case where LED 85 uses TCO based contacts, at least a portion of the TCO is not covered by transparent/translucent dielectric 81 to allow for electrical contact. Optionally an additional luminescent coating 82 may be printed or formed on at least one LED 85 to allow for additional wavelength conversion and to create a more uniform spectral distribution from the device. Interconnects 80 and 88 may then be applied either before or after curing of transparent/translucent dielectric 81. Polysilazane, polysiloxane, glass frit, spin-on glasses, and organic coatings are examples of transparent/translucent dielectric 81, preferably the coatings can maintain transparency above 300° C. Formulations containing Polysilazane with and without luminescent elements are preferred materials for additional luminescent coating 82, transparent/translucent dielectric 82 and luminescent coating 84. Preferred luminescent elements are powder phosphors, quantum dots, fluorescent dyes (example wavelength shifting dyes from Eljen Technologies) and luminescent flakes and fibers.

Electrical connection to LED 85 is via interconnects 80 and 88 for lateral LED designs. Precision inkjet printing of silver conductive inks and/or screen printing of thick film silver inks form interconnects 80 and 88. As an example thick film silver paste is screen printed and fired onto thermally conductive luminescent element 83 up to the pocket for LED 85. Transparent/translucent dielectric 81 is inkjet printed such that only contacts 87 and 86 are left exposed and the transparent/translucent dielectric 81 covers the rest of the exposed surface of LED 85 and at least a portion of thermally conductive luminescent element 83 in a manner to prevent shorting out LED 85 but still allowing access to the thick film silver paste conductors applied earlier. After or before curing of transparent/translucent dielectric 81 and optionally additional luminescent coating 82, conductive ink is inkjet printed connecting the thick film silver conductor applied previously to the contacts 86 and 87. Using this approach, alignment issues can be overcome due to the availability of inkjet systems with image recognition and alignment features while still allowing for low resistance conductors. In general, while inkjet printing of conductors can be very accurate and be printed with line widths under 50 microns, the thickness is typically limited to under 10 microns which limits the current carry capacity of long lines. Using this approach, thick film silver conductors which can be over 50 microns thick can be used to carry the majority of the current and then short inkjet printed traces can be used to stitch connect between the thick film silver conductors and contacts 87 and 86. Using this approach, gold wire bonding can be eliminated.

A transparent/translucent overcoat 89 may be applied over at least a portion of interconnects 80 and 89 and/or transparent/translucent dielectric 81, additional luminescent coating 82, and thermally conductive luminescent element 83 to environmentally and/or electrically isolate the device. Protective barrier layers on LED die 85 can be formed during LED fabrication to facilitate or even eliminate the need for transparent/translucent dielectric layer 81 and allow for direct printing of interconnect 89 and 88 onto contacts 87 and 86 respectively. Catalytic inks and/or immersion plating techniques allow for the formation of thicker/lower resistivity traces for interconnect 89 and 88, eliminate the need for thick film printing and allow for the use of inkjet printing for the entire interconnect. Preferred materials for transparent/translucent overcoat 89 include but are not limited to polysilazane, polysiloxane, spin-on glasses, organics, glass frits, and flame, plasma, HVOF coatings. Planarization techniques based on spin-on glasses and/or CMP can be used for transparent/translucent overcoat 89. Luminescent elements including but not limited to powders, flakes, fibers, and quantum dots can be incorporated in transparent/translucent overcoat 89, transparent/translucent dielectric 81, and additional luminescent coating 82. Luminescent elements may be spatially or uniformly dispersed in these layers.

Figure 4B:
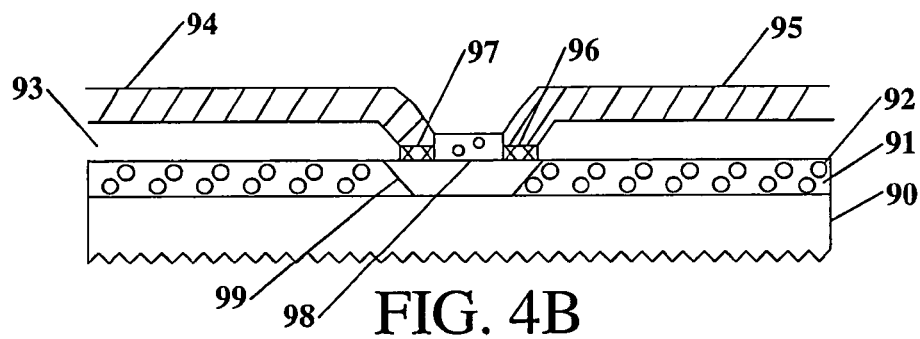

FIG. 4B depicts a light source in which a luminescent layer 91 is formed on a transparent/translucent element 90 containing extraction elements. Transparent/translucent element 90 can be, but is not limited to, single crystalline materials such as sapphire, cubic zirconia, YAG (doped and undoped), ZnO, TAG (doped and undoped), quartz, GGG (doped and undoped), GaN (doped and undoped), AlN, oxynitrides (doped and undoped), orthosilicates (doped and undoped), ZnS (doped and undoped), ZnSe (doped and undoped), and YAGG (doped and undoped), polycrystalline materials, and amorphous materials such as glass, ceramic YAG (doped and undoped), ALON, Spinel, and TPA. In general, single crystal materials grown via verneuil, EFG, HEM, Czochralski, CVD, hydrothermal, skull, and epitaxial means can be the transparent/translucent element 90.

Luminescent layer 91 may be formed directly one transparent/translucent element 90 or be formed separately and then bonded to transparent/translucent element 90. Flame spraying, plasma spraying, and HVOF techniques can form either or both luminescent layer 91 and transparent/translucent element 90. The light source can have a transparent/translucent element 90 with an alpha less than 10 cm$^{-1}$ throughout the visible spectrum and a luminescent layer 91 containing at least one luminescent element emitting between 400 nm and 1200 nm. The luminescent layer 91 can exhibit a refractive index, which is not more than 0.2 different than transparent/translucent element 90. LED 99 may be InGaN, AlInGaP, ZnO, BN, Diamond, or combinations of InGaN, AlInGaP, ZnO, BN, or diamond. Both InGaN and AlInGaP LEDs can be used for LED 99 combined with a transparent/translucent element 90 consisting of at least one of the following materials; sapphire, Spinel, quartz, cubic zirconia, ALON, YAG, GGG, TPA, or ZnO and luminescent layer 91 and/or additional luminescent layer 98 containing Ce doped YAG. An additional red phosphor emitting between 585 and 680 nm can be used within luminescent layer 91 and/or additional luminescent layer 98. These elements form a self cooling light source, which emits an average, color temperature between 6500° K and 1200° K that lies substantially on the black body curve is a preferred embodiment of this invention. The self cooling light source can emit an average color temperature between 4000° K and 2000° K than lies substantially on the blackbody curve.

Multiple self cooling light sources can be used within a fixture, reflector, optic or luminaire such that color and intensity variations are averaged out in the far field. Three or more self cooling light sources within a fixture, reflector, optic or luminaire creates a uniform illumination at a distance greater than 6 inches from the sources. Transparent/translucent dielectric layer 93 may be inkjet printed, silk screen printed, formed via lithographic means and exhibits an alpha less than 10 cm$^{-1}$ throughout the visible spectrum. Interconnect 95 and 94 may be printed using inkjet, silkscreen, template, or lithographic means. Catalytic inks and immersion plating techniques increase conductor thickness and thereby reduce resistivity. Silver traces with a trace width less than 500 microns and a reflectivity greater than 50% for interconnect 95 and 94 reduce absorption of the light generated within the light source. Contacts 96 and 97 on LED 99 may be on one side only as in lateral devices or consist of one top contact and one side contact as previously disclosed in US Patent Application 20060284190, which is commonly assigned and incorporated by reference into this invention.

Figure 4C:
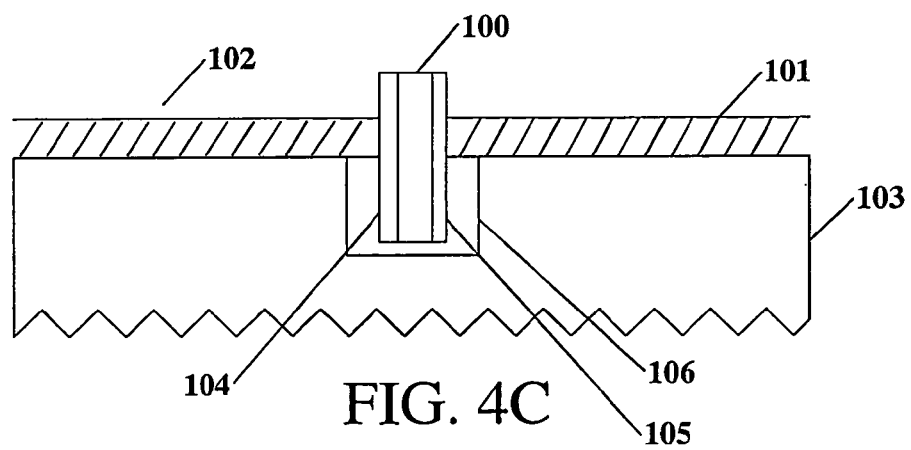

FIG. 4C depicts a self-cooling light source with at least one vertical LED 100 mounted to or at least partially embedded in thermally conductive luminescent element 103. Composite, layer, single crystal, polycrystalline, amorphous, and combinations as described previously can be used for the thermally conductive luminescent element 103. In this particular example, one vertical LED 100 is mounted such that interconnect 101 and 102 may be printed via inkjet, silk screening, or lithographic means directly on thermally conductive luminescent element 103 and in contact with a side of vertical LED 100. This embodiment eliminates the need for an additional dielectric and allows for the use of vertical LED devices, which inherently exhibit lower Vf than lateral devices. A substrate free LED as described in US Published Patent Application No. 20090140279 (which is commonly assigned and incorporated by reference into this invention) is a preferred embodiment for LED 100. Direct die attach and flip chip mounting configurations may also be used for LED 100. For the substrate free case, InGaN and/or AlInGaP vertical LED 100 has TCO contacts 104 and 105 for LED 100 wherein the interconnects 101 and 102 are thick film silver inks which form ohmic contact to the adjacent TCO contact 104 and 105. In this manner, absorption losses are minimized and the need for lithographic steps to fabricate LED 100 is eliminated or minimized. A self cooling light source contains at least one vertical LED 100 with TCO contacts 104 and 105 connected via thick film silver traces for interconnect 101 and 102 directly bonded to TCO contacts 104 and 105 on a thermally conductive luminescent element 103. Optionally, bonding layer 106 may be used to mount, improve extraction, incorporate additional luminescent materials or position LED 100 onto or within thermally conductive luminescent element 103.

FIG. 5 depicts various shapes of thermally conductive luminescent elements. FIG. 5A depicts a substantially flat luminescent element 107. Thickness is a function of dopant concentration but typically the thickness ranges from 200 micron to 2 mm for a uniformly doped Ce doped YAG with a Cerium doping concentration between 0.02% and 10%. In order for efficient thermal spreading to occur, the thermal conductivity of the thermally conductive luminescent element 107 needs to be greater than 1 W/mK to adequately handle average power densities greater than 0.1 W/cm2 of surface area on luminescent element 107. If the thermal conductivity is to low there is insufficient thermal spreading of the heat generated within the device which decreases the ability of the flat luminescent element 107 to cool itself via natural convection and radiative means.

Figure 5A:
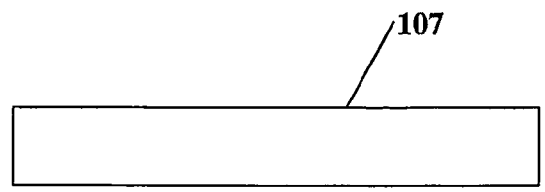
FIGS. 5A, 5B, 5C and 5D depict side views of various shapes of wavelength conversion elements of the present invention.
Figure 5B:
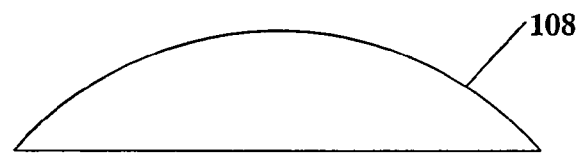

FIG. 5B depicts a non-flat (hemispheric) luminescent element 108. In this case, light extraction can be enhanced for those rays, which are waveguiding within the higher refractive index of non-flat luminescent element 108. In addition, far field intensity and wavelength distributions can be modified. Multiple smaller self cooling light sources with the same or different shaped thermally conductive luminescent elements create uniform or specific far field intensity and wavelength distributions. The extraction of light generated within a medium with a refractive index greater than air is restricted by total internal reflection per Snell's Law. Shaped luminescent elements 108 can be used to reduce the average optical path length of optical rays required to escape the luminescent element 108. Since absorption losses are directly proportional to the optical path length for a given absorption coefficient (alpha), reducing the average optical path length directly translates into reduced absorption losses. The spatial location of where the optical rays are generated within luminescent element 108, the refractive index of luminescent element 108, absorption coefficient (alpha) of luminescent element 108, bulk and surface scattering within and on luminescent element 108, and the geometry of luminescent element 108 can all be modeled as known in the art to optimize the extraction efficiency.

Figure 5C:
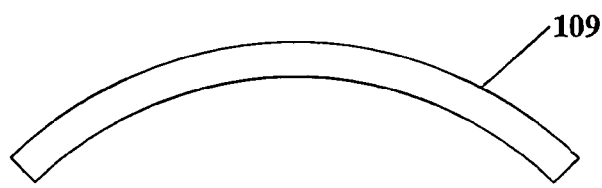

FIG. 5C depicts a non-flat (curved) thermally conductive luminescent element 109 with a substantially uniform thickness. In this manner, extraction can be enhanced by maintaining a uniform thickness of luminescent material. Extrusion, pressing, molding, sawing, boring, and flame spraying techniques as known in the art may be used to fabricate various shapes of thermally conductive luminescent elements.

Figure 5D:
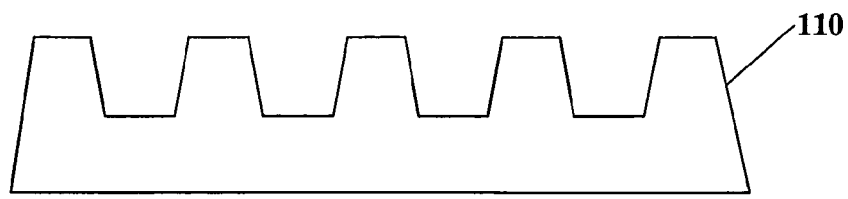

FIG. 5D depicts a non-flat (rectangular saw tooth) thermally conductive luminescent element 110 with additional surface elements to enhance convection cooling and optionally to modify or homogenize the emission output of the self-cooling light source. Extrusion, pressing, and molding techniques may be used to form thermally conductive luminescent element 110.

Figure 6A:
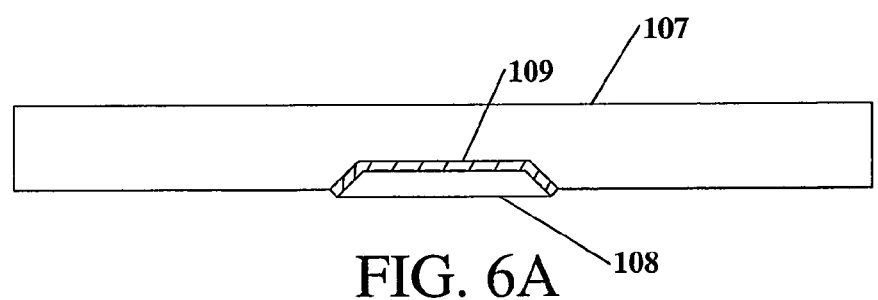
FIGS. 6A and 6B depict a side view of two different mountings for LEDs on wavelength conversion elements of the present invention.

FIG. 6A depicts a partially embedded LED 108 within a depression in thermally conductive luminescent element 107 mounted via bonding layer 109. The formation of the depression may be by laser machining, electron beam machining, etching (both chemical and mechanical), plasma etching, molding, and machining means. Substrate-free LEDs may be used for partially embedded LED 108 with a thickness less than 300 microns. By embedding partially embedded LED 108 in thermally conductive wavelength conversion element 107, the thermal resistance between the two elements can be reduced which lowers the junction temperature of the LED for a given drive level. Optionally, more of the emission from partially embedded LED into thermally conductive luminescent element 107 can be coupled thereby changing the color temperature of the self cooling light source.

Figure 6B:
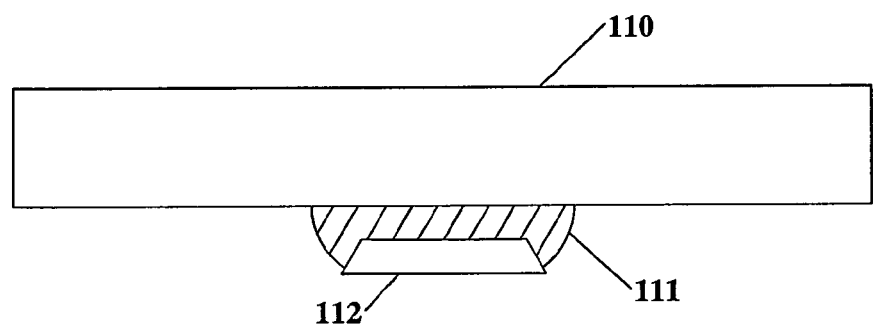

FIG. 6B depicts at least one LED 112 bonded onto thermally conductive luminescent element 110 via bonding layer 111. In this case, bonding layer 111 should exhibit a thermal conductivity greater than 1 W/mK and an alpha less than 10 $cm^{-1}$ for the emission wavelengths of LED 112.

Figure 7A:
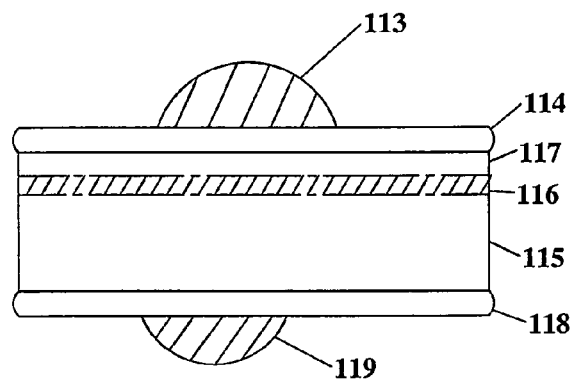
FIGS. 7A, 7B and 7C depict side views of printed interconnects on LED die of the present invention.

FIG. 7 depicts various printed contacts for TCO contact based LEDs. FIG. 7A depicts a vertical LED consisting of a top silver paste contact 113 on TCO layer 114 on p layer 117. Active region 116 is between p layer 117 and n layer 115 with n layer 115 covered with TCO contact 118 and bottom silver paste contact 119. A substrate free LED allows dual sided growth of TCO contact layers 114 and 118 on substrate free LED structures consisting of p layer 117, active layer 116 and n layer 115. Thick film high temperature silver paste contacts 113 and 119 can be printed on LEDs with TCO contacts 114 and 118 and fired at temperatures greater than 200° C. in various atmospheres to form a low optical absorption, low Vf, and substantially lithography free LED devices.

Figure 7B:
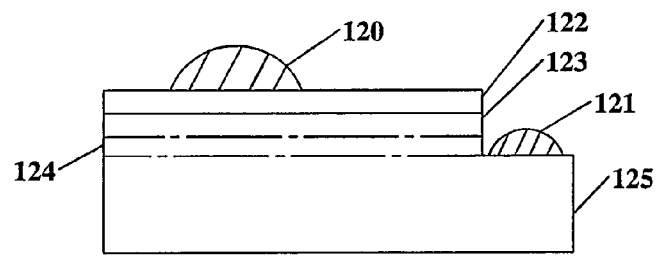

FIG. 7B depicts a lateral device with printed/inkjet printed contacts 120 and 125. In all cases, ohmic contact to the n layer may include or not include an intermediary TCO layer to form reasonable ohmic contact. In FIG. 7B, TCO 122 is grown on p layer 123. Active layer 124 is between p layer 123 and n layer 125. TCO 122 is doped ZnO grown via CVD with a resistivity less than 0.003 ohm-cm and greater than 1000 Angstroms thick. Printed etch masks allow for etch of the step down to n layer 125. As an example, an AlInGaP LED epi may be grown on GaAs. The wafer can be etched and patterned to form the lateral device having TCO 122 on the p layer 123. Printed contacts 120 and 125 are formed on TCO 122 and n layer 125. Optionally an additional TCO layer maybe formed of n layer 125 to further reduce Vf. The addition of a eutectic solder layer to printed contact 120 and 125 to create a direct die attach die is also disclosed. In a preferred embodiment, the AlInGaP epi is removed via chemical etching using a sacrificial etching layer between the AlInGaP and GaAs substrate as known in the art. The resulting direct attach die may be additionally wafer bonded to GaN substrates as disclosed in U.S. Pat. Nos. 7,592,637, 7,727,790, 8,017,415, 8,158,983, and 8,163,582, and US Published Patent Applications Nos. 20090140279 and 20100038656, which all are commonly assigned and incorporated by reference into this invention.

Figure 7C:
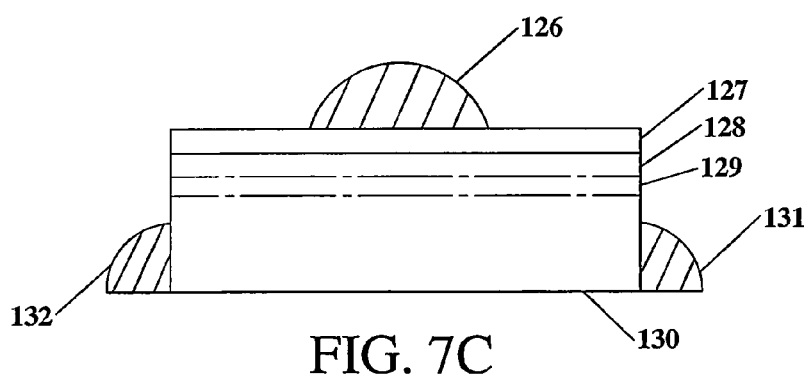

FIG. 7C depicts a printed contact with a top contact 126 and side contacts 132 and 130. Again TCO 127 forms a low ohmic transparent ohmic contact to p layer 128 and the active region 129 is between p layer 128 and n layer 130. Side contacts 131 and 132 contact the side walls of n layer 130. N layer 130 is greater than 10 microns of thickness. Even more preferably, the thickness of n layer 130 is greater than 50 microns but less than 250 microns.

FIG. 8 depicts various methods of changing the far field distribution of single self cooling source. In FIG. 8A, the refractive indices, geometry, and spacing of the LEDs 136, the wavelength conversion elements 133 and 135, and the bonding material 137 will determine the far field distribution of the source. The far field distribution is determined by where the optical rays exit, how much of the optical rays, the direction of the optical rays and the spectrum of optical rays that exit a particular spatial point on the single self cooling source. FIG. 8 illustrates various reflectors, scattering elements, and diffusers, which modify where, how much, which way and the spectrum of the light rays emitted from the source. One or more wavelength conversion elements for mounting LEDs 136 can be used although two wavelength conversion elements 133 and 135 are depicted. Multiple LEDs 136 can be mounted on one or more surface of the one wavelength conversion element 133. Based on these parameters, radiation will be emitted from the structure or light guided within the source. Additionally, edge element 134 may also modify the far field distribution out of the device. Edge element 134 and bonding materials 137 may be translucent, transparent, opaque, and/or luminescent. Luminescent powders within a transparent matrix for edge element 134 and bonding materials 137 can modify the emission spectrum as well as the far field intensity distribution.

Figure 8A:
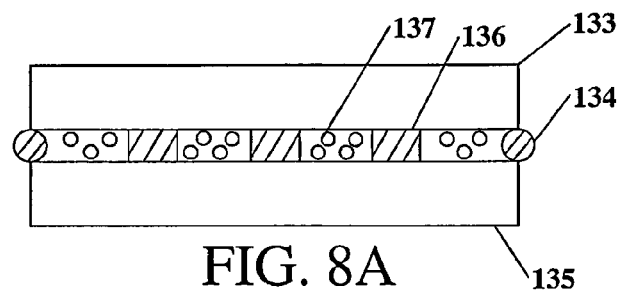
FIGS. 8A, 8B, 8C and 8D depict side views of various environmental seals for self cooling light sources of the present invention.
Figure 8B:
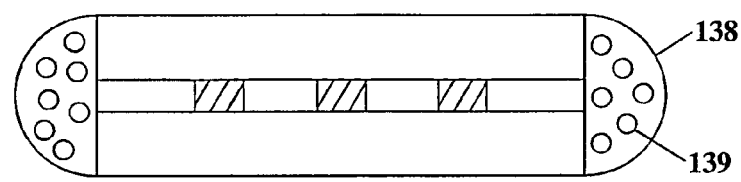

FIG. 8B depicts a self cooling light source where the entire end of the self cooling light source is substantially covered with a scattering element 139 within a matrix 138. Additionally, scattering element 139 and matrix 138 may extend to encompass not only edges of the self cooling light source but also substantial portions of the other surfaces of the self cooling light source. In this manner, light emitted from all the surface of the self cooling light source can be redirected to modify the far field intensity distribution. Luminescent materials for scattering element 139 are excited by at least a portion of the spectrum emitted by the self cooling light source.

Figure 8C:
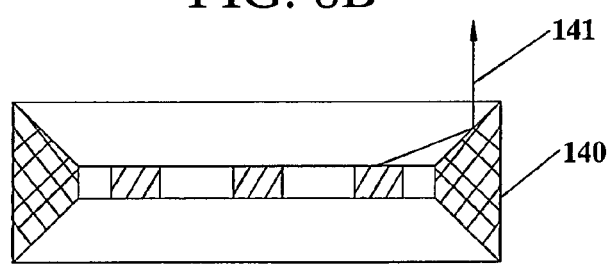

FIG. 8C depicts edge turning element 140 consisting of metal, diffuse scatterer, dielectric mirror, and/or translucent material whereby at least a portion of the light generated within the LED or wavelength conversion elements are redirected as depicted in ray 141.

Figure 8D:
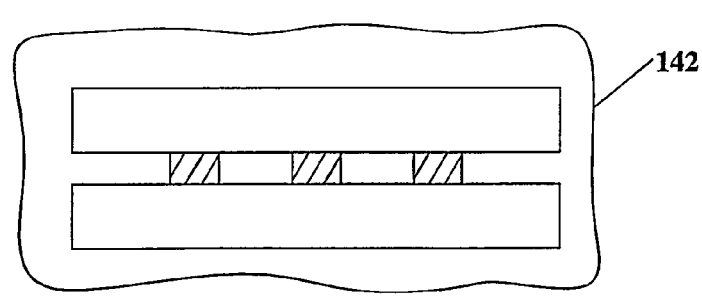

FIG. 8D depicts an outer coating 142 which may be translucent, partially opaque, polarized, and/or luminescent. The far field intensity, polarization, and wavelength distribution can be modified both in the near field and far field and spatial information can be imparted onto the self cooling light source. As an example, a self cooling light source with a shape similar to a candle flame may have a spectrally variable outer coating 142 such that red wavelengths are emitted more readily near the tip of the candle flame and blue wavelengths are emitted more readily near the base of the candle flame. In this fashion, the spatially spectral characteristics of a candle flame could be more closely matched. Using this technique a wide range of decorative light sources can be formed without the need for additional optical elements.

In another example, outer coating 142 may consist of a reflective coating such as aluminum into which openings are etched or mechanically formed. More specifically, sunlight readable indicator lights can be formed using this technique as warning, emergency, or cautionary indicators. The use of circular polarizers within outer coating 142 can enhance sunlight readability. Alternately, outer coating 142 could be patterned to depict a pedestrian crossing symbol that could be either direct viewed or viewed through an external optic thereby creating a ultra compact warning sign for crosswalks and other traffic related applications. In another example, outer coating 142 may consist of spectrally selective emissivity coating such that the emissivity of the self cooling light source is enhanced for wavelengths longer than 700 nm. By enhancing the infrared and far infrared emissivity of the self cooling light source more efficient light sources can be realized. As stated in the previous example of FIG. 3 the radiation cooling represents a significant percentage of the cooling in self cooling light sources. It is preferred that high emissivity coatings be used for outer coating 142 to maximize cooling from the surface of the self cooling light source. Most preferred is an outer coating 142 with an emissivity greater than 0.5. Depending on the maximum surface temperature the radiative cooling can represent between 20% and 50% of the heat dissipation of the source.

Figure 9A:
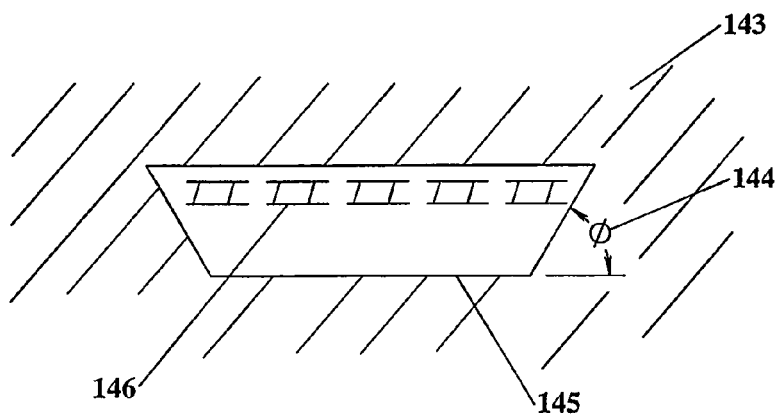
FIGS. 9A and 9B depict side views of die shaping for enhanced dual sided extraction of the present invention.

FIG. 9A depicts the use of die shaping of optical devices within a media 143. As an example, LED 145 contains an active region 146 embedded within media 143. Using ray tracing techniques known in the art, there is an optimum angle 144 to maximize the amount of radiation transferred into media 143. Typically, semiconductor materials exhibit high refractive index, which tends to lead to light trapping within the LED 145. In FIG. 9A the optimum angle 144 subtends the active region 146 as shown in the figure.

Figure 9B:
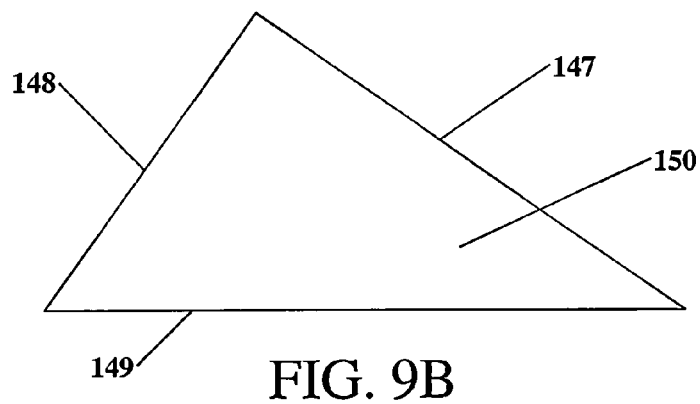

Alternately, FIG. 9B depicts that surfaces 149, 148 and 147 may be non-orthogonal forming a non square or rectangular die. In both these cases, light trapped within the LED 150 can more efficiently escape the die. The use of both forms of die shaping together is preferred. The use of non-rectangular shapes for LED 150 embedded within a wavelength conversion element to enhance extraction efficiency is a preferred embodiment of this invention.

Figure 10A:
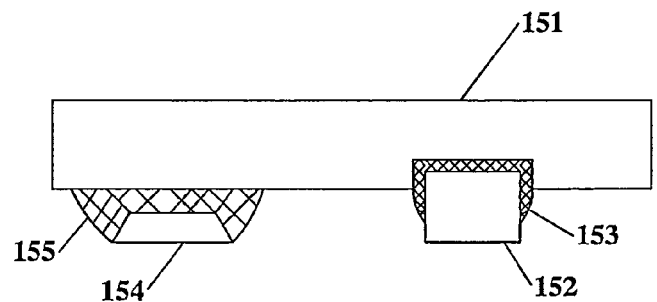
FIGS. 10A and 10B depict a side view and a graph of blue and red die in wavelength conversion elements of the present invention.

FIG. 10A depicts different mounting methods for LEDs 152 and 154 within wavelength conversion element 151 and the use of bonding layers 153 and 155. Bonding layers 153 and 155 thermally, optically, and mechanically attach LEDs 152 and 154 to at least one surface of wavelength conversion element 151. LED 152 is at least partially embedded within wavelength conversion element 151 which can allow for both edge and surface coupling of radiation emitted by the LED 152 into wavelength conversion element 151 using bonding layer 153. Alternately, LED 154 is substantially coupled to the surface of wavelength conversion element 151 using bonding layer 155. Bonding layers 55 and 153 may be eliminated where wavelength conversion element 151 is directly bondable to LEDs 154 and 152 using wafer boding, fusion bonding, or melt bonding.

Figure 10B:
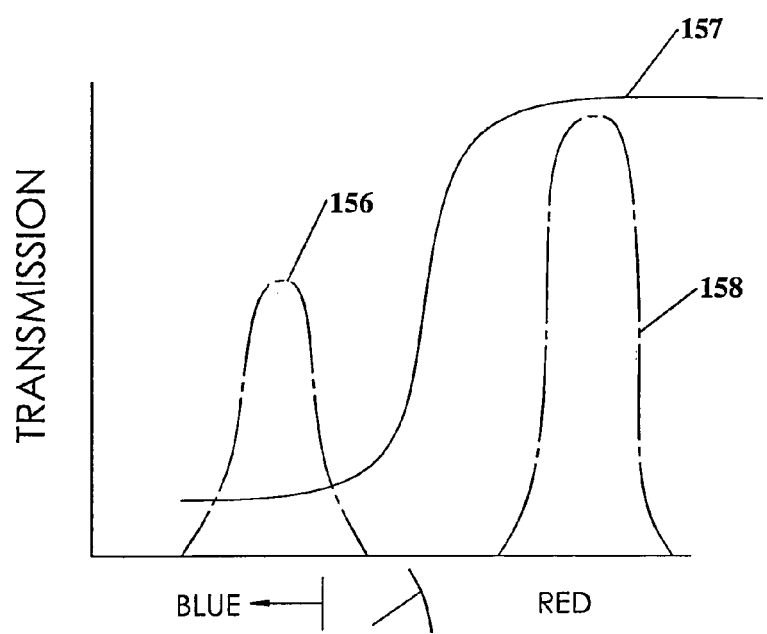

FIG. 10B depicts a typical transmission spectrum 157 of wavelength conversion elements. Blue emission 156 is absorbed by the wavelength conversion element and then reemitted at longer wavelengths. Red emission 158 is typically not strongly absorbed and therefore behaves as if the wavelength conversion element 151 is simply a waveguide. Virtually any color light source can be realized by properly selecting the right combination of blue and red LEDs within the wavelength conversion element 151. While wavelength conversion is a preferred embodiment, FIG. 10B illustrates that self-cooling light sources do not require that the wavelength conversion element 151 be luminescent. In the case of a red self-cooling light source, wavelength conversion element 151 may be used to optically distribute and thermally cool the LEDS without wavelength conversion. Alternately, UV responsive luminescent materials can be used for wavelength conversion element 162 with UV LEDs 164 or 165. The transmission spectrum 157 is shifted to shorter wavelength which allows for the formation of self cooling light sources which exhibit white body colors, as seen in fluorescent light sources. This wavelength shift however is offset by somewhat reduced efficiency due to larger Stokes' shift losses.

Figure 11:
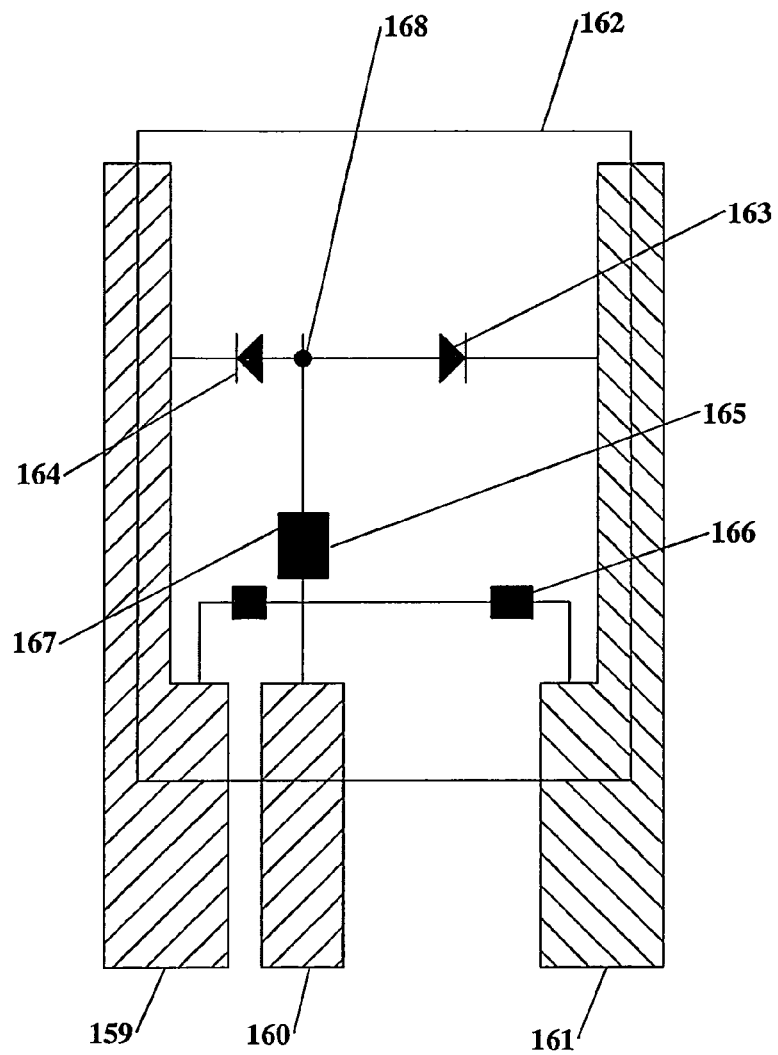
FIG. 11 depicts a top view of a three pin self cooling light source of the present invention.

FIG. 11 depicts a color tunable self-cooling light source containing at least one wavelength conversion element 162 with an electrical interconnect 168, at least one blue LED 164, at least one red LED 163, and drive electronics 165, 166, and 167. Electrical interconnect 168 is a thick film printed silver ink. Three separate pins 159, 160, and 161 to provide independent control of blue led 164 from red LED 163. Pins 159, 160, and 161 can be physically shaped to allow for keying thereby ensuring that the self-cooling light source is properly connected to external power sources. While pins 159, 160 and 161 are substantially shown on the same side of wavelength conversion element 162, the use of alternate pin configurations are anticipated by the inventors. In general, external electrical interconnect can be accomplished via pins 159, 160, and 161 as shown in FIG. 11 or via alternate interconnect means including, but not limited to, flex circuits, rigid elements containing electrical traces, coaxial wires, shielded and unshielded twisted pairs, and edge type connectors on or connected to wavelength conversion element 162 are embodiments of this invention. Additionally feedthroughs within wavelength conversion element 162 can be formed via mechanical, chemical etching, laser, waterjet, or other subtractive means to form external interconnects to any of the previous listed electrical interconnect elements in any plane of the wavelength conversion element 162. Drive electronics 165, 166, and 167 may consist of both active and passive elements ranging from resistors, caps, and inductors. In this manner, a variety of external drive inputs can be used to excite the light source. As an example, a current source chip may be mounted onto the wavelength conversion element 162 and connected to an external voltage source via pins 159,160, and 161. As known in the art, typical current source chips can also have an external resistor, which sets the current that flows through the current source chip. The external resistor may be mounted on the wavelength conversion element 162 or be external to the source and connected to current source chip via pins 159, 160, and 161. As the functionality within the light source increases, the number pins may be increased. Integrated circuits can be used for drive electronics 165, 166, and/or 167.

Figure 12:
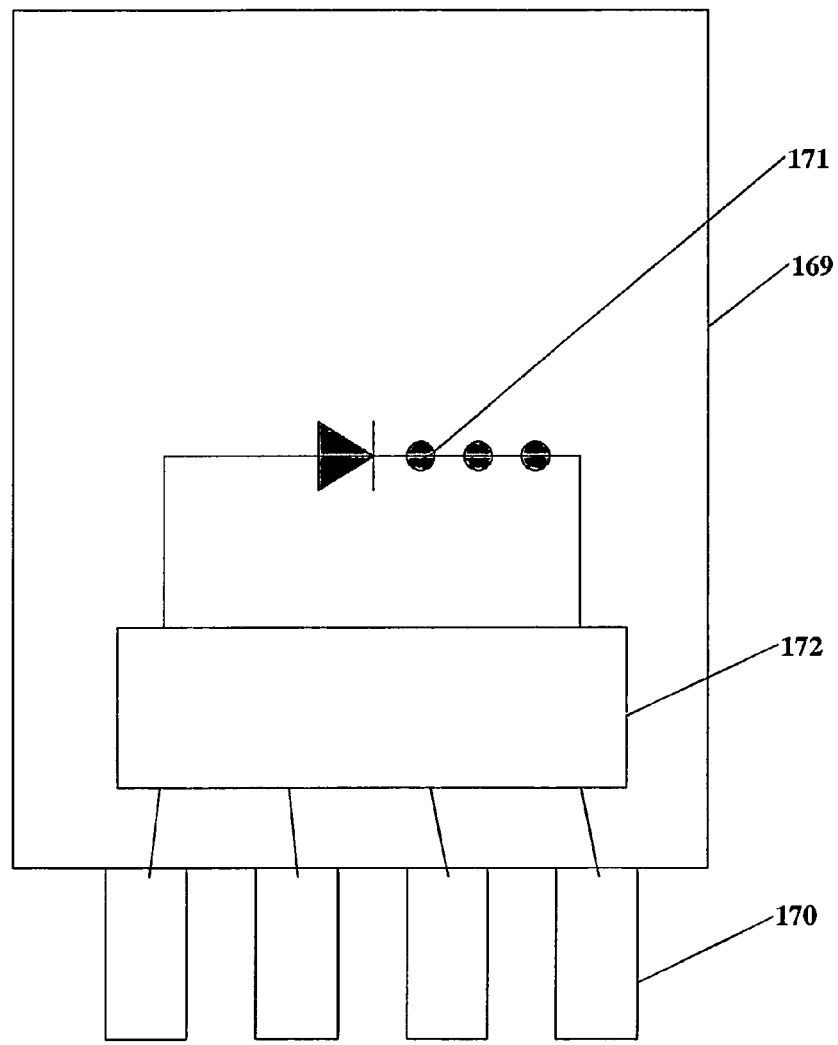
FIG. 12 depicts a top view of a self cooling light source with an integrated driver of the present invention.

Wavelength conversion element 162 also substantially cools the drive electronics 165, 166, and 167 as well as LEDs 164 and 165. Pins 159, 160, and 161 may be used to remove heat from the heat generating elements of the light source. Wavelength conversion element 162 is luminescent and provides for optical diffusion and cooling of the heat generating elements within the self cooling light source In this case, additional wavelength emitters may be added including, but not limited to, UV, violet, cyan, green, yellow, orange, deep red, and infrared FIG. 12 depicts a self cooling light source with an embedded active driver 172 capable of driving multiple LEDs 171, all of which are mounted and cooled substantially by wavelength conversion element 169. Input pins 170 may provide power input to active driver 172 but also provide outputs including, but not limited to, light source temperature, ambient temperature, light output levels, motion detection, infrared communication links, and dimming controls. As previously disclosed, the transmission spectrum of the wavelength conversion element 169 allows for low absorption of longer wavelengths. An infrared/wireless emitter and receiver can be integrated into embedded active driver 172 so that the self cooling light source could also serve as a communication link for computers, TVs, wireless devices within a room, building, or outside. This integration eliminates the need for additional wiring and devices.

Figure 13A:
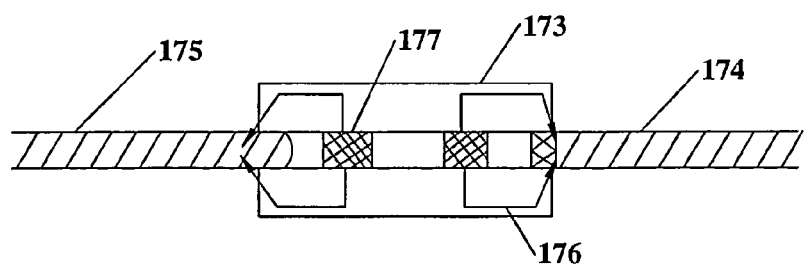
FIGS. 13A and 13B depict a side view and a perspective view of a self cooling light source with additional cooling means of the present invention.

FIG. 13A depicts the use of electrical contacts 174 and 175 as additional thermal conduction paths for extracting heat 178 out of the wavelength conversion elements 173 and 174 additionally cooling paths for LED 177. LED 177 may be direct attach or flip chip and may be a lateral, vertical, or edge contact die. As an example, electrical contact 174 and 175 may consist of 0.3 mm thick Tin plated aluminum plates sandwiched between wavelength conversion elements 173 and 174. In this manner both electrical input and additional cooling means for wavelength conversion elements 173 and 174 as well as LED 177 can be realized.

Figure 13B:
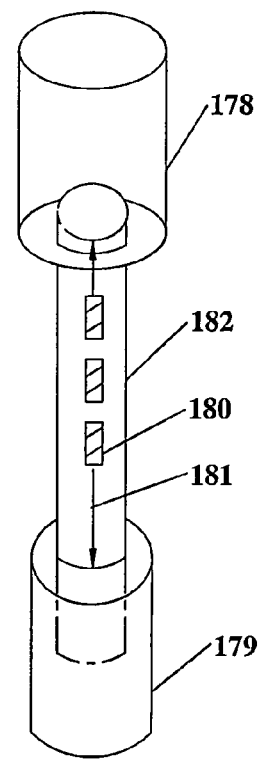

FIG. 13B depicts a rod based light source with LEDs 180 within rod shaped wavelength conversion element 182 wherein heat 181 is additionally extracted via conduction to contacts 178 and 179. Alternately, hemispherical, pyramidal, and other non-flat shapes and Ce:YAGs maybe used for wavelength conversion element 182 to create a desired intensity, polarization, and wavelength distribution. Ce:YAG and other shapes, such as spheres and pyramids, maximize the surface area to volume ratio, so that convective and radiative cooling off the surface of the wavelength conversion element 182 is maximized while using the least amount of material possible. As an example, contacts 178 and 179 may consist of 2 mm copper heat pipes thermally bonded via a bonding method including but not limited to gluing, mechanical, soldering, or brazing means to wavelength conversion element 182. In this manner additional cooling maybe realized. LEDs 180 may be mounted on the surface or inside of wavelength conversion element 182. As an example LEDs 180 may be mounted on the flat surface of two hemispherical wavelength conversion elements 182. The two hemispherical wavelength conversion elements 182 are bonded together to form a spherical self cooling light source with the LEDs 180 embedded within the wavelength conversion elements 182. Alternately, the LEDs 180 may be mounted on the spherical surface of the hemispherical wavelength conversion element 182 such the light generated by LED 180 generally is coupled into the hemispherical wavelength conversion element 182. Optionally, the flat surface of hemispherical wavelength conversion 182 may have additional luminescent coatings such that the light emitted by LEDs 180 is effectively coupled by the hemispherical wavelength conversion element 182 onto the luminescent bonding layer which reflects, transmits, converts or otherwise emits both the light emitted by the LEDs 180 and any luminescent elements back out of the hemispherical wavelength conversion element 182. The advantage of this approach is that the LEDs 180 are mounted closer to the cooling surface of the wavelength conversion element, a high degree of mixing is possible, and the angular distribution of the source can be controlled by how well the bonding layer is index matched to the wavelength conversion element 182. Bonding two hemispherical wavelength conversion elements 182 together forms a spherical source with externally mounted LEDs 180.

Figure 14:
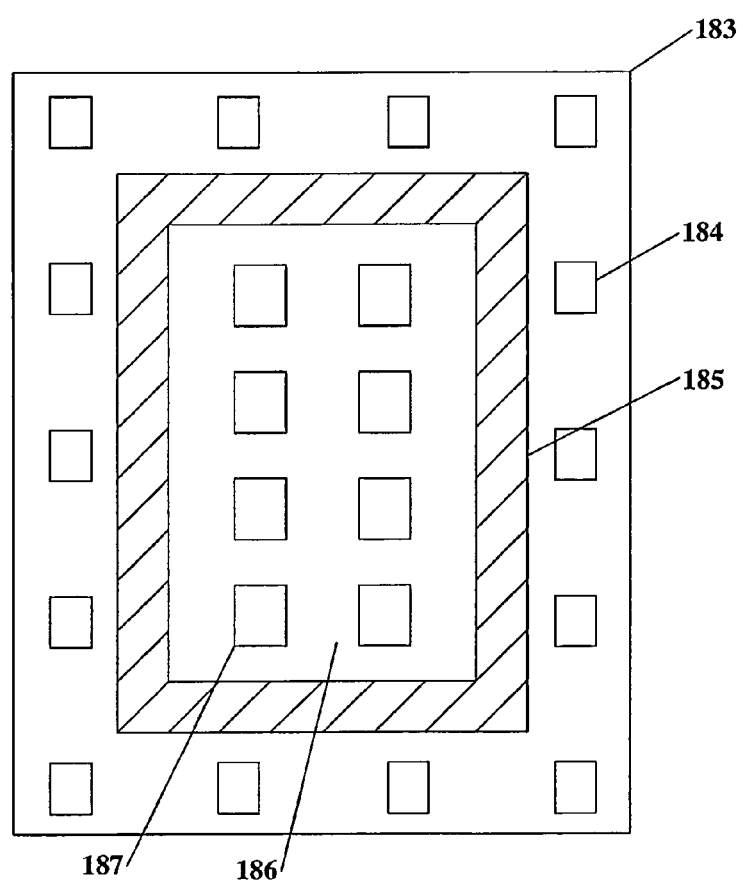
FIG. 14 depicts a top view of a self cooling light source with thermally isolated sections of the present invention.

FIG. 14 depicts a self cooling light source with at least two thermally and/or optically separated zones. Waveguide 183 containing LEDs 184 is optically and/or thermally isolated via barrier 185 from waveguide 186 and LEDs 187. Dual colored light sources can be formed. Alternately, temperature sensitive LEDs such as AlInGaP can be thermally isolated from more temperature stable InGaN LEDs. Waveguide 183 and 186 may or may not provide luminescent conversion. LEDs 184 are AlInGaP (red) LEDs mounted to waveguide 183 made out of sapphire. LEDs 187 are InGaN blue LEDs mounted onto waveguide 186, which is single crystal Ce:YAG. The barrier 185 is a low thermal conductivity alumina casting material. AlInGaP efficiency drops by 40% for junction temperatures over 60° C. while InGaN efficiency will drop only by 10% for a similar junction temperature. White light sources can be realized by thermally isolating the AlInGap from the InGaN high overall efficiency. Using this approach the two sections operate at different surface temperatures. The InGaN LED 187 and waveguide 186 operates at a higher surface temperature while the AlInGaP LED 184 and waveguide 183 operates at a lower surface temperature.

Figure 15:
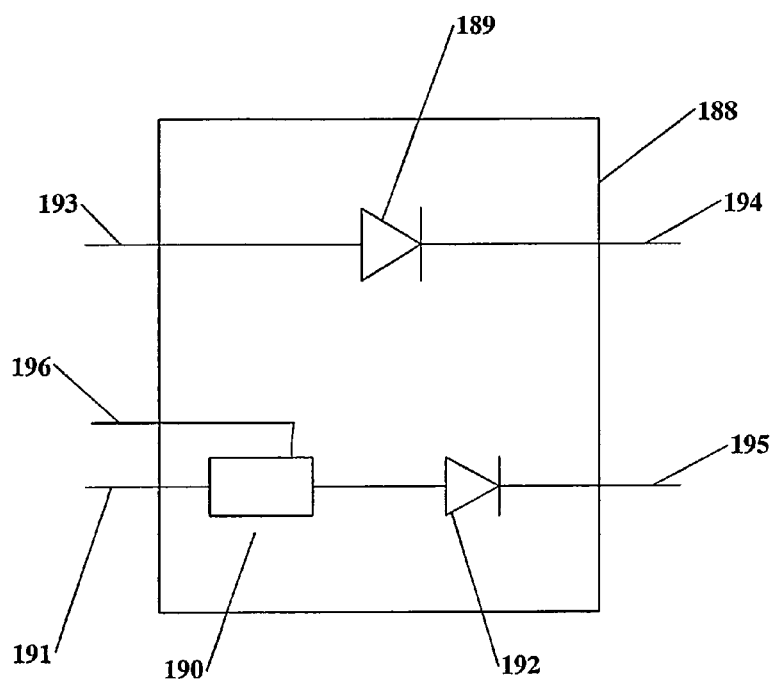
FIG. 15 depicts a top view of a self cooling light source with separate drive scheme for blue and red die of the present invention.

FIG. 15 depicts Blue LED 189 mounted to wavelength conversion element 188 and Red LED 192 with driver 190. Power lines 191, 193, 194, and 195 and control line 196 are also shown. Red LED 192 drive level is set via control line 196 by controlling the voltage/current flow available via power line input 191 and output 195. Typically driver 190 would be a constant current source or variable resistor controlled via control line 196. As stated earlier, blue LED 189 is typically InGaN with more stable regarding temperature, life and drive levels than red LED 192 typically AlInGaP. As an example, TPA coated with europium doped strontium Thiogallate singularly or as a multiphase with another gallate, such as Eu doped magnesium gallate for wavelength conversion element 188 is excited by 450 nm LED 189. 615 nm AlInGaP red LED 192 is also mounted on the wavelength conversion element 188 along with driver 190. Heat is spread out via wavelength conversion element 188 as well as the radiation emitted by blue LED 189 and red LED 192. Control line 196 is used to adjust the color temperature of the source within a range by increasing the current to red LED 192 relative to the fixed output of blue LED 189. Additional LEDs and other emission wavelengths can be used.

Figure 16A:
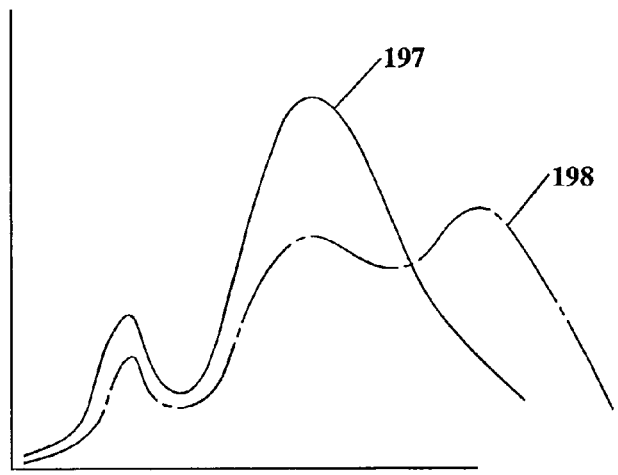
FIGS. 16A and 16B depict graphs of subtractive red phosphor and additive red LED of the present invention.

FIG. 16 depicts a white light spectrum for a typical solid state light source. FIG. 16A illustrates high color temperature low CRI spectrum 197 typically created by blue LEDS and Ce:YAG phosphors. Additional phosphors are typically added to add more red content in order to lower the color temperature as shown in spectrum 198. This red addition however requires that a portion of the blue and in some cases some of the green be absorbed which reduces overall efficiency.

Figure 16B:
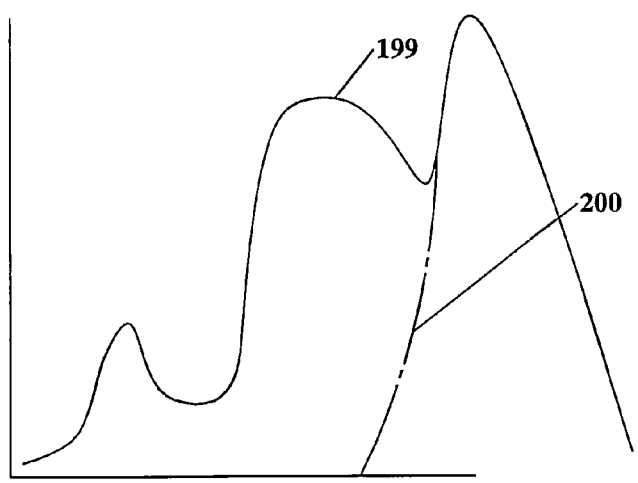

FIG. 16B depicts the typical spectrum 199 from a blue LED, Ce:YAG phosphor, and red LED. The red LED spectrum is additive as shown in spectrum 200. In general, both methods of FIG. 16 are used to form self-cooling light source described in this invention.

Figure 17:
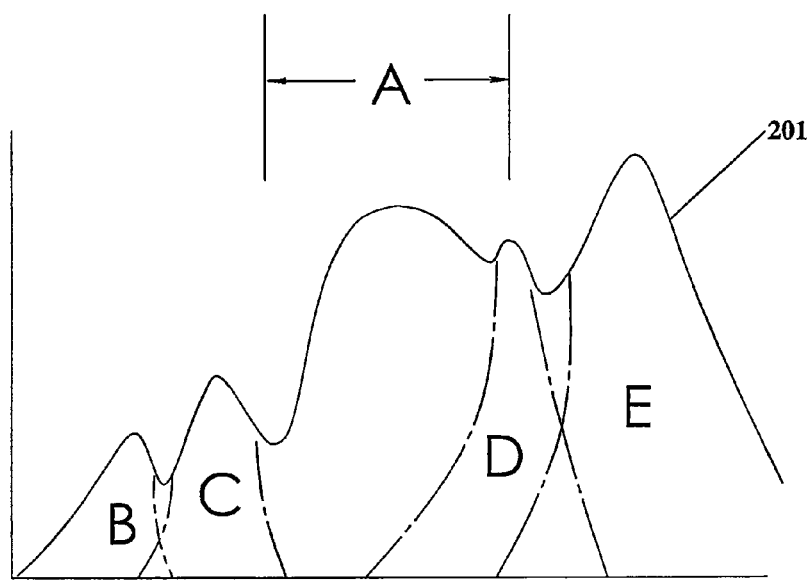
FIG. 17 depicts a graph of the spectrum from a self cooling light source with cyan and yellow LEDs of the present invention.

FIG. 17 depicts a high CRI white light spectrum 201 formed by mixing phosphor and LED spectrums A, B, C, D, and E. Spectral ranges can be mixed, diffused and converted within the wavelength conversion elements disclosed in this invention in addition to cooling, mechanically mounting, environmentally protecting, and electrically interconnecting the devices needed to generate the spectrums depicted. As an example, spectrum B may be derived from a blue 440 nm emitting LED, a portion whose output is used to excite a single crystal Ce:YAG luminescent element as previously disclosed to form spectrum A between 500 nm and 600 nm. Spectrum C may consist of a cyan quantum dot, which also converts a portion of output of the blue 440 nm emitting LED into 490 to 500 nm wavelengths. Spectrum D maybe produced by using a wavelength shifter die such as Eljen-284 (Eljen Technologies Inc.) to convert a portion of Spectrum A into wavelengths between 580 nm and 700 nm and Spectrum E maybe a AlInGaP red LED emitting between 600 and 800 nm. Infrared emitters or converters may also be added for communication links, security, and night vision applications.

Figure 18A:
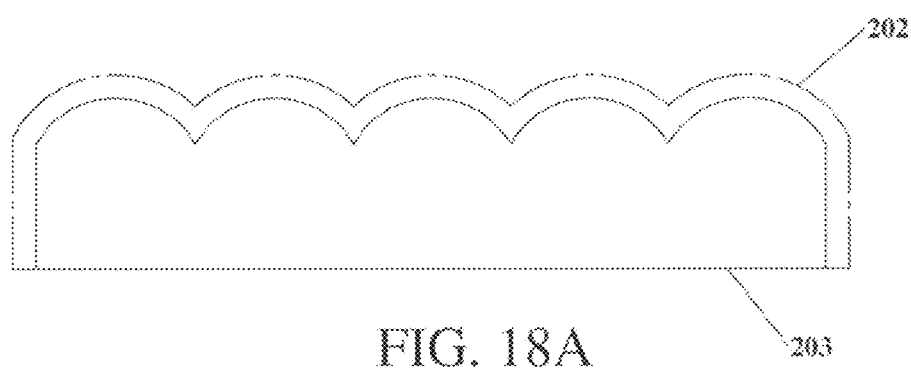
FIGS. 18A and 18B depict a side view and a perspective view of various shapes with luminescent coatings of the present invention.
Figure 18B:
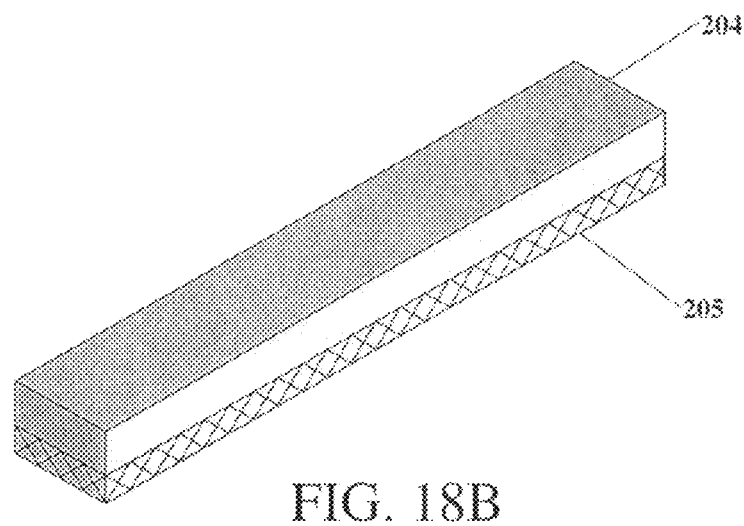

FIG. 18 depicts various shapes of waveguides and luminescent coatings. FIG. 18A depicts a textured thermally conductive waveguide 203 with a luminescent coating 202. As an example, a micro lens array may be press sintered out of TPA and coated with Ce:YAG via flame spraying. FIG. 18B depicts an EFG formed single crystal Ce:YAG rod 204 coated with a high emissivity coating 205 with a refractive index substantially equal to the geometric mean of Ce:YAG and air and a thickness greater than 300 angstroms. In the previous example of FIG. 3 the importance of radiative cooling even at low surface temperatures is disclosed. In this example the radiative cooling can represent up to 30% of the total heat dissipated as long as the emissivity of the surface is above 0.8. Emissivity varies from very low (0.01) for polished metals to very high 0.98 for carbon black surfaces. The use of high emissivity coatings 205 that are also transparent in the visible spectrum are most preferred. These include but not limited to silicates, glasses, organics, nitrides, oxynitrides, and oxides. Even more preferred is high emissivity coating 205 that also exhibit a thermal conductivity greater than 1 W/mK. The high emissivity coating 205 thickness is preferably between 1000 angstroms and 5 microns thick. The emissivity coating 205 may also be luminescent.

Figure 19A:
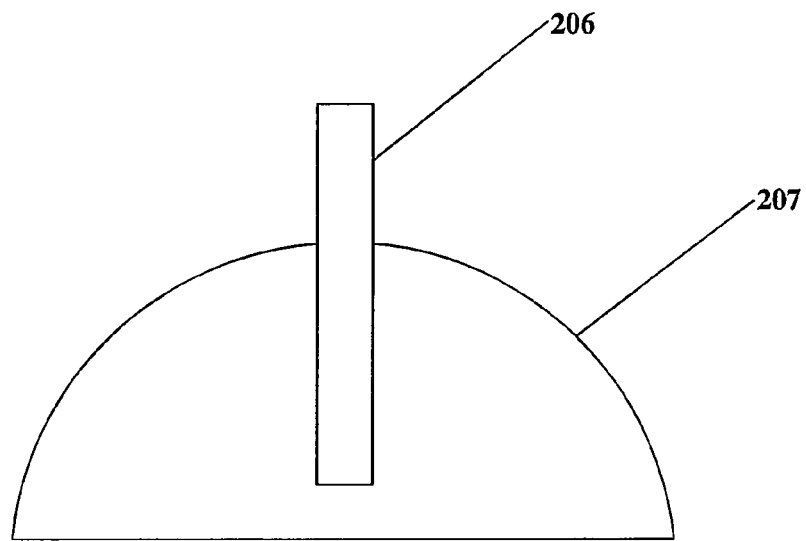
FIGS. 19A and 19B depict side views of optics for self cooling light source of the present invention.

FIG. 19A depicts a self cooling light source 206 and an optic 207. Optic 207 may be reflective, transparent, translucent or opaque. Both decorative and directional means may be used as an optic. Parabolic, elliptical, non-imaging and other optical configuration as known in the art may be used as an optic. In particular, the use of prismatic surface elements on optic 207 wherein a substantial portion of the light emitted by self cooling light source 206 are redirected in a direction orthogonal to their original direction are embodiments of this invention. Optic 207 redirects a portion of the light from light source 206 downward. The optic 207 may consist of, but is not limited to, glass, single crystal, polymer or other translucent/transparent materials. Colored translucent/transparent materials create a specific decorative or functional appearance. As an example a light source 206 may be embedded into an orange glass glob to form a decorative lamp. The elimination of the need for a heat sink greatly simplifies the optical design and allows for a wider range of reflectors and optical elements.

Figure 19B:
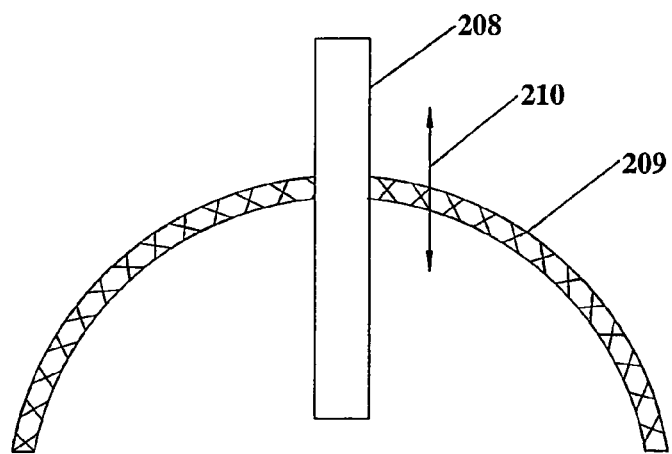

Alternately, FIG. 19B depicts an external movable reflector 209, which slides 210 up and down light source 208. Using this approach the percentage of downward light can be adjusted relative to the amount of diffuse lighting. Again the elimination of heat sinks and the formation of an extended source greatly simplifies the optical design of the light fixture.

Figure 20A:
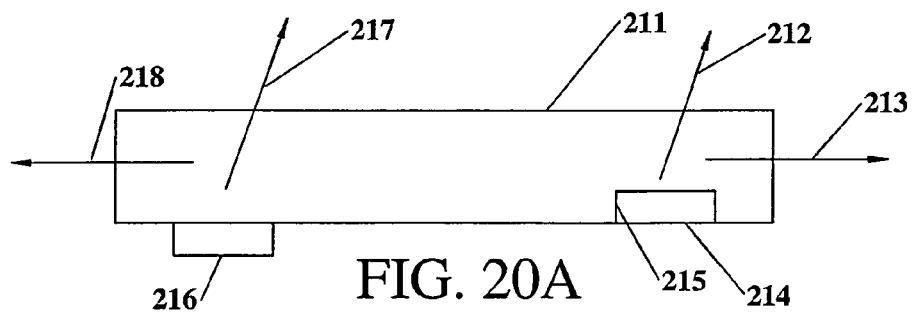
FIGS. 20A, 20B, and 20C depict side views of means of modifying the far field optical patterns of self cooling light sources of the present invention.

FIG. 20 depicts methods of adjusting the far field distributions of single light sources. In FIG. 20A, the far field distribution both intensity and wavelength can be adjusted by mounting methods for the LEDs 214 and 216 within or onto wavelength conversion element 211. LED 214 depicts an embedded LED 214 in which a pocket or depression is formed in wavelength conversion element 211. This embedded LED changes the ratio of transmitted rays 212 to waveguided rays 213 relative to surface mounted LED 216 which has a substantially different ratio of transmitted rays 217 to waveguided rays 218.

Figure 20B:
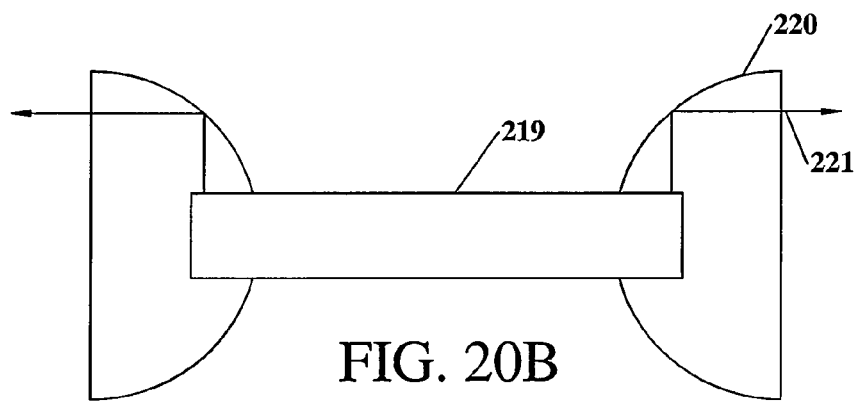

In FIG. 20B an optic 220 extracts light off of more than one surface of light source 219. In this case, rays 221 are redirected substantially orthogonally to the surface the rays were emitted from and mixed with the rays from other surfaces of light source 219. The optic 220 may be a prism, lens, parabolic, elliptical, aspherical, or free formed shape.

Figure 20C:
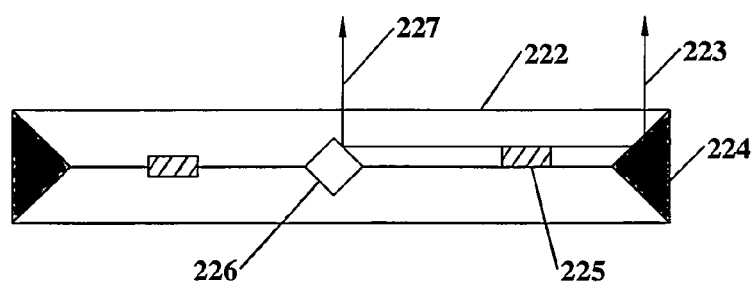

FIG. 20C depicts embedded LEDs 225 in embedded occlusions 226 with edge-turning elements 224 which were previously disclosed. Rays 227 and 223 can be directed substantially orthogonally out of the wavelength conversion element 222.

Figure 21A:
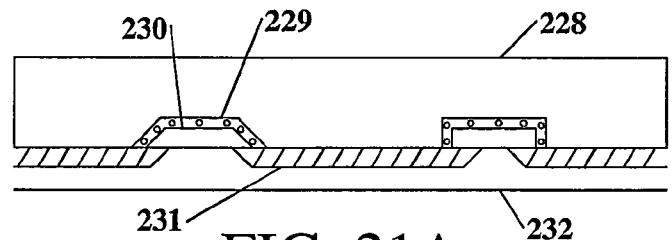
FIGS. 21A, 21B, and 21C depict side views of a light emitting patch source and its use with waveguiding materials of the present invention.

FIG. 21A depicts a LED die 230 bonded into a wavelength conversion element containing depressions or pockets 228 using a bonding layer 229, a electrical interconnect layer 231 and protective dielectric layer 232. As an example, a 500 microns thick Ce:YAG single crystal wafer is laser drilled to have a pocket into which lateral LED die 230 is placed and bonded using a polysilazane. The polysilazane is at least partially cured. The polysilazane is further coated using inkjet printing techniques to cover all but the metal contact pads of lateral LED die 230. Conductive ink is printed via, but not limited to, inkjet, screen printing, tampo, or lithographic means such that the exposed metal contact pads of lateral LED die 230 are interconnected electrically via electrical interconnect layer 231. Nanosilver, silver paste, and other highly reflective printable electrically conductive inks, pastes or coatings are the preferred conductive ink. A protective dielectric layer 232 is applied via, but not limited to, inkjet, spin coating, dip coating, slot coating, roll coating and evaporative coating means.

Figure 21B:
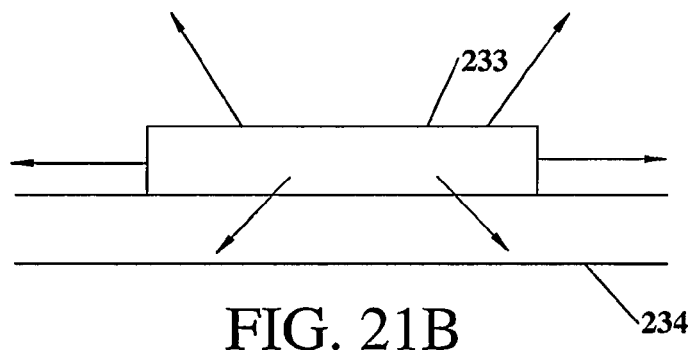
Figure 21C:
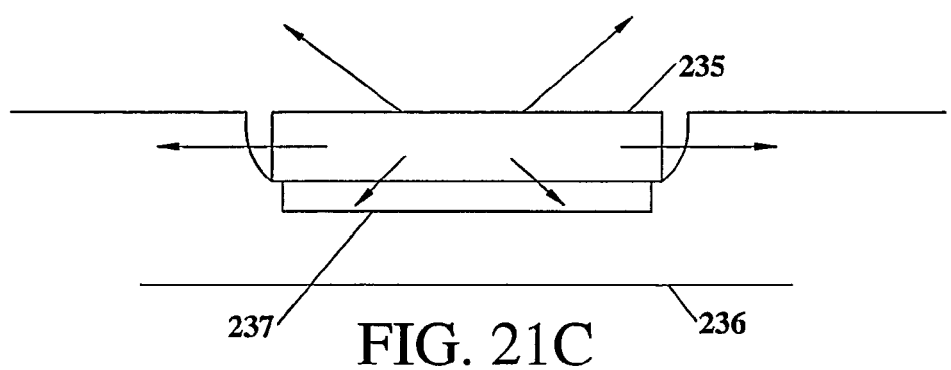

FIG. 21B depicts LED 233 mounted to the surface of waveguide 234 most of the rays do not couple to the waveguide efficiently. FIG. 21C depicts embedded LED 235 within a pocket in waveguide 236. Optically and thermally there is more coupling into waveguide 236. In addition the use of embedded LED 235 allows for simplified interconnect as depicted in FIG. 21A. Further luminescent insert 237 may be used to convert at least a portion of the spectrum from LED 233 or 235. In this case lower cost materials may be used for waveguide 234 and 236 respectively. As an example, single crystal Ce:YAG inserts 50 microns thick with a Ce doping concentration greater than 0.2% with substantially the same area as embedded LED 235 can be inserted into press sintered TPA waveguides. In this manner, the amount of luminescent material can be minimized while still realizing the benefit of a thermally conductive element including, but not limited to, waveguide, increased thermal cooling surface, and optical spreading of the light over an area larger than either luminescent insert 237 or LED 235. Ceramic, polycrystalline, amorphous, composite and pressed powders of luminescent materials may be used for luminescent insert 237. A waveguide 236 with a thermal conductivity greater than 1 W/mK can work with a luminescent insert 237. LED 235 consists of one or more of the LED which is an InGaN, AlGaN, and/or AlInGaP based LED in waveguide 236 with a thermal conductivity greater than 1 W/mK with at least one luminescent insert 237.

Figure 22:
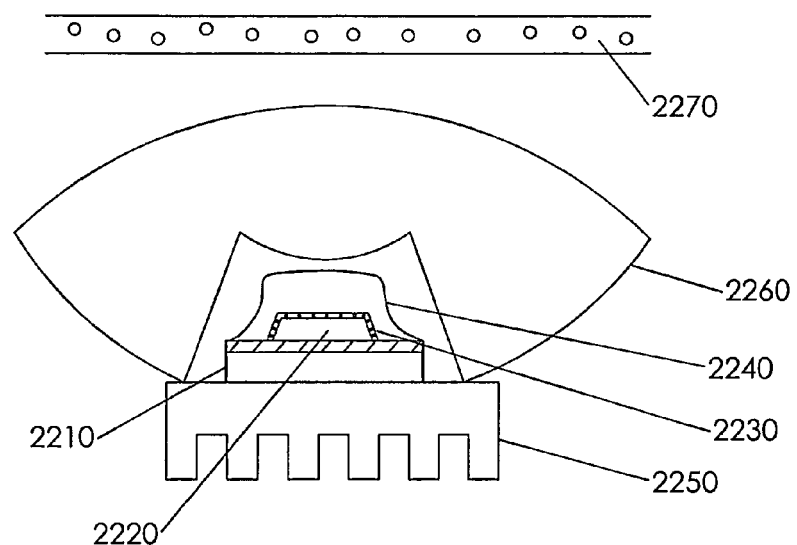
FIG. 22 shows a side view of the prior art light source incorporating an LED package and appended heat sink.

FIG. 22 is a prior art solid state light source. Conventional LED light sources incorporate a substrate 2210 upon which is mounted a printed circuit and bond pads for the LED 2220. The LED is coated with a phosphor 2230, and encapsulated with a clear encapsulant or adhesive 2240. These elements 2210, 2220, 2230, and 2240 are typically called an LED package. The package is mounted to a heat sink 2250, which spreads and dissipates the heat generated by the LED 2220. The U.S. Department of Energy (DOE) estimates that 70% of the cost of LED lighting is due to the heat sink (30%) and the package (40%). To complete the light source a lens 2260 is mounted above the LED and a diffuser 2270 is added to get a more uniform distribution of light emanating from the light source. All of these components add weight, size, cost and complexity to LED light sources.

Figure 23A:
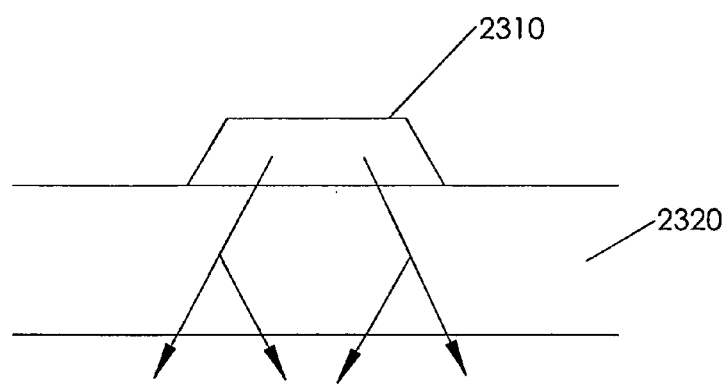
FIG. 23A shows a side view of an LED mounted directly to a single element that forms the heat sinking and light emitting function of the light source of the present invention.

In U.S. Published Patent Application No. 20130099264 (which is commonly assigned and incorporated by reference into this invention), means to eliminate many of these components are by combining the diffuser, heat sink, and package into one component. The LED 2310 of FIG. 23A is mounted to a light transmitting thermally conductive translucent element 2320, which acts a heat sink and light emitting diffuser.

Figure 23B:
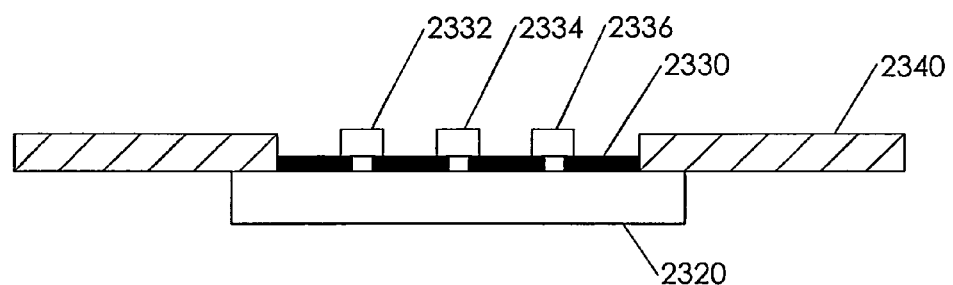
FIG. 23B depicts a side view of a printed circuit to interconnect multiple LEDs of FIG. 23A of the present invention.

As shown in FIG. 23B, the thermally conductive translucent element 2320 also contains a printed circuit 2330 to interconnect the LED 2332 to other multiple LEDs 2334, 2336, and to electrical leads or connectors 2340 so it may be connected to an external power source (not shown). In U.S. Publication No. 20130099264, it has been shown how by coupling the light from the LED(s) into the thermally conductive translucent elements the light is waveguided within and then extracted from the elements. An embodiment of this invention shows a method where lower cost materials may be utilized to practice the basic tenets described in U.S. Publication No. 20130099264.

For the light sources embodied herein, there are two compelling reasons to utilize more surface area for the partially transmitting thermally conductive elements. The method of cooling is natural convection and radiation. For both of these cooling means the rate of cooling is directly proportional to the surface area exposed to ambient. Therefore, the more surface area exposed to ambient the higher rate of heat dissipation. In addition the luminous flux density is decreased with higher surface area which may be desired in some applications where the light source is unshielded (to the human eye) or not in a shade or luminaire. To accommodate larger surface areas requires more thermally conductive translucent material. To economically compete with conventional incandescent light sources requires that the cost of those materials be as low as possible.

It has been found that less expensive thermally conductive translucent materials that are more optically reflective than optically transmissive may be utilized by forming them into light recycling cavities. In fact, it has been found that materials with greater than 50% reflectivity (less than 50% transmissivity), when formed into a light recycling cavity, can extract over 50% of the light emitted by the LEDs enclosed in the closed cavity. Therefore, it is an embodiment of this invention that the light recycling cavity of this self cooling light source has a light extraction efficiency that exceeds the light transmissivity of the light transmissive thermally conductive elements forming the cavity.

Figure 24A:
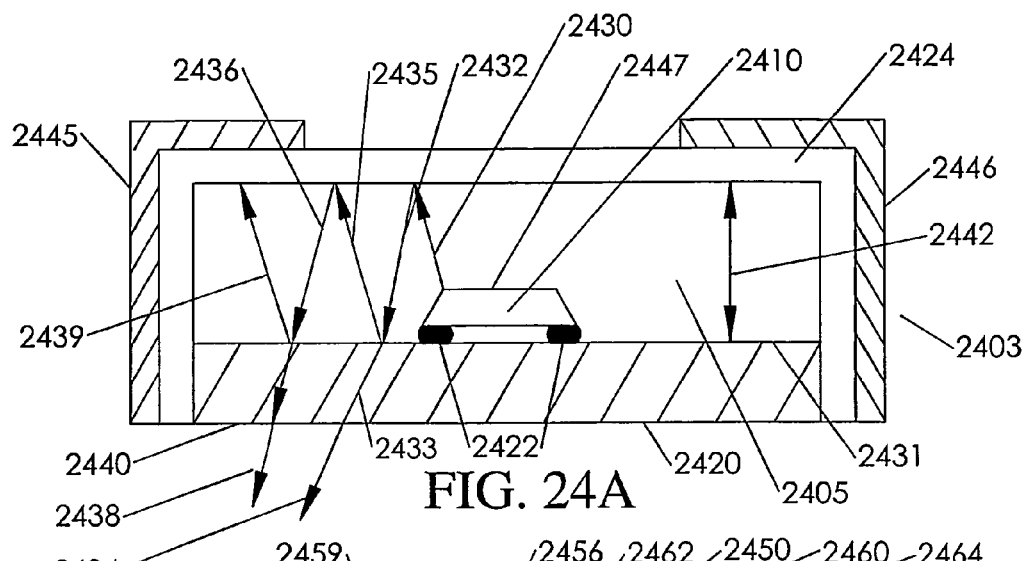
FIG. 24A depicts a side view of one highly reflective thermally conductive element with LEDs mounted to it and a reflector to form a light recycling cavity of the present invention.

A translucent (optically transmissive and reflective) light transmitting thermally conductive element 2420 in FIG. 24A, (e.g. alumina ($Al_2O_3$), TPA, BeO, AlN, BN, and other thermally conductive ceramics, amorphous, composites, polycrystalline, oriented polycrystalline, or single crystalline materials which exhibit low absorption losses to emission wavelengths being used) with an LED 2410 or multiple LEDs mounted on its surface is combined with a light reflector that forms a reflective enclosure 2424 to redirect most of the light emitted by the at least one light-emitting diode 2410 back to and through the light transmitting thermally conductive material (element) 2420. It is advantageous that the thickness 2442 of the recycling cavity be as thin as possible to make low profile light sources and also to minimize material. Many of the aforementioned translucent materials are simultaneously reflective, transmissive and scattering to incident light. Translucent as used herein refers to materials that are capable of being light reflective, light transmitting, light scattering and waveguiding (wherein the light can travel significant distances within the material). There are some materials that are capable of being alternately reflective, transmitting or scattering without waveguiding (e.g. metals) as an alternate method of making the light transmitting thermally conductive element as described below. LED 2410 may be a direct die attach LED, vertical LEDs, lateral LEDs, LED packages and/or arrays of LEDS in packages with and without wavelength conversion layers or elements. The use of high temperature materials for the light transmitting thermally conductive element 2420 allows for LED 2410 to be soldered, adhesively bonded, welded, or otherwise attached both electrically and physically. The high temperature nature of the partially reflective and partially light transmissive thermally conductive element 2420 also allows for the formation of electrical interconnect circuitry on the surface of the thermally conductive element 2420 up to temperatures exceeding 850° C.

The light reflector 2424 may be metal, aluminum, enhanced reflectivity aluminum or metals, plastic, silver coated plastic, white plastic, ceramic, glass, painted surfaces, barium sulfate coated surfaces, expanded Teflon or other low absorption polymers, composite materials exhibiting high reflectivity, filled polymers, and may either be a specular or diffuse reflector, or a combination of both. Light reflector 2424 may also be enhanced to reflect both light and heat. In general, both light and heat generated in the device is substantially transmitted through the light transmitting thermally conductive element 2420. The thermal conductivity may be lower for the light reflector 2424 than the light transmitting thermally conductive element 2420 as the majority of the heat generated within the light source is dissipated through and to the outer surface of the light transmitting thermally conductive element 2420. As such even thermally insulative materials such as White Optics™ polymers can be used for the light reflector 2424 with a low thermal conductivity of approximately 0.1 W/mK. A further embodiment of this invention is a light reflector 2424 that is partially light reflective and partially light transmitting. In that case a reflective and light transmitting thermally conductive element may be used for the light reflector 2424. This is further detailed below (e.g. FIG. 25).

Alanod™ Miro products that are aluminum with reflective enhanced coatings and thermal conductivity greater than 100 W/mK may also be used for the light reflector 2424 in FIG. 24A. In this case, some portion of the heat generated can be dissipated through the light reflector 2424 or transferred to the light source's external mounting surface. The light reflector 2424 also may be used as a thermal barrier to protect heat sensitive surfaces to which the light source is attached. As such, the use of thermal barrier coatings 2445, 2446 on the outer surface of light reflector 2424 is also an embodiment of this invention. As described and in general an embodiment of this invention is a self cooling light source where at least one light-emitting diode 2410 is mounted on at least part of the light transmitting thermally conductive element 2420 and is combined with a light reflector 2424 that recycles the light emitted by the at least one light-emitting diode 2410 back to and through the light transmitting thermally conductive element 2420. Alternatively, multiple light transmitting thermally conductive elements may be combined with a single light reflector to form larger emitting surface area light sources.

Light emitted by the LED(s) 2410 is reflected by the light reflector 2424 and incident on the light transmitting thermally conductive element 2420 on which the LED 2410 is mounted. A portion of the light incident on the light transmitting thermally conductive element 2420 is transmitted and scattered and emitted on the output surface of the light transmitting thermally conductive element 2420. Due to the reflectivity of the light transmitting thermally conductive and optionally translucent element 2420 a portion of the light is reflected back into the cavity formed by the light reflector 2424 and the light transmitting thermally conductive element 2420.

Whereas low reflectivity high transmissivity materials (e.g. TPA, Spinel, sapphire, etc.) may be used to practice this invention, it has been found that highly reflective (low transmissivity) elements may be used while still achieving high light output efficiency.

LED 2410 is mounted to the reflective translucent thermally conductive element 2420 via the printed interconnect pad 2422. The printed interconnect and pad 2422 is an electrically conductive trace (gold, silver, copper, ITO, etc.), which can be screen printed or ink jet printed onto the thermally conductive translucent element.

At least one light reflector 2424 mounted to at least one reflective and light transmitting thermally conductive element 2420 can be a specular or diffuse reflector of light incident upon it and can be made from any material as long as it has a highly light reflective >95% surface substantially facing the LED 2410 light emissive surface(s) 2447 and the interior of the recycling cavity formed by the inward facing surface(s) 2431 of the light transmitting thermally conductive element 2420 and light reflector 2424. Again, the light reflector 2424 does not have to be thermally conductive because most of the heat from the at least one LED 2410 is dissipated through the light and heat emitting surface 2440 of the light transmitting thermally conductive element 2420. The light reflector 2424 therefore can be made from a myriad of different materials including metal, aluminum, plastic, ceramic, etc. It is desirable that the light reflector 2424 has a reflectivity of greater than 85%. It is preferable that the light reflector 2424 has a reflectivity of greater than 90%. And it is most preferable that the light reflector 2424 has a reflectivity of greater than 95%. Reflectivity can be limited to the visible wavelength range or more preferably to include also the infrared range as well, such that heat is redirected through light transmitting thermally conductive element 2420 to ambient.

Figure 24B:
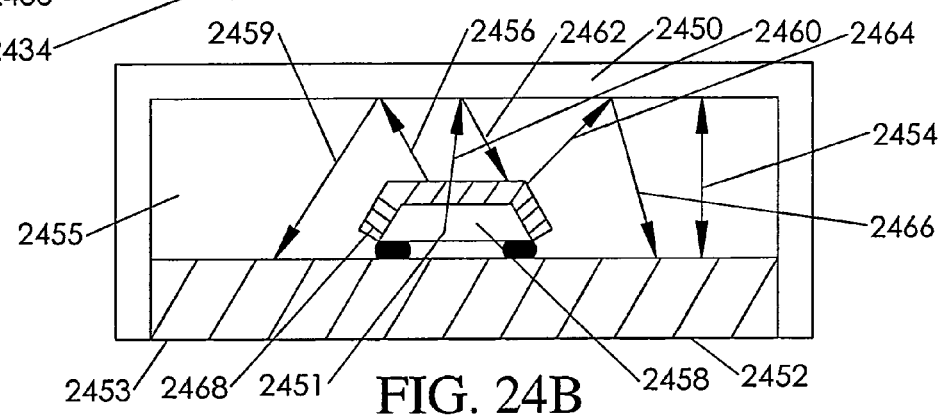
FIG. 24B depicts a side view of a light recycling cavity with wavelength conversion elements.

The LED 2410 is mounted to the light transmitting thermally conductive element 2420 so that its light emitting surface(s) 2447 are facing or are directed substantially towards the light reflector 2424. This allows the LED 2410 to have a metallic contact to the metallic pad 2422 on the light transmitting thermally conductive element 2420 providing a low thermal impedance from the LED 2410 to the reflective and light transmitting thermally conductive element 2420. The thermal conductivity of reflective and light transmitting thermally conductive element 2420 is critical to spread heat laterally so that the outer cooling/light emitting surface 2440 of the reflective and light transmitting thermally conductive element 2420 can dissipate the heat generated by LED 2410 to the surrounding ambient environment. The outer surface 2440 of the reflective and light transmitting thermally conductive element 2420 thereby becomes the primary heat emitting surface and cooling surface of the light source. The metallic contacts on the LED 2410 may be bonded to the metallic pads 2422 on the reflective and light transmitting thermally conductive element 2420 via soldering, thermocompression, conductive adhesive, etc. These contacts and pads can provide electrical contact to the LEDs via the interconnect on the reflective and light transmitting thermally conductive element 2420 (as previously depicted in FIG. 23 above). Light emitted by the LED 2410 is depicted by a sample light ray 2430, which is reflected 2432 off the interior surface of the light reflector 2424 and then impinges on the interior surface 2431 of the reflective transmissive thermally conductive element 2420. If the reflective and light transmitting thermally conductive element 2420 is more reflective than transmissive, only a small portion of the light incident is transmitted and scattered 2433 through and emitted 2434 from the thermally conductive translucent element 2420. If the light transmitting thermally conductive element is highly reflective, then a large portion of the light is not transmitted and is reflected 2435 back to the light reflector 2424 where it is reflected 2436 back again to the light transmitting thermally conductive element 2420. Here again another small fraction of light 2438 is transmitted through the light transmitting thermally conductive element 2420 and a larger portion again is reflected 2439 back to the light reflector 2424. This process continues until most of the light is transmitted through and out of the outer/light emitting surface 2440 of the light transmitting thermally conductive element 2420. The outer surface 2440 therefore becomes the light emitting and (as described above) is simultaneously the primary heat emitting (e.g. cooling) surface for the light source). The LED 2410 or multiple LEDs mounted on the surface of light transmitting thermally conductive element 2420 are encased by the reflector 2424 and the light transmitting thermally conductive element 2420 which act as a partial light reflector and partial light transmitter. The more reflective (less transmissive) the light transmitting thermally conductive element 2420 the more mixing and the longer the optical pathlength of the light rays within the recycling cavity which improves uniformity which in turn decreases the number of LEDs 2410 needed per unit area to create a given uniformity. The light emitted by the LED 2410 or multiple LEDs is reflected and recycled to and through the reflective and light transmitting thermally conductive element 2420. Due to the many reflections and recycling of the light, it has been found that only a small distance or gap 2442 is required between the reflector 2424 and the reflective and light transmitting thermally conductive element 2420 to provide a very uniform luminance or brightness across the output and emitting surface of the light source. To create very low profile (thin) light sources, most preferably gap 2442 is less than 8 mm. Even more preferably gap 2442 is less than 5 mm. This uniformity is due to the large percentage of recycling within the so formed light recycling cavity. Higher uniformity is attained by utilizing higher reflecting materials for the reflective and light transmitting thermally conductive elements 2420. As such, preferred materials for the reflective and light transmitting thermally conductive element 2420 have in line light transmission of less than 20%. While this might normally be considered opaque and not suitable for use as an emitting element (in a prior art non-light recycling system) this material is quite useable for the light recycling system of this invention with overall system efficiencies exceeding 70% and 80%. Therefore as described a preferred embodiment of this invention is a self cooling solid state light source 2403 comprising: at least one light transmitting thermally conductive element 2420 that functions as part of a light recycling cavity 2405; and at least one light emitting diode 2410 for emitting light 2430, the at least one light emitting diode 2410 enclosed within the light recycling cavity 2405; wherein said at least one light transmitting thermally conductive element 2420 also functions both as a light emitter 2438 and as a cooling element for the at least one light emitting diode 2410. The self cooling light source further comprising: at least one light reflector 2424 that forms part of said light recycling cavity 2405 and redirects light 2430 from said at least one light emitting diode 2410 to at least one light transmitting thermally conductive element 2420. The light transmitting thermally conductive element 2420 can consist of at least one of the following materials; reflective perforated metals, layered composites with arrays of holes, alumina ($Al_2O_3$), TPA, BeO, AlN, BN, and other thermally conductive ceramics, amorphous, composites, polycrystalline, oriented polycrystalline, or single crystalline materials which exhibit low absorption losses to emission wavelengths from the light emitting diode 2410 or the wavelength conversion element(s) (e.g. 2468 in FIG. 24B) utilized inside the cavity. The key difference is that low absorption is required of all the elements used within the recycling cavity and that the reflective and light transmitting thermally conductive element 2420 must exhibit very low absorption or alpha for the light to be eventually transmitted through it. Alpha should be less than 1 cm$^{-1}$ for the wavelength emitted by the source. Color correcting can be accomplished by either wavelength dependent scatter or absorption. FIG. 24B depicts one embodiment of the use of wavelength conversion elements 2468 within the recycling cavity. In this embodiment at least one wavelength conversion element 2468 is interposed between said light emitting surface 2451 of said at least one light-emitting diode 2458 and said light transmitting thermally conductive element 2452. As shown light emitted by the LED 2458 must pass through the wavelength conversion element before being reflected back and incident on the light transmitting thermally conductive element 2452. In this embodiment the wavelength conversion element 2468, covering the LED 2458 light emission surface 2451 is positioned to face substantially towards light reflector 2450. To minimize the cavity gap 2454 between the light transmitting thermally conductive element 2452 and the reflector 2450 and still produce uniform light emission from the outer emitting surface 2453 of the light transmitting thermally conductive element 2452 it is necessary to increase the amount of light recycling within the light recycling cavity 2455. In this case LED 2458 is covered with wavelength conversion element 2468. Wavelength conversion element 2468 may be powder within an organic or inorganic binder, an inorganic thermally conductive wavelength conversion material as disclosed earlier, luminescent thin film deposition, quantum dots within a binder, or dyes within organic and inorganic binders. Light emitted ray 2456 from LED 2458 passes through wavelength conversion element 2468 and at least a portion of the ray is converted to a longer wavelength range by wavelength conversion element 2468 such that emitted ray 2456 has a broader spectrum. Emitted ray 2456 reflects off light reflector 2450 such that reflected ray 2459 is redirected to reflective and light transmitting thermally conductive element 2452 where some portion will be reflected and some portion transmitted as disclosed in FIG. 24A. It has been found with this invention that wavelength conversion performed within a recycling cavity lowers the color temperature of the LED 2458 and wavelength conversion element 2468 inside the light recycling cavity as compared to outside the recycling cavity. This is due to light recycling of the emitted light ray 2460 from LED 2458 which (on first pass) is only partially converted by wavelength conversion element 2468 and then by reflecting off 2462 light reflector 2450 and then back to the wavelength conversion element 2468 where more of the shorter wavelengths are converted to longer wavelengths. The ray 2462 undergoes further wavelength conversion as well as scattering and reemerges as ray 2464. This ray 2464 now has a higher percentage of longer wavelengths which then reflects off light reflector 2450 as reflected ray 2466 and is eventually transmitted through reflective and light transmitting thermally conductive element 2452. Typically, the color temperature is 100° K to 300° K lower for light emitted by wavelength converted LEDs inside a recycling cavity than outside.

Figure 24C:
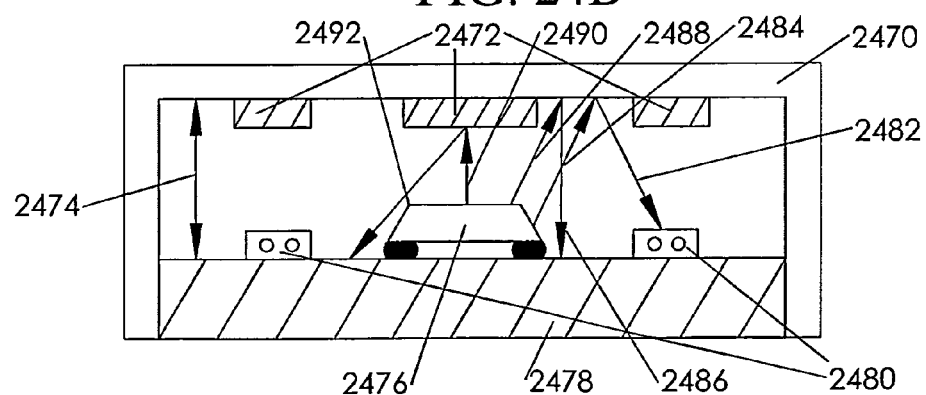
FIG. 24C depicts a side view of a light recycling cavity with distributed wavelength conversion elements.

If LED packages (e.g. LEDs mounted on small ceramic substrates with wavelength conversion elements on the light output surfaces) are used, the use of small area packages is preferred to minimize shadowing and other non-uniformities (seen when the source is off or on). The use of direct attach LED die with wavelength conversion coatings are more preferred with die sizes less than 1 mm$^2$. Alternately, if LED packages are used for LED 2458 and wavelength conversion element 2468 it is most preferred to have package areas less than 4 mm$^2$ with heights less than 1 mm and highly reflective submounts to minimize shadowing and absorption losses. This also allows for the fabrication of very thin light sources with uniform output luminance. It should be noted that in this configuration LED 2458 and wavelength conversion element 2468 (or optionally LED packages) are mounted such that the majority of their emission is emitted towards light reflector 2450. The use of LED packages (LEDs mounted on a small ceramic surface mount substrate) with color corrected wavelength conversion (phosphor) caps allow for simple assembly of the light source of this invention. The indirect lighting approach within the light recycling cavity provides for a very uniform light source without hotspots in a very thin low profile configuration. Also, the requirement for an appended heat sink is eliminated as the emitting surface and cooling surface are the same (common) surface. In general, the use of a wavelength conversion element 2468 interposed between the LED 2458 and the interior of at least one light recycling cavity such that a portion of the light within the light recycling cavity re-impinges on the wavelength conversion element 2468 is an embodiment of this invention. FIG. 24C depicts another embodiment in which the wavelength conversion elements 2472 and 2480 are distributed within or on the light reflector 2470 and/or optionally on the light transmitting thermally conductive translucent element 2478 respectively. In this embodiment LED 2476 emits emitted light ray 2490 which is partially converted and reflected off wavelength conversion element 2472 on light reflector 2470. The reflected ray 2492 impinges on reflective and light transmitting thermally conductive element 2478 as previously disclosed. The thickness 2474 of the recycling cavity is as thin as possible to make low profile light sources and also to minimize material, as previously discussed. Alternatively, emitted ray 2488 can reflect off light reflector 2470 reflected ray 2486 on light transmitting thermally conductive element 2478 without wavelength conversion. Also emitted ray 2484 may reflect off light reflector 2470 and then reflected ray 2482 impinges on wavelength conversion element 2480 of which some portion of the light ray is transmitted or reflected as previously disclosed. This arrangement of the wavelength conversion elements 2472, 2480 will keep the wavelength conversion elements cooler than if they were mounted on the LED 2476. As can be seen various combinations of the above arrangement of the wavelength conversion elements are possible.

Figure 25A:
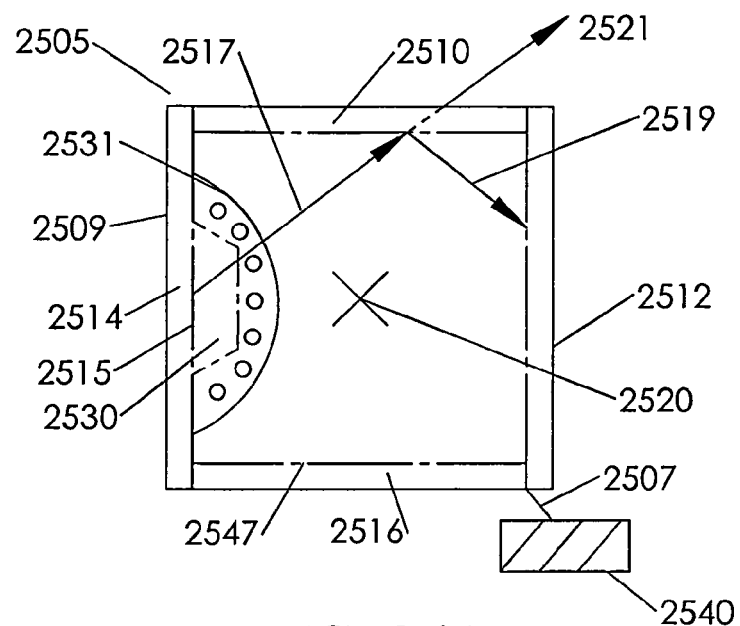
FIG. 25A depicts a cross-section view of one embodiment of this invention where multiple highly reflective, thermally conductive elements are arranged to form a light recycling cavity without a light exit aperture.
Figure 25B:
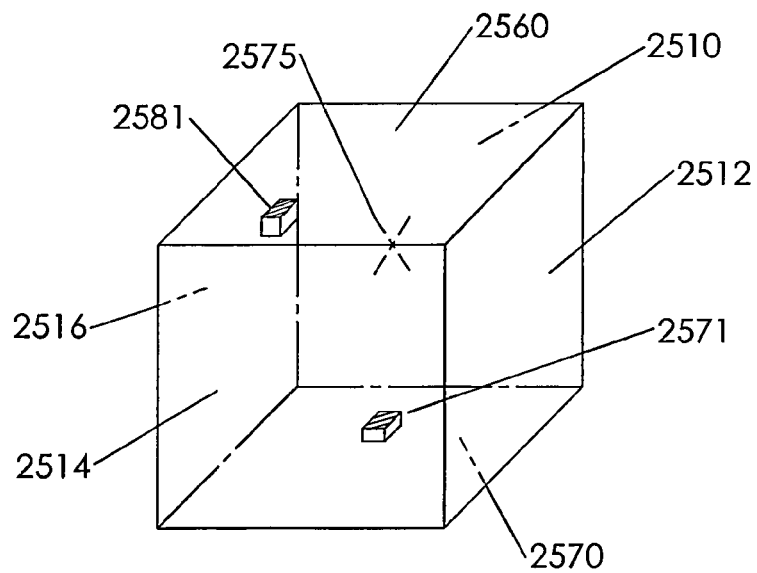
FIG. 25B shows a perspective view of the invention of FIG. 25A.

Shown in FIGS. 25A and 25B is another embodiment of the invention. Six thin reflective/transmissive thermally conductive (optionally translucent) elements form an enclosed light recycling cavity 2520 (shown in perspective as 2575 in FIG. 25B). These reflective/transmissive thermally conductive elements may optionally be more or mostly reflective (>50% reflectivity) or mostly transmissive (>50% transmissivity). Generally, the more transmissive elements will have slightly higher efficiency. However, it has been discovered that even highly reflective elements can attain high light extraction efficiency while producing more uniform and less costly light sources. Extraction occurs because photons couple to the inner surfaces of light recycling cavity 2520 (or 2575). To be accurate, the photons are either backscattered or transmitted at the surfaces or within the bulk of the elements that make up the light recycling cavity 2520. Unlike an imaging or non-imaging optical system, neither scatter nor Fresnel reflections create optical losses within a recycling optical systems because of the inherent ability of the photons to get another chance to exit the system if they are purely reflected or scattered. In imaging or non-imaging optical systems scattered or reflected rays are unable to exit the optical system. In the recycling optical systems the presence of optical absorption is the main contributor to loss in extraction efficiency. To create recycling optical systems as disclosed in this invention, the elements making up the light recycling cavity 2520 and the elements within the light recycling cavity 2520 must have low optical absorption. Extraction efficiency is therefore defined as the percentage of light emitted by at least one LED 2530 which exits anywhere from the light recycling cavity 2520 to the surrounding ambient environment. High extraction efficiency is defined as greater than 30% of the light emitted by at least one LED 2530 exiting light recycling cavity 2520. In this disclosure, light is said to pass through an element with the meaning that light exits the light recycling cavity 2520 and is emitted into the surrounding ambient environment. It may take multiple reflections or scattering events but eventually all the light emitted by at least one LED 2530 either pass through the elements making up the light recycling cavity 2520 or it is absorbed and transferred to the surrounding ambient environment as heat by the same elements through which the light is emitted or exiting. Extraction means include but are not limited to; low optical absorption materials, surface features, index matching coatings, low optical absorption materials with controlled crystal grain sizes, microoptical elements, reflective elements, and partial and through holes, on, in, or near the reflective/transmissive (optionally translucent) thermally conductive elements 2510, 2512, 2514, 2516, 2570 and 2560. While a cubical light recycling cavity 2575 is shown even a single element can be used to form the light recycling cavity based on the reflective light transmitting (optionally translucent) thermally conductive element being a hollow sphere or single pieced hollow enclosure with at least one LED 2530 mounted inside the element. FIG. 25A depicts a cross-section of the cavity 2520 showing four of the reflective/transmissive (optionally translucent) thermally conductive elements 2510, 2512, 2514, and 2516 that form the light recycling cavity 2520. These are further shown in a perspective view in FIG. 25B, which more completely shows the recycling cavity 2520 by depicting the top, and bottom reflective and light transmitting (optionally translucent) thermally conductive elements 2560 and 2570. Referring back to FIG. 25A, at least one LED 2530 is mounted to at least one surface 2515 of the cavity formed using reflective/transmissive thermally conductive elements 2510, 2512, 2514, and 2516. The at least one LED 2530 may be mounted anywhere within the light recycling cavity 2520 as further depicted in FIG. 25B with LEDs 2581 and 2571.

As in our previous example (FIG. 24) light rays 2517 emanating from the at least one LED 2530 are reflected 2519 and transmitted 2521 from the adjacent reflective/transmissive thermally conductive elements 2510. Light reflected back to the other reflective/transmissive thermally conductive elements 2512, 2514, and 2516 on which the LED(s) 2530 are mounted will transmit a fraction of the incident light and reflect a portion of it. This process repeats until most of the light is transmitted through the reflective/transmissive thermally conductive elements 2510, 2512, 2514, and 2516. Because of the multiple reflections, the exterior emitting surfaces of the light transmitting thermally conductive elements will achieve a very uniform luminance. The overall size of the light source is determined by the desired light output.

Sufficient surface area is required to dissipate the heat generated by the LEDs in the cavity. Assuming an LED is utilized having an intrinsic lumen per watt efficiency of 120 lumens per watt and the light recycling cavity efficiency is 70%, then the light source will have an overall efficiency of 84 lumens per watt. Assuming a convective heat transfer coefficient of 0.1 watt/cm$^2$, a 1000 lumen light source will require a surface area of 120 cm$^2$ or 18.6 int. This can be achieved with a relatively small cube of dimensions 1.75 inches per side. The convective heat transfer coefficient is directly proportional to the temperature difference between the hot surfaces and the ambient. Therefore, higher surface temperatures can be used to make smaller source sizes.

Radiative cooling is proportional to the difference between the fourth power of the emitting surface temperature and the fourth power of the ambient temperature. Therefore, having a higher surface temperature is very advantageous in increasing the rate of cooling of the light source. By the method of this invention, the LEDs are mounted directly to the opposite side of the emitting surface of the element(s). This results in the emitting surface having a very low thermal resistance to the LED p-n junction such that the LED temperature is kept close to the light source's emitting surface temperature. This maximizes the emitting surface temperature, which, therefore, maximizes the radiation and convection cooling of the light source.

In general, larger volumes (with their associated higher surface area) are preferred to improve not only the efficiency of the LEDs 2530 but also to improve overall reliability. Because the emitting surface and cooling surfaces are essentially the same surfaces in this embodiment, no appended heat sink is required. The ability to not only eliminate the need for additional heat sinks but also the ability to thermally isolate the heat generated by the LEDs 2530 from any drive electronics module 2540 is also an embodiment of this invention.

There have been many failures and recalls of solid state light source products associated with drive electronics and interconnect wires. These failures are mainly caused by the use of shared heat sinking by both the LEDs 2530 and drive electronics module 2540. The embodiments disclosed in this invention enable complete thermal isolation of the drive electronics and the light source. As such, an AC light bulb is disclosed consisting of a drive electronics module 2540 and a light recycling cavity 2520 light source (as described herein) where the heat generated within the drive electronics module 2540 and the heat generated within recycling cavity 2520 light source are cooled using thermally separate means. As the drive electronics module can be remotely connected via an interconnect 2507, there is minimal heat transfer between the LEDs and the drive electronics.

Whereas optically high transmitting (low reflectivity) materials (e.g. sapphire, Spinel, TPA, etc.) may be used to form the luminous light recycling cavity disclosed herein, lower cost high reflectivity materials may be used as well. Cavity as used herein (e.g. light recycling cavity) is a completely closed or nearly closed, nearly hollow, enclosure. As an example, a recycling cavity 2520 can be formed using six thin (0.5 mm) sheets of 96% alumina with a reflectivity of ~84% (e.g. in line transmission approximately 16%). In this case, the LEDs 2530 depicted in FIG. 25 are 1.6 mm×1.6 mm×0.7 mm LED packages 2530 with a color corrected wavelength conversion element 2531 on their light emitting face and have an output color temperature of 3000° K. These are mounted on the inside surfaces of the alumina elements facing into the cavity. However, once this cavity is formed due to wavelength dependent scattering inside the cavity, the color temperature is reduced by approximately 300° K to 2700° K. Shorter blue and green wavelengths are more highly scattered which increases their optical pathlength within the recycling cavity 2520.

Alternately, direct attach LED die 2530 can be used to make a white light source where wavelength conversion means is covered over the emitting surfaces of the LEDs 2530. This can be a phosphor cap, a ceramic phosphor chip or a phosphor coated on the LED 2530 with a clear adhesive coating like silicone or epoxy. Alternately the wavelength conversion materials can be dispersed and applied to other surface within the recycling cavity 2530. Using this approach, the color temperature can be varied to form a wide range of colors (e.g. simulating candle light). Whereas materials with high light transmissivity (TPA, Spinel, sapphire, etc.) may be used as the light transmissive thermally conductive element, these materials are relatively expensive. Lower cost ceramics tend to be more opaque and have low light transmission and higher reflectivity.

However, it has been found by practicing the tenets of this invention that high net light extraction efficiency may be achieved with these materials. Using these more reflective (84%) materials, light emitted from the LEDs 2530 and optionally wavelength converted, impinges on the opposite sides of the light recycling cavity 2530 and 16% would be emitted on the outside surface of that particular element. However, the light not transmitted (84%) is reflected back to the opposite and other sides of the cavity and ~13.4% (16% of the 84% reflected light) is transmitted through and emitted out the other surfaces of the recycling cavity 2520. This diminishing cycle, for each reflection, continues until a very high percentage of the original light emitted by the LED(s) 2530 passes through the white reflective (almost opaque) alumina and is emitted by the light source. Remarkably, extraction efficiencies of greater than 80% have been achieved with alumina ($Al_2O_3$) elements that have less than 17% in line transmittance. These efficiencies are measured by measuring the raw lumen output of the LED(s) 2530 themselves at a given voltage and current and then measuring the output from the light recycling cavity 2520 with the LED(s) 2530 (enclosed within the closed cavity) driven at the same voltage and current.

As described above and in general a preferred embodiment of this invention is a self cooling light source comprising at least one light-emitting diode (LED) 2530 and at least one light transmitting thermally conductive element 2514 to which the LED 2530 is mounted, the light transmitting thermally conductive element 2514 having a heat emitting surface 2509 through which most of the heat from the LED 2530 is dissipated. Ideally, the light source 2505 is structured to redirect light emitted by the LED 2530 to pass through and exit from the light transmitting thermally conductive element through its heat emitting surface 2509. The at least one light transmitting thermally conductive element 2514 also functions as a light reflector. Thereby reflecting some of the light incident upon it where the reflected light can be reflected or transmitted by other light transmitting thermally conductive elements 2510, 2512, 2516 forming the light recycling cavity. The multiple light transmitting thermally conductive elements 2510, 2512, 2414, 2516 function to redirect light emitted 2587 by said at least one light-emitting diode 2530 back to and through said multiple light transmitting thermally conductive elements 2510, 2512, 2414, 2516. Depicted in FIG. 25A is a cross-section of the cavity formed by the multiple elements 2510, 2512, 2414, and 2516. The complete light recycling cavity 2575 is shown in FIG. 25B formed by multiple elements 2510, 2512, 2414, 2516, 2560 and 2570 thereby creating a completely closed enclosure. As described above light extraction efficiencies can be achieved that exceed 50% while utilizing light transmissive thermally conductive elements having less than 50% light transmissivity when formed into a light recycling closed cavity enclosure. Therefore the light recycling cavity 2575 has a light extraction efficiency that exceeds the light transmissivity of the multiple light transmitting thermally conductive elements 2510, 2512, 2414, 2516, 2560 and 2570 forming the light recycling cavity and is an embodiment of the invention. The ability to use high reflectivity light transmitting thermally conductive elements with a reflectivity greater than 50% and more preferably greater than 80% allows the use of less costly materials to form the self cooling light source. Therefore a further embodiment of the invention is a self cooling light source consisting of multiple thermally conductive light transmitting elements 2510, 2512, 2514, 2516, 2560, and 2570 that have a reflectivity of greater than 50%, but over 50% of the light emitted by the at least one light emitting diode 2571 enclosed in the light recycling cavity 2575 is extracted through multiple light transmitting thermally conductive elements 2510, 2512, 2514, 2516, 2560, and 2570 that form the light recycling cavity 2575. Again the key attribute is minimization of the absorption losses within the recycling cavity 2520 such that very long optical pathlengths are possible without cutting the overall efficiency of the light source. While not shown, the addition of leads, pins or other interconnect means including wireless inputs is disclosed in this embodiment. Additional functionality including but not limited to antenna, IR laser communications, and sensors can also be incorporated into or on the recycling cavity light source 2520. A self cooling light source may further comprise, at least one light transmitting thermally conductive elements 2510, 2512, 2514, 2516, 2560, and 2570 and at least one light emitting diode (LED) 2530 for emitting light wherein the at least one light transmitting thermally conductive elements 2510, 2512, 2514, 2516, 2560, and 2570 acts as the primary heat dissipation means of the at least one light emitting diode 2530 and also acts as a light extraction means for at least a portion of the light emitted by the at least one light emitting diode 2530. Alternately, The self cooling light source can further comprise multiple light transmitting thermally conductive elements where the at least one light emitting diode 2530 mounted to at least one of the multiple light transmitting thermally conductive elements and where the multiple light transmitting thermally conductive elements form a light recycling cavity 2520 with a high efficiency in extracting light from the at least one light emitting diode 2530 through the multiple light transmitting thermally conductive elements.

The advantages of light recycling cavities were described in U.S. Pat. No. 6,869,206 and U.S. Pat. No. 6,960,872, (both of which are commonly assigned and incorporated by reference into this invention) where it was shown that an increase or gain in optical luminance could be achieved by having a high reflectivity cavity including high reflectivity LEDs in the cavity. In this embodiment, light recycling is used to create not only a highly efficient light source (with material typically considered opaque) but also the multiple reflections and high level of scattering creates a uniform brightness source. Again, the long optical pathlengths created in the recycling cavity 2520 leads to the higher uniformity.

In the two patents cited above, for an optical gain to be achieved the LED surface area needed to exceed the exit aperture area of the cavity. In that case, because the LEDs typically have lower reflectivity but higher surface area than the other materials making up the cavity this lowers the efficiency of the cavity. In this invention, there is no physical exit aperture. The exit aperture, in effect, is the entire outer surface of the recycling cavity light source 2520.

By design in this invention the light transmissive thermally conductive elements making up the cavity have much larger areas than the LEDs in the cavity to dissipate the heat from the LEDs. In the examples above, homogenous materials are used to form the reflective/transmissive light transmitting thermally conductive elements. Alternately, non-homogenous reflective/transmissive thermally conductive elements may be used as well.

As an example, reflective aluminum may be drilled, etched or otherwise perforated with an array of holes to form a reflective perforated metal material, which acts as a mostly reflective light transmitting thermally conductive element. Small holes, with their total area representing less than 50% of the surface area of the reflective aluminum, is preferred. Even more preferred is that the areas of the holes cover less than 20% of the surface area of the reflective aluminum (which can be flexible in the form of a foil) to form at least one of the light transmissive (with reflection) thermally conductive elements 2510, 2512, 2514, and 2516. In this embodiment the light transmitting thermally conductive element (e.g. 2510, 2512, 2514, 2516 in FIG. 25 or 2420 in FIG. 24) is a reflective perforated metal material. Optionally, additional scattering coatings or layers may be added to one or both sides of the reflective perforated (porous) metal (e.g. aluminum) element.

The LED(s) 2530 surface area will be small compared to the overall interior surface area of the recycling cavity 2520. This is desired because the outer surface of the elements making up the light recycling cavity 2520 are required to dissipate the heat generated by the LED(s) 2530 along with any Stokes' losses in the wavelength conversion elements inside the recycling cavity 2520. For ceramic translucent elements, there are no physical exit apertures. However, there is light extraction through the recycling cavity 2520 by the light being partially transmitted through the thermally conductive partially reflective translucent elements 2510, 2512, 2514, and 2516 making up the sides of the cavity.

As mentioned, the invention can be practiced alternatively with highly reflective metal sides, which have been perforated with micro holes distributed evenly or un-evenly (to pattern the light) across their surfaces or combinations of both homogenous (e.g. ceramic, alumina, etc.) and non-homogenous materials. Designs based on porous flexible metal foil as the light transmissive thermally conductive elements 2510, 2512, 2514, and 2516 allow for large area and flexible light sources to be constructed using the high thermal conductivity metal as the heat dissipating luminescent elements. Any of the sides for example 2560 and 2570 can be emitting or non-emitting surfaces with or without air holes for additional convective cooling. The only requirement is that they be highly reflective (>90%) on their inside surfaces. Porous flexible metal foils may optionally be made to allow or not to allow air flow into and out of the recycling cavity 2520.

In general, the light recycling cavity 2520 allows for light from the LED(s) 2530 to be spread out over a larger area and to have multiple opportunities to interact with any wavelength conversion elements within the light recycling cavity 2520. It should also be noted that scatter is wavelength dependent, with shorter wavelengths being more strongly scattered than longer wavelengths. As a result, LED packages containing wavelength conversion layers create light sources with significantly lower color temperatures when contained in light recycling cavities compared to the LED package as measured outside the light recycling cavity 2520. This is due not only to increased recycling of the shorter wavelengths back to the wavelength conversion layer but is also due to slightly higher emission efficiency of longer wavelengths (green, yellow, red, infrared) compared to shorter wavelengths (UV and blue) through the light transmissive thermally conductive elements. Based on these two effects, the color temperature can be reduced by several hundred degrees Kelvin using a light recycling cavity. For the non-homogenous approach, specular surfaces can be used to reduce this wavelength dependence. An embodiment of this invention, therefore, is that light recycling cavities as described herein enable lower color temperature sources while minimizing the amount of wavelength conversion material required because the recycling allows for multiple interactions between the shorter wavelength excitation (UV and blue) and the wavelength conversion layer.

In general, low optical absorption plastics are preferred (fluorinated polymers, polysiloxanes, polysilazanes, halogenated polymers, non-halogenated polymers, polycarbonates, acrylics, silicones, and inorganic/organic composites comprising low optical absorption organics). An example of a low absorption strongly scattering polymeric film is WhiteOptic™. While this film exhibits low absorption losses and white body color, it also has very low thermal conductivity. While this material can be used for parts of the recycling cavity, which are not used to cool the LED, materials with thermal conductivity higher than 1 W/mK are preferred for the thermally conductive translucent elements disclosed in this invention. A preferred embodiment of this invention is a self cooling light source where the multiple light transmitting thermally conductive elements have a white body color.

In general, all unfilled organic materials exhibit low thermal conductivity (less than 1 W/mK and typically less than 0.1 W/mK) and cannot be used effectively to spread the heat generated in the LEDs within the recycling cavity. While one could in theory operate the LEDs at such a low level and use hundreds of LEDS within the recycling cavity and use a lower thermal conductivity material, the cost would be prohibitive. In almost all solid state light sources the LEDs themselves typically represent 50% to 80% of the overall cost. The intent of this invention is to disclose materials, which enable the minimum number of LEDs while still not requiring additional heat sinking means. Based on experimental results, thermal conductivities of greater than 5 W/mK is preferred and greater than 20 W/mK is most preferred for the light transmitting thermally conductive elements. In addition, most unfilled polymer systems, which exhibit low optical absorption, have low use temperatures typically below 150° C. and even below 100° C. Therefore, strongly scattering organic materials, which can withstand greater than 200° C. are preferred and even more preferred are in organic materials, which can withstand greater than 300° C. High quality low resistance interconnects compatible with wirebonding and/or direct die attach fire at temperatures over 400° C. Also direct die attach LEDs typically solder at greater than 300° C. While lower temperature interconnects and conductive adhesive may be used, there are significant trade-offs in performance both electrically and optically. Finally, most unfilled organic materials also are flammable. As such inorganic materials like alumina or porous metal foils are preferred. However, organic/inorganic composites are possible.

As an example of thermally conductive inorganic/organic composite with a thermal conductivity over 5 W/mK capable of withstanding greater than 300° C., is boron nitride filled polysilazane that may be used to form either a thermally conductive layer on the porous flexible metal foils or inorganic thermally conductive light transmitting elements or be used as a freestanding element forming at least one surface of the light recycling cavity. Other polymeric binders are also possible, however, the high temperature performance, optical transparency and compatibility of the polysilazanes with boron nitride make this inorganic/organic composite a preferred materials choice. Filled thermoplastic composites are especially preferred.

Figure 26A:
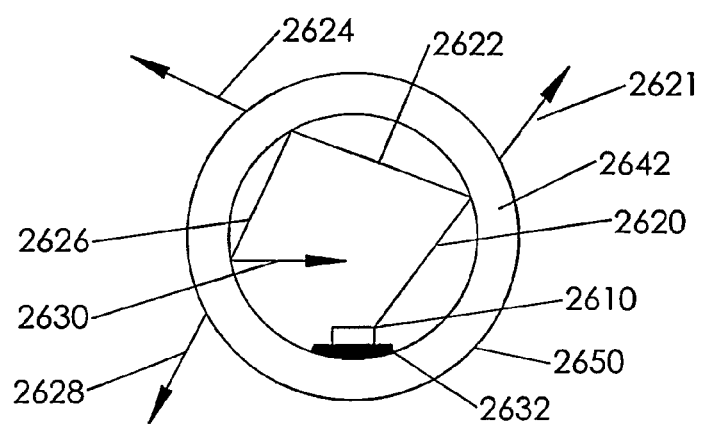
FIG. 26A depicts a side view of another embodiment of this invention where the highly reflective thermally conductive element is in the form of a tube with LEDs mounted on the inside of the tube and thermally in contact with the tube.
Figure 26B:
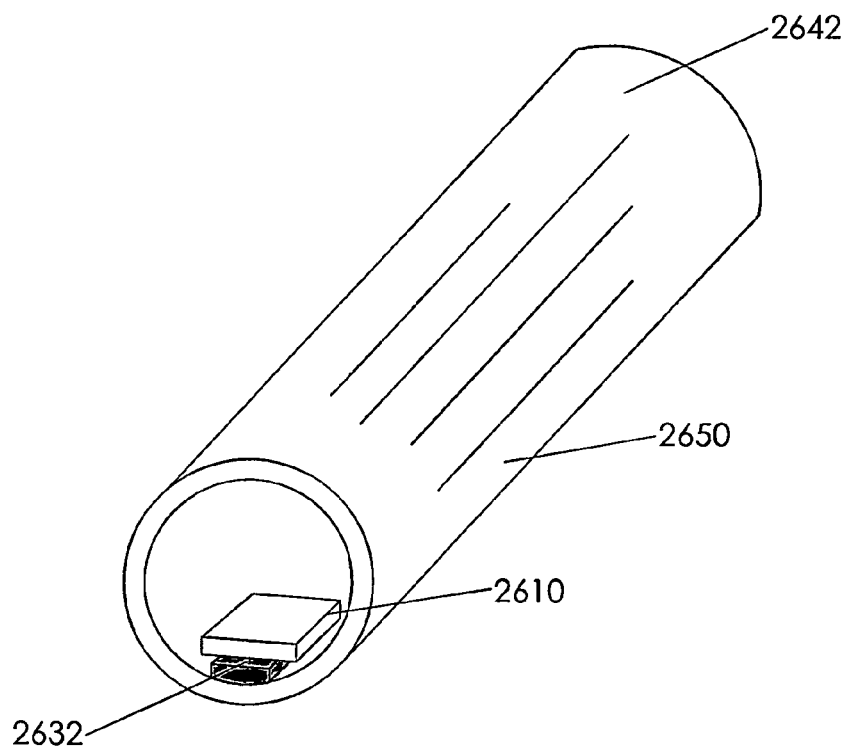
FIG. 26B shows a perspective view of the present invention of FIG. 26A.

FIG. 26A depicts another embodiment of the invention shown in perspective in FIG. 26B. At least one LED 2610 is mounted to an electrically conductive interconnect 2632 printed on the inside wall of the reflective/transmissive thermally conductive tube 2642. The interconnect 2632 may be printed using a specially designed screen printer or pad printer to allow insertion and printing on the inside of wall of the tube. Optionally, the interconnect 2632 also may be printed using a specially constructed inkjet printer having a long reach head or nozzle to fit inside the tube 2642. Once printed the conductive ink is deposited and then cured or fired in a furnace. The interconnect 2632 can be gold, silver, copper or any other suitable electrical conductor including transparent conductors like indium tin oxide (ITO) or zinc oxide. For white light sources materials such as silver with high reflectivity throughout the visible range is preferred. For red or infrared sources gold is preferred. At least one LED 2610 or surface mount LED package is then soldered onto the pads that are part of the interconnect 2632 on the inside wall of the tube 2642. This operation can also be performed by a suitably designed pick and place mechanism that locates the pads via optical recognition and places the LED 2610 on the pads. The LED or LED package 2610 light emitting surface is mounted to face inward into the cavity.

As stated above, mounting the LEDs this way creates indirect lighting, which enhances uniformity. A sample light ray 2620 of light emitted by the LED 2610 is shown impinging on the inside surface of the mostly reflective semi-translucent thermally conductive tube 2642. A portion of this light is transmitted 2621 however most of the light is reflected 2622 and impinges again on the inside of the tube 2642 with again a small fraction transmitted 2624 and a major fraction reflected 2626. This reflected portion shown as light ray 2626 impinges again on the inside of the tube 2642 and a small portion is transmitted 2628 and a major portion reflected 2630. This continues in this way with the light reflected and scattered around the light recycling cavity formed by the tube 2642 until all of the light is either absorbed or transmitted through the walls of the mostly reflective (optionally translucent) light transmitting thermally conductive tube 2642. This makes for a very uniform emitting surface 2650 on the outside of the tube 2642. Typically to get sufficient mixing requires putting many LEDs or LED packages 2610 inside a tube 2642 and distributing them so that you get a uniform emission pattern. However with the LEDs facing inward and the reflective and light transmitting thermally conductive tube 2642 there is enough reflection, bounces and scattering of the light before its transmitted that a very uniform luminance is achieved on the entire outside surface 2650 of the tube 2642. The tube can be made from the materials previously disclosed (e.g. metal, alumina, TPA, etc.).

The FIG. 27A through FIG. 27G show different embodiments of the invention where the mostly reflective and light transmitting thermally conductive elements are simultaneously both light emitting surfaces and heat dissipation surfaces of the light source. In all of the examples, the LEDs or LED packages 2710 are mounted on the inside walls of the mostly reflective translucent thermally conductive elements 2720, which in each case form closed or mostly closed cavities, enclosures, or envelopes. The interconnects 2730 to the LEDs 2710 and interconnect 2730 printed on the inside walls of the reflective/transmissive thermally conductive elements 2720, 2734, 2736, and 2738 are connected by an electrically conductive through hole or via or pins 2740 that pass through the walls of the envelope formed by the reflective and light transmitting (and optionally translucent) thermally conductive elements 2736. Optionally, one of the sides (thermally conductive reflective/transmissive elements) can overlap another side, which will expose the interconnect printed on the inside surface of the side to the outside of the cavity. This would eliminate the need for a through hole or via in the side.

Figure 27A:
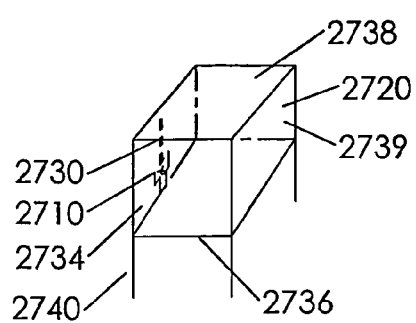
FIG. 27A, B, C, D, E, F, and G show different embodiments of the invention where the highly reflective thermally conductive elements are both the light emitting surface and the heat dissipation surface of the light source.
Figure 27B:
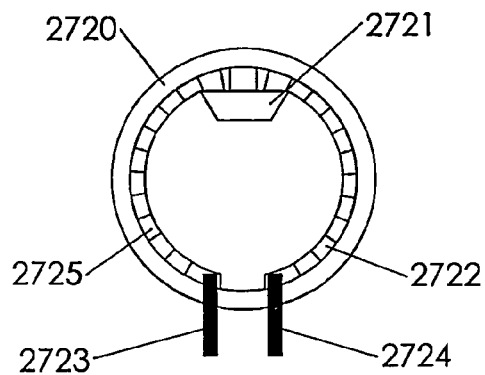
Figure 27C:
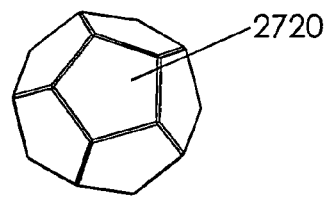
Figure 27D:
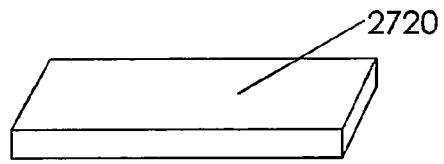
Figure 27E:
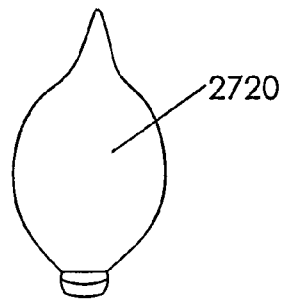
Figure 27F:
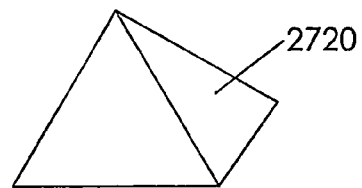
Figure 27G:
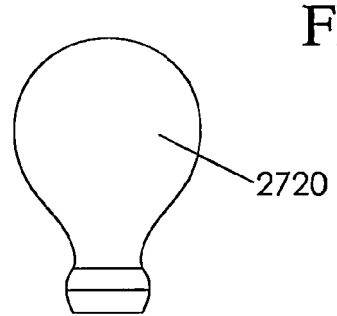

In FIG. 27A a cubicle or rectangular structure is shown. In FIG. 27B, a sphere is shown. In this example, at least one LED 2721 is soldered to interconnect 2722 and 2725 also within the spherical light recycling cavity. External pins 2724 and 2723 connect to interconnect 2722 and 2725 respectively. In this manner a single light transmitting thermally conductive element can be used to form a light recycling cavity. In the embodiments of this invention the light transmitting thermally conductive elements not only function as a light emitter but also as a cooling element for at least one LED 2721 mounted on them. In FIG. 27C, a sphere can be approximated via a dodecahedron structure. Large and small flat light panels can also be constructed as shown in FIG. 27D using the principles of this invention. Also various artistic shapes can be made for example in FIG. 27F a flame shape is formed to simulate the look of a candle flame. FIG. 27G shows where the invention can be utilized to form a pyramidal shaped light source. In FIG. 27H, a bulb mimicking an Edison incandescent can also be made using the teachings of this invention. In general, a preferred embodiment for this invention is a self cooling light source comprising, at least one light transmitting thermally conductive element that functions as part of a light recycling cavity 2720, and at least one light emitting diode 2721 for emitting light where the at least one light emitting diode 2721 is enclosed within the light recycling cavity 2720 where the at least one light transmitting thermally conductive element also functions both as a light emitter and as a cooling element for said at least one light emitting diode 2721.

In all the configurations shown either homogenous or non-homogeneous materials can be used for the light transmissive thermally conductive elements 2720. A wide range of body colors and/or patterns can be created on the outer surfaces of the partially reflective partially transmissive thermally conductive elements 2720 for functional and/or aesthetic reasons. As described there are many ways to form a luminous self cooling light recycling cavity. A most elemental one can be formed comprising a single thermally conductive light transmitting element that is in the form of a closed cavity or envelope with a least one LED mounted and in thermal contact to the inside surface of the envelope. The LED may be powered by an external power source that is connected to the LED through a small wire or via penetrating the envelope or cavity.

Figure 28:
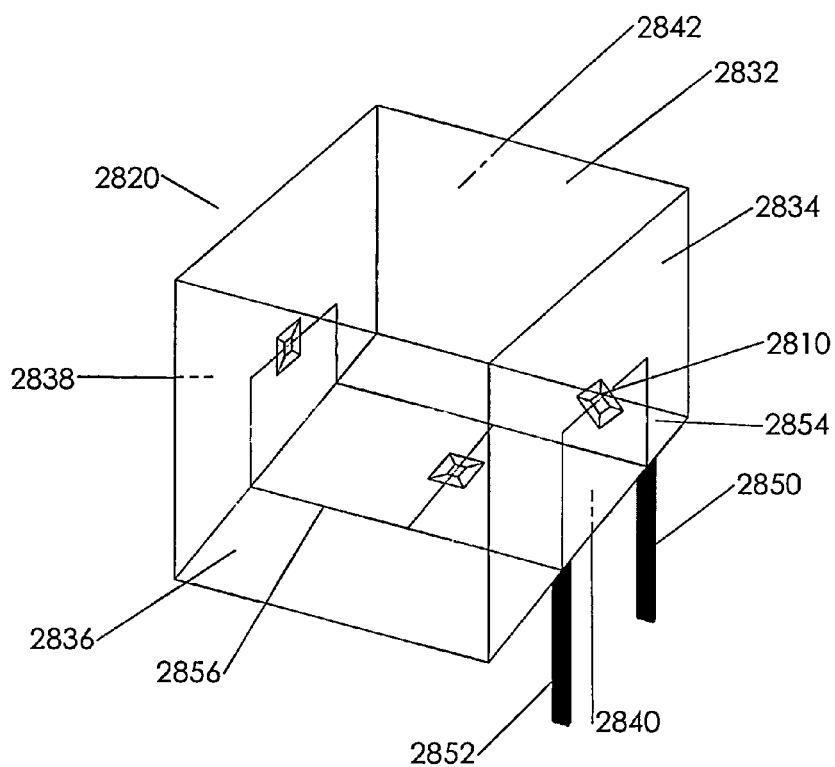
FIG. 28 shows a perspective view of another embodiment of the invention where multicolored LEDs are utilized to form light sources that can be tuned to any color.

FIG. 28 depicts yet another embodiment of the invention where multicolored LEDs 2810 are utilized inside the light recycling cavity envelope 2820 formed by the simultaneously light reflective and transmissive thermally conductive elements 2832, 2834, 2836, 2838, 2840, and 2842. By using multicolored LEDs 2810 and the teachings of this invention, a light source may be produced that can be tuned to any color within the natural light spectrum. Because of the many reflections, the light incurs prior to exiting of the envelope (cavity) sufficient wavelength mixing of the different colors is achieved so that a uniform color and brightness is seen on all of the outside emitting surfaces of the light recycling cavity/envelope 2820.

Interconnect circuits 2854 and 2856 are also within the light recycling cavity envelope 2820 and may connect multicolored LEDs 2810 either separately or jointly to external contacts 2850 and 2852. As shown, most preferred interconnects are thin traces due to the cost of the metal materials used. Most preferred are low surface roughness silver thick film pastes with an RMS roughness less than 5 microns. An example is Hereaus silver thick film paste CL80-9364 which enables the use of direct attach LED die 2810 such as DA-500 die produced by Cree. Direct attached die and/or soldered LED packages 2810 are preferred embodiments due to the elimination of wirebonding costs. In general, high reflectivity and high conductivity materials are preferred for interconnect circuits 2854 and 2856. Typical trace widths are 100 microns with thickness typically 5 microns or thicker depending on current and distance required. External contacts 2850 and 2852 may attach to interconnect circuits 2854 and 2856 using conductive epoxy, soldering, ultrasonic bonding, tab bonding, mechanical means, and other connection means known in the art. The use of flex circuits for external contacts 2850 and 2852 are disclosed however other means including but not limited to pins, clips, pads, strips, and other mechanical contact means are disclosed.

A preferred embodiment is continuation of interconnect circuits 2854 and 2856 outside inner surfaces of the light recycling cavity envelope 2820 such that external contacts 2850 and 2852 are simply metalized pads on the outside surface of light recycling cavity envelope 2820. These approaches and properties of the interconnect circuits 2854 and 2856 are common to and can be utilized by the other embodiments in this disclosure. The use of adhesives, clips, solders, mechanical means, and fusion processes to physically hold simultaneously light reflective and transmissive thermally conductive elements 2832, 2834, 2836, 2838, 2840, and 2842 together is also disclosed. A preferred embodiment is that the interconnect circuits 2854 and 2856 also provide soldering joints for the assembly. Once formed this embodiment can create a wide range of colors when lit, while still maintaining a substantially white body color. As previously disclosed, additional semiconductor devices and elements may be incorporated within and/or on the light recycling cavity envelope 2820 besides just LEDs.

In addition interconnect circuits 2854 and 2856 may be used to form antennas for RFID and other communication and sensor applications. Interconnect circuits 2854 and 2856 may also be used to create inductive or capacitive couplers to external modulated energy source eliminating the need for external contacts 2850 and 2852. Additional functions which can be incorporated into these self cooling light sources are but not limited to RFID sensing, smoke detection, ambient temperature detection, RF emitters, strobe sources, optical data links, motion sensors, and wireless communications.

As lighting is required in virtually all occupied spaces it is only natural that sensor, communication, and security functions be integrated into the light sources. The simultaneously light reflective and transmissive thermally conductive elements 2832, 2834, 2836, 2838, 2840, and 2842 especially if constructed of low cost alumina provides an ideal substrate for integrating these extra functions into the light source. The strongly scattering white body color of these light sources allow for the concealment of security functions such as cameras and sensors. As an example, a store owner could buy a light source based on this invention, which queried RFID tags at the exit from the story while an externally identical light source could be detecting motion elsewhere in the store. In this manner, lighting and security become the same element reducing cost, concealing the security, and improving the aesthetics. Interconnect circuits 2854 and 2856 and external contacts 2850 and 2852 may be single circuits as shown or multiple circuits. The extra functions may be powered separately and in tandem with the LEDs 2810.

Figure 29:
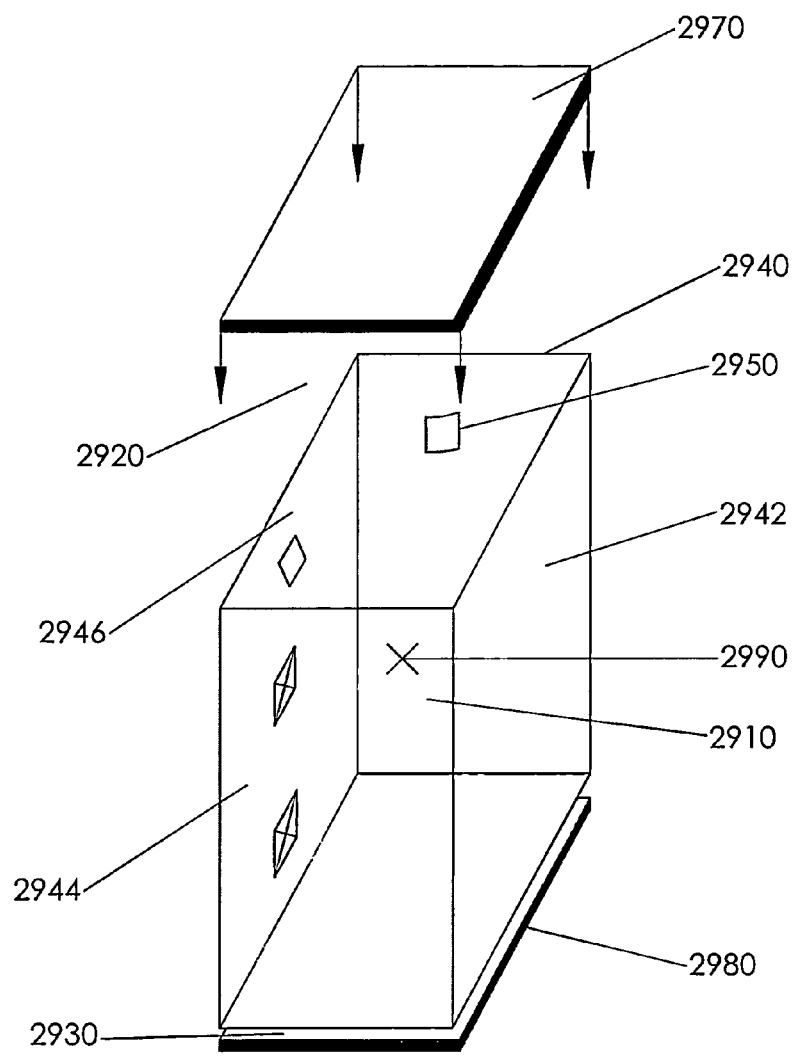
FIG. 29 shows a perspective view of another embodiment of the invention where the light source has open tops and bottoms to allow air to flow on both side of the highly reflective thermally conductive material.

In the prior examples and embodiments, a mostly closed light recycling cavity or envelope was formed. FIG. 29 shows another embodiment of the invention where the self cooling light source 2910 has open top 2920 and bottom 2930. This allows air to flow on both sides of the multiple light transmitting thermally conductive elements 2940, 2942, 2944, and 2946 thereby producing more cooling to the LEDs 2950. Using this approach a self cooling light source consisting of multiple light transmitting thermally conductive elements 2940, 2942, 2944, 2946, 2920, and 2930 that form the light recycling cavity 2910 are arranged to allow air to flow through said light recycling cavity 2910 but also to prevent light from escaping without passing through said multiple light transmitting thermally conductive elements 2940, 2942, 2944, 2946, 2920, 2930.

FIG. 29 shows top end cap 2970 and bottom end cap 2980 which are staggered such that light is substantially reflected back into the recycling cavity 2990 while still allowing air to flow from bottom to top (on the inside of the cavity or envelope) creating a chimney cooling effect. The objective is to allow air to flow through the cavity but prevent light emitted by the LEDs inside the cavity from escaping without passing through the light transmissive thermally conductive elements. Alternately, top end cap 2970 and/or bottom end cap 2980 may be porous in nature to allow for air flow. However, in most cases a mostly closed envelope is preferred which provides more structural rigidity and is easier to fabricate. This can simplify production of the light sources. The light recycling cavities or envelopes formed by the reflective and transmissive thermally conductive elements can be optionally hermetically sealed or a small opening can be provided to allow air pressure to equalize on the inside of the cavity or envelope with the ambient air pressure.

This invention creates solid state light sources where the light emitting surface of the solid-state light source also is used to cool the source. Such a self cooling source preferably will have an emitting surface that is close in temperature to the LED junctions to maximize both convective and radiative cooling. The emitting surface is constructed of a material that exhibits sufficient thermal conductivity to allow for the heat from small but localized LED die or LED mounted on small thermally conductive substrates to be spread out over a sufficiently large enough area to effectively cool the LEDs. In this invention this is accomplished by spreading the heat generated over a larger volume, using a relatively high thermal conductivity light transmitting and optionally reflective and optionally diffusing element, that spreads the heat generated in the semiconductor devices (e.g. LEDs) via conduction over a larger surface area than the semiconductor devices. The radiative and convective cooling is maximized by selecting materials with high emissivity or with high emissivity coatings, and utilizing large surface areas, and higher surface temperatures created by efficient coupling of the heat generating components (e.g. LEDs) to the outside surfaces of the self cooling light source. Also an embodiment of this invention is self cooling light sources that are formed into light recycling cavities where the only light escaping or extracted from the closed cavity passes through the walls of the cavity and is emitted by the outer heat dissipating surfaces of the luminous cavity. The walls or sides of the cavity may be fabricated by any element or material that exhibits reflection and transmission of light and exhibits high thermal conductivity. These include both high and low optically transmissive ceramics. Also taught in this invention is that materials that have relatively high optical reflectivity (and therefore, low optical transmissivity) may be used, which permits the use of lower cost ceramics and even metals perforated with multiple small apertures.

For example, it has been shown that even using alumina with a reflectivity of >80% (and in line light transmissivity of <20%) as the material for the light transmissive thermally conductive elements very high extraction efficiencies can be attained from closed light recycling cavities made with these materials. It has been shown that over 70%, and in some cases over 80%, of the light emitted by LEDs inside the completely closed light recycling cavities can be extracted through and emitted by these thermally conductive materials. A further benefit of using these highly reflective ceramic materials is that they have white body color. Therefore, when the light source is in the off state they have a very aesthetically pleasing appearance. This is in contrast to many commercially available solid state light bulbs that look yellow when they are not lit.

A key attribute of this invention is the formation of efficient recycling cavities similar to those disclosed in U.S. Pat. No. 7,040,774 (commonly assigned and incorporated by reference into this invention). In light recycling optical cavities, multiple bounces or reflections are purposefully caused to occur. If the cavity is formed using materials with low enough optical absorption losses, the efficiency can be very high. This invention discloses the formation of light recycling optical cavities in which at least a portion of the light recycling cavity is constructed of partially transmitting (optionally translucent) thermally conductive elements. This is based on the recognition that even materials typically considered opaque can be used to form efficient emitters if optical absorption is minimized. The importance of this discovery is that low cost materials such as white body color alumina (e.g. 96% $Al_2O_3$) can now function as translucent thermally conductive emitters with or without wavelength conversion. The ability to form white body color or even off-white body color light sources is important from both an aesthetic and marketing standpoint. Consumers prefer white body color or off-white body color light sources for many applications due to their familiarity with incandescent and fluorescent lamps. As such, thermally conductive luminescent elements with white or off-white body colors when they are not emitting light are preferred. This can be further extended to include a wide range of body colors and patterns when non-homogenous thermally conductive luminescent elements are used such as reflectors with arrays of holes. The use of texture and other outer surface treatments to create various aesthetic looks is also an embodiment of this invention. In particular, the formation of thermally conductive luminescent elements, which match or contrast or blend aesthetically with their surroundings (e.g. lamp shades, ceiling tiles, etc.) are embodiments of this invention. In general, the ability to create a wide range of body colors for the thermally conductive luminescent element is a preferred embodiment of this invention.

While the invention has been described in conjunction with specific embodiments and examples, it is evident to those skilled in the art that many alternatives, modifications and variations will be evident in light of the foregoing descriptions. Accordingly, the invention is intended to embrace all such alternatives, modifications and variations that fall within the spirit and scope of the appended claims.

The invention claimed is:

1. A self cooling light source comprising:
   at least one light-emitting diode (LED) for emitting light; and
   at least one light transmitting thermally conductive element, said at least one light-emitting diode being mounted on said at least one light transmitting thermally conductive element, said at least one light transmitting thermally conductive element having a heat emitting surface through which most of the heat from said at least one light-emitting diode is dissipated;
   wherein said self cooling light source is structured to redirect light emitted by said at least one light-emitting diode to pass through and exit from said at least one light transmitting thermally conductive element through said heat emitting surface.

2. The self cooling light source of claim 1 wherein said at least one light transmitting thermally conductive element also functions as a light reflector.

3. The self cooling light source of claim 1 wherein said at least one light transmitting thermally conductive element is translucent.

4. The self cooling light source of claim 1 wherein said at least one light transmitting thermally conductive element is a reflective perforated metal material.

5. The self cooling light source of claim 1 further comprising:
   a reflective enclosure to redirect most of the light emitted by said at least one light-emitting diode back to and through said light transmitting thermally conductive element.

6. The self cooling light source of claim 1 further comprising:
   multiple light transmitting thermally conductive elements that function to redirect light emitted by said at least one light-emitting diode back to and through said multiple light transmitting thermally conductive elements.

7. The self cooling light source of claim 1 further comprising
   at least one wavelength conversion element interposed between said light emitting surface of said at least one light-emitting diode and said light transmitting thermally conductive element.

8. The self cooling light source of claim 1 where said at least one light-emitting diode mounted on at least part of said light transmitting thermally conductive element is combined with a light reflector that recycles the light emitted by said at least one light-emitting diode back to and through said light transmitting thermally conductive element.

9. The self cooling light source of claim 8 where said light reflector is a metal reflector.

10. The self cooling light source of claim 8 where said light reflector is a plastic reflector.

11. The self cooling light source of claim 8 where said light reflector is partially light reflective and partially light transmitting.

12. A self cooling light source comprising:
    at least one light transmitting thermally conductive element; and
    at least one light emitting diode (LED) for emitting light;
    wherein said at least one light transmitting thermally conductive element acts as the primary heat dissipation means of said at least one light emitting diode and also acts as a light extraction means for at least a portion of the light emitted by said at least one light emitting diode.

13. The self cooling light source of claim 12 further comprising:
    multiple light transmitting thermally conductive elements; and said at least one light emitting diode mounted to at least one of said multiple light transmitting thermally conductive elements; and
    wherein said multiple light transmitting thermally conductive elements form a light recycling cavity with a high efficiency in extracting light from said at least one light emitting diode through said multiple light transmitting thermally conductive elements.

14. The self cooling light source of claim 13 wherein said light recycling cavity has a light extraction efficiency that exceeds the light transmissivity of said multiple light transmitting thermally conductive elements forming said light recycling cavity.

15. The self cooling light source of claim 13 where said multiple thermally conductive light transmitting elements have a reflectivity of greater than 50%, but over 50% of the light emitted by said at least one light emitting diode enclosed in said light recycling cavity is extracted through said multiple light transmitting thermally conductive elements that form said light recycling cavity.

16. The self cooling light source of claim 13 wherein said multiple light transmitting thermally conductive elements that form said light recycling cavity are arranged to allow air to flow through said light recycling cavity but also to prevent light from escaping without passing through said multiple light transmitting thermally conductive elements.

17. The self cooling light source of claim 12 where said multiple light transmitting thermally conductive elements have a white body color.

18. A self cooling light source comprising:
at least one light transmitting thermally conductive element that functions as part of a light recycling cavity; and
at least one light emitting diode for emitting light, said at least one light emitting diode enclosed within said light recycling cavity;
wherein said at least one light transmitting thermally conductive element also functions both as a light emitter and as a cooling element for said at least one light emitting diode.

19. The self cooling light source of claim 18 further comprising:
at least one light reflector that forms part of said light recycling cavity and redirects light from said at least one light emitting diode to said at least one light transmitting thermally conductive element.

20. The self cooling light source of claim 18 wherein said at least one light transmitting thermally conductive element comprises at least one of the following materials; reflective perforated metals, layered composites with arrays of holes, alumina ($Al_2O_3$), TPA, BeO, AlN, BN, and other thermally conductive ceramics, amorphous, composites, polycrystalline, oriented polycrystalline, or single crystalline materials which exhibit low absorption losses to emission wavelengths being used.

* * * * *